(12) United States Patent
Liu et al.

(10) Patent No.: US 8,735,862 B2
(45) Date of Patent: May 27, 2014

(54) MEMORY CELLS, METHODS OF FORMING MEMORY CELLS AND METHODS OF FORMING MEMORY ARRAYS

(75) Inventors: Jun Liu, Boise, ID (US); John K. Zahurak, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 223 days.

(21) Appl. No.: 13/084,011

(22) Filed: Apr. 11, 2011

(65) Prior Publication Data
US 2012/0256151 A1  Oct. 11, 2012

(51) Int. Cl.
*H01L 47/00* (2006.01)

(52) U.S. Cl.
USPC .................. 257/4; 257/E45.001; 438/900

(58) Field of Classification Search
USPC ............................... 257/2, E45.001, 4
See application file for complete search history.

(56) References Cited

U.S. PATENT DOCUMENTS

| | | | |
|---|---|---|---|
| 3,271,591 A * | 9/1966 | Ovshinsky | 327/500 |
| 7,463,512 B2 | 12/2008 | Lung | |
| 7,473,921 B2 * | 1/2009 | Lam et al. | 257/4 |
| 7,642,125 B2 | 1/2010 | Lung et al. | |
| 7,705,343 B2 | 4/2010 | Suh et al. | |
| 7,804,084 B2 | 9/2010 | Park et al. | |
| 7,871,906 B2 | 1/2011 | Lee et al. | |
| 7,972,896 B2 * | 7/2011 | Kim | 438/103 |
| 2005/0029503 A1 * | 2/2005 | Johnson | 257/4 |
| 2005/0167645 A1 * | 8/2005 | Kim et al. | 257/2 |
| 2008/0121859 A1 * | 5/2008 | Campbell | 257/2 |
| 2008/0265237 A1 * | 10/2008 | Goux et al. | 257/3 |
| 2009/0020746 A1 | 1/2009 | Lai et al. | |
| 2009/0147564 A1 | 6/2009 | Lung | |

FOREIGN PATENT DOCUMENTS

| | | |
|---|---|---|
| KR | 10-2006-0079455 | 7/2006 |
| KR | 10-2010-0048198 | 5/2010 |
| WO | PCT/US2012/027818 | 9/2012 |

* cited by examiner

*Primary Examiner* — Wael Fahmy
*Assistant Examiner* — Sarah Salerno
(74) *Attorney, Agent, or Firm* — Wells St. John P.S.

(57) ABSTRACT

Some embodiments include memory cells which have multiple programmable material structures between a pair of electrodes. One of the programmable material structures has a first edge, and another of the programmable material structures has a second edge that contacts the first edge. Some embodiments include methods of forming an array of memory cells. First programmable material segments are formed over bottom electrodes. The first programmable material segments extend along a first axis. Lines of second programmable material are formed over the first programmable material segments, and are formed to extend along a second axis that intersects the first axis. The second programmable material lines have lower surfaces that contact upper surfaces of the first programmable material segments. Top electrode lines are formed over the second programmable material lines.

11 Claims, 87 Drawing Sheets

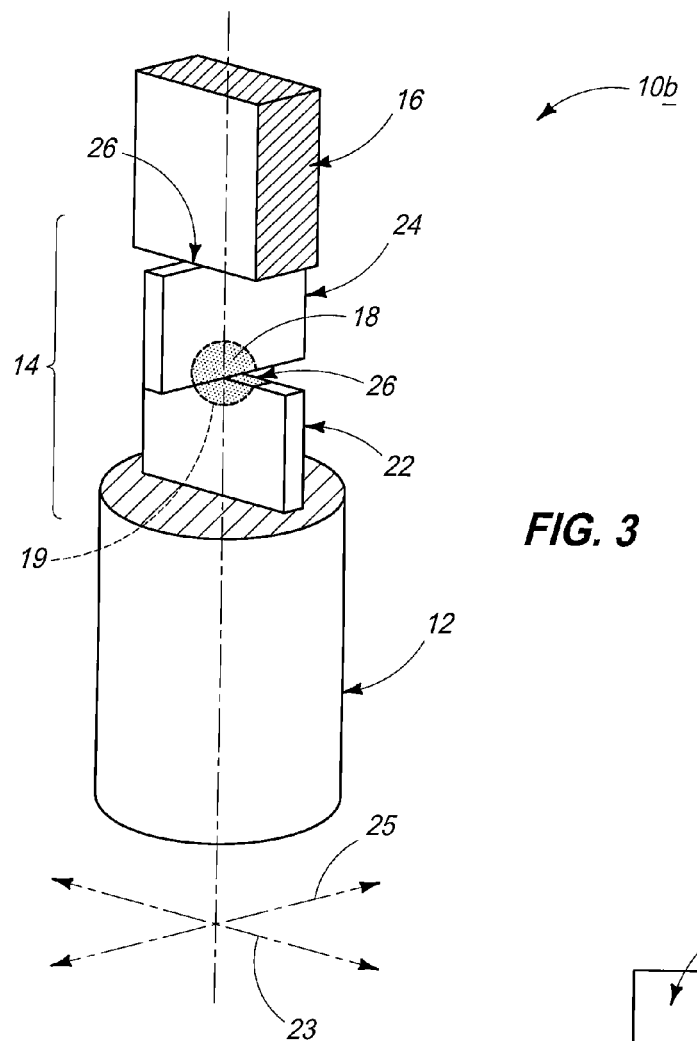
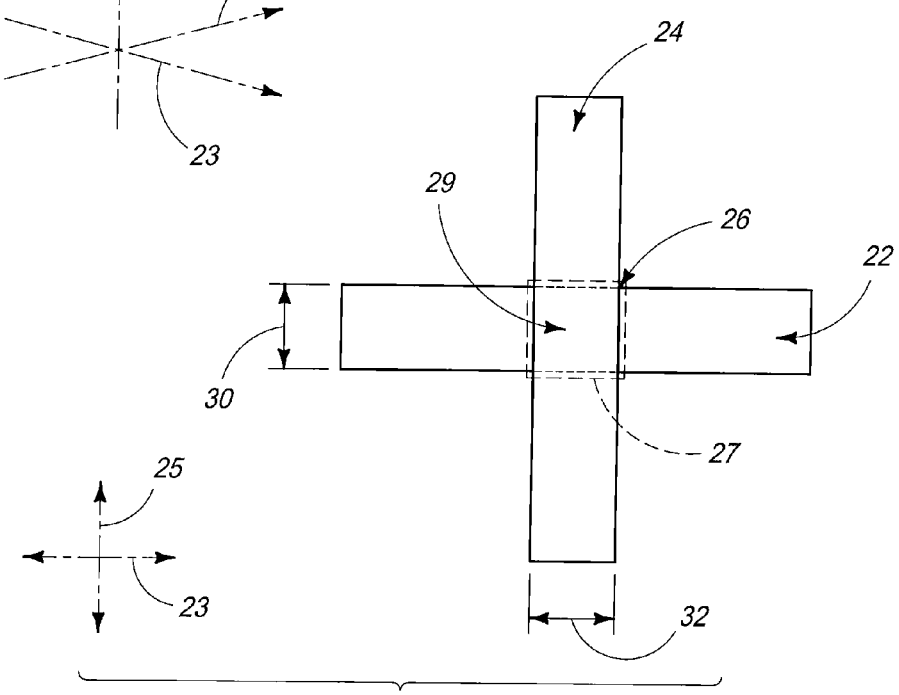

MEMORY CELLS, METHODS OF FORMING MEMORY CELLS AND METHODS OF FORMING MEMORY ARRAYS

TECHNICAL FIELD

Memory cells, methods of forming memory cells and methods of forming memory arrays.

BACKGROUND

Memory is one type of integrated circuitry, and is used in computer systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

One type of memory is phase change random access memory (PCRAM). Such memory utilizes phase change material as a programmable material. Example phase change materials that may be utilized in PCRAM are ovonic materials, such as various chalcogenides.

The phase change materials reversibly transform from one phase to another through application of appropriate electrical stimulus. Each phase may be utilized as a memory state, and thus an individual PCRAM cell may have two selectable memory states that correspond to two inducible phases of the phase change material.

A PCRAM cell may comprise a volume of phase change material between a pair of electrodes. A portion of the volume will change phase during operation of the cell, and such portion may be referred to as a switching volume. The switching volume is often a small fraction of the overall volume of the phase change material, and thus the majority of the phase change material within a memory cell may remain in a static phase during operation of the cell.

FIG. 1 shows a prior art memory cell 10 comprising a phase change material 14 between a pair of electrodes 12 and 16. The phase change material has a switching volume 18 therein, and such switching volume is directly over and against the bottom electrode 12. An outer boundary of the switching volume is diagrammatically illustrated with a dashed line 19.

In operation, the bottom electrode may function as a heater to elevate a temperature within the switching volume which, in combination with self-heating within the phase change material, may induce a phase change. A region 21 corresponds to a part of the switching volume that is directly against the bottom electrode. Such region may be the highest temperature region of the switching volume material during operation of the memory cell in ideal prior art situations in which heat is not lost through the bottom electrode.

A problem with the configuration of FIG. 1 is that there are may be heat loss from the switching volume through the bottom electrode. Such heat loss reduces operational efficiency of the memory cell. Another problem is that the highest temperature region of the switching volume may be shifted away from the bottom electrode due to heat loss through the electrode, which can lead to higher temperature requirements and programming current requirements. Some prior art constructions may have a highest temperature region of the phase change material which is much hotter than a melting point of the phase change material, which may be detrimental to the memory cell over time and/or may lead to excessive power consumption. Also, the prior art memory configuration of FIG. 1 may require a large switching volume cross-sectional area to fully cover an electrode surface, which may lead to high programming current requirements. It would be desirable to develop new memory cells that alleviate or prevent the problems associated the prior art memory cell of FIG. 1.

BRIEF DESCRIPTION OF THE DRAWINGS

FIG. 3 is a diagrammatic, three-dimensional view of an example embodiment PCRAM cell.

FIG. 4 is a diagrammatic view of a region of overlap between programmable material plates of the FIG. 3 PCRAM cell.

DETAILED DESCRIPTION OF THE ILLUSTRATED EMBODIMENTS

Some embodiments include PCRAM cells in which a switching volume occurs within a region of phase change material between a pair of electrodes, but is not directly against either of the electrodes. Such memory cells may be referred to as "confined" cells, to indicate that the switching volume is confined in a region of a programmable material which is not in direct contact with either of the electrodes of a PCRAM cell.

Figure 1:
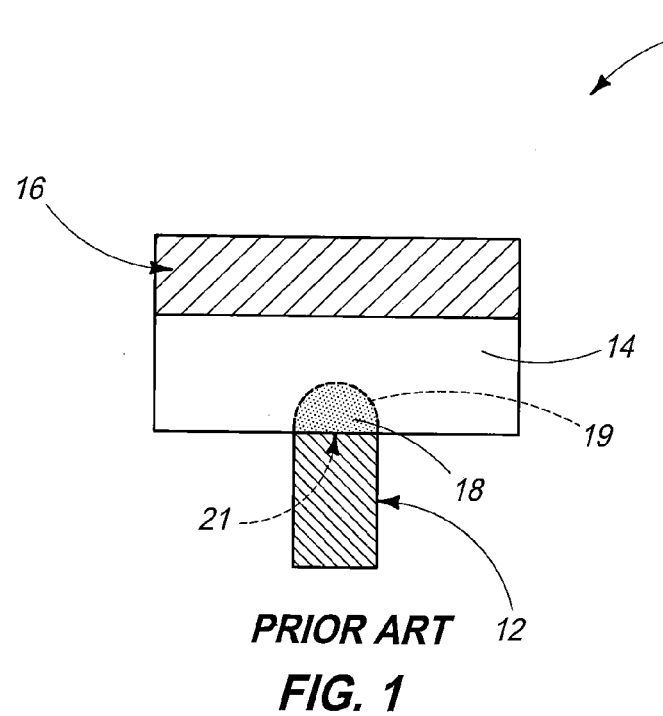
FIG. 1 is a diagrammatic, cross-sectional view of a prior art PCRAM cell.
Figure 2:
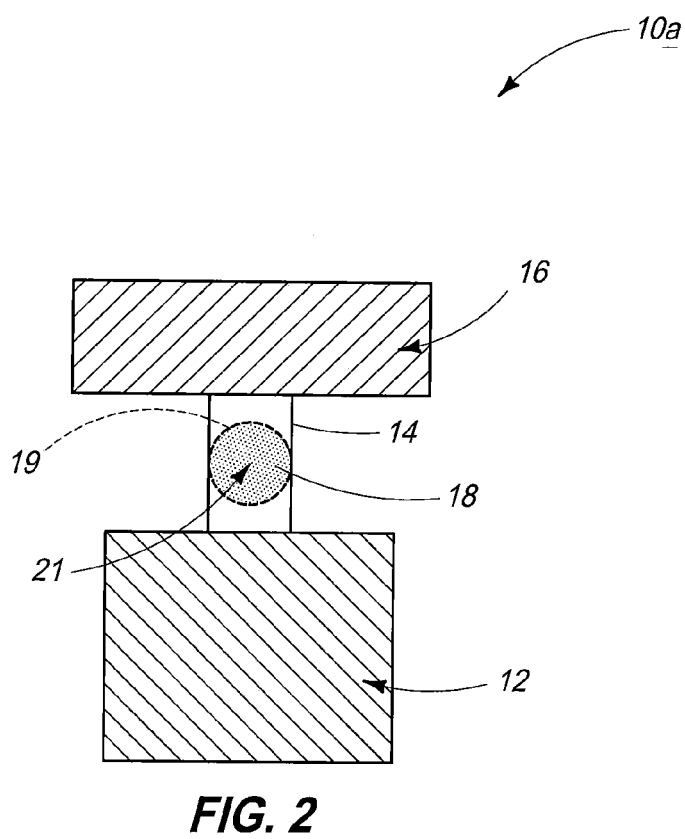
FIG. 2 is a diagrammatic, cross-sectional view of an example PCRAM cell having a switching volume centrally located within programmable material of the cell.

FIG. 2 shows an example embodiment "confined" PCRAM cell 10a. The memory cell 10a of FIG. 2, like the above-discussed memory cell 10 of FIG. 1, has phase change material 14 provided between a pair of electrodes 12 and 16. However, in contrast to the memory cell of FIG. 1, the memory cell of FIG. 2 is configured to have the switching volume 18 centrally located within the phase change material, rather than being directly against either of the electrodes. The configuration of FIG. 2 may avoid the problematic prior art problem of heat dissipation from the switching region into an adjacent electrode (such problem was discussed above with reference to the prior art memory cell of FIG. 1). Also, the configuration of FIG. 2 may advantageously have the highest temperature region 21 of the phase change material be centrally located within the switching volume during operation of the memory cell, and be only slightly hotter than a melting point of the phase change material, rather than having the prior art problems discussed above with reference to the prior art memory cell of FIG. 1.

The switching volume may be confined to a designated region of the programmable material by configuring the programmable material to have a specific region that will heat faster than the other regions. Such faster heating region of the programmable material may be, for example, a region of the programmable material having relatively high resistance or current density relative to other regions of the programmable material, and/or may be a region having less heat loss than other regions of the programmable material.

FIG. 3 shows an example embodiment "confined" PCRAM cell 10b in which the programmable material 14 is configured to include a pair of separate programmable material structures 22 and 24 that are directly against one another. The illustrated structures are plates that are oriented edgewise between electrodes 12 and 16; with one of the plates extending primarily along a first axis 23, and the other extending primarily along a second axis 25. The plates are indicated to extend "primarily" along the first and second axes to indicate that there may be curvature or other variation of planarity along the individual plates, but the overall dimensions of the plates are such that the plates may be understood to be oriented along the first and second axes. In the shown embodiment, the axes 23 and 25 are approximately orthogonal to one another; or, in other words, intersect one another at about a 90° angle. In other embodiments, the axes may intersect one another at other angles.

The structures 22 and 24 may be referred to as a first programmable material structure and a second programmable material structure, respectively; and in the shown embodiment may be referred to as a first plate and a second plate, respectively.

The first plate has an upper edge in direct contact with a lower edge of the second plate, and the switching volume 18 is shown to be along an interface 26 where the two plates meet. In the shown embodiment, the switching volume extends about equally into both plates. In other embodiments, the switching volume may be primarily within one plate or the other, depending on, for example, the compositions and configurations of the plates.

The first plate has a bottom edge that is directly against an upper surface of the bottom electrode 12, but which contacts only a portion of such upper surface. In contrast, the prior art memory cell of FIG. 1 has programmable material 14 contacting an entirety of an upper surface of the bottom electrode 12.

The plates 22 and 24 may both comprise any suitable phase change material. In some embodiments, the plates may comprise chalcogenide; and may, for example, comprise one or more of germanium, antimony and tellurium (for instance $Ge_2Sb_2Te_5$). The plates 22 and 24 may be the same composition as one another in some embodiments, and may be different compositions from one another in other embodiments. The plates may be primarily crystalline in some embodiments, or may be primarily amorphous in some embodiments. The plates may be primarily a same phase as one another in some embodiments, or may be primarily different phases from one another in some embodiments.

FIG. 4 diagrammatically illustrates the interface 26, and shows that the upper edge of plate 22 has a region 29 that is directly against the lower edge of the plate 24. A dashed line 27 is provided around the region 29 to help illustrate the region. The region 29 may be referred to as a contact area of plate 22, and specifically as an area along the upper edge of plate 22 that directly contacts plate 24.

The plate 22 has a width 30, and the plate 24 has a width 32. The region 29 has an area proportional to the widths of plates 22 and 24 (specifically, the area is the width of plate 22 multiplied by the width of plate 24 in the shown orientation in which the plates are orthogonal to one another). The widths of plates may be very thin in some embodiments (with example methods for fabricating thin plates being described below with reference to FIGS. 10-91); and in some embodiments may be less than or equal to about 5 nanometers (nm), less than or equal to about 4 nm, or even less than or equal to about 3 nm. Accordingly, the area of region 29 may be less than or equal to about 25 $nm^2$, less than or equal to about 20 $nm^2$, less than or equal to about 16 $nm^2$, less than or equal to about 10 $nm^2$, or even less than or equal to about 9 $nm^2$ in some embodiments.

The embodiment of FIG. 3 utilizes two intersecting plates of programmable material to form a single switching volume. Such switching volume may be reversibly transitioned between a pair of memory states, and accordingly the memory cell of FIG. 3 may be utilized as a single level cell (SLC). Other embodiments may utilize additional plates of programmable material to form additional switching volumes. Accordingly, individual memory cells may comprise more than two memory states, and may be utilized as multilevel cells (MLCs).

Figure 5:
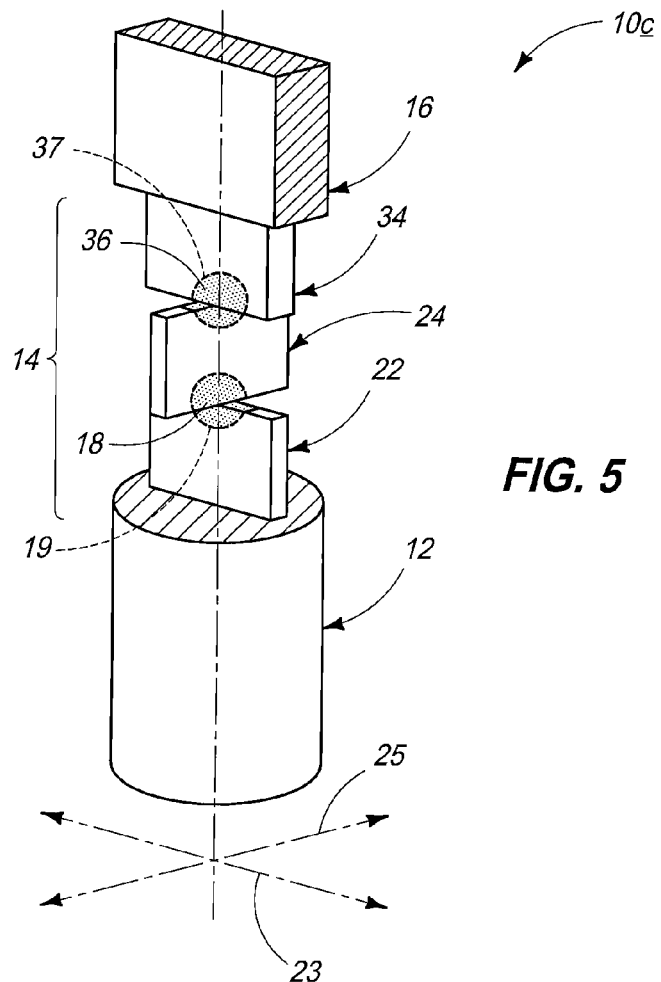
FIG. 5 is a diagrammatic, three-dimensional view of another example embodiment PCRAM cell.

FIG. 5 shows a memory cell 10c in which the programmable material 14 is configured as three separate programmable material plates 22, 24 and 34. The plates may comprise any suitable phase change material. In some embodiments, the plates comprise chalcogenide; and may, for example, comprise one or more of germanium, antimony and tellurium (for instance $Ge_2Sb_2Te_5$). The plates 22, 24 and 34 may all be the same composition as one another in some embodiments. In other embodiments, at least one of the plates may be of a different composition than at least one other of the plates. For instance, the first plate 22 may be of a different composition than the third plate 34.

The embodiment of FIG. 5 has the first plate 22 supported edgewise over bottom electrode 12, and extending primarily along the first axis 23; has the second plate 24 supported edgewise over the first plate and extending primarily along the second axis 25; and has the third plate 34 supported edgewise over the second plate and extending primarily along the first axis 23. Although the shown embodiment has the first and third plates 22 and 34 extending primarily along the common axis 23, in other embodiments the first and third plates may extend primarily along different axes relative to one another. In some embodiments, the second plate 24 may be considered to comprise an upper edge and a lower edge in opposing relation to one another; with the upper edge being directly against a bottom edge of the third plate 34, and with the lower edge being directly against a top edge of the first plate 22.

The memory cell 10c comprises two switching volumes 18 and 36. Dashed-lines 19 and 37 are provided around the switching volumes 18 and 36, respectively, to diagrammatically illustrate approximate boundaries of the switching volumes. In the shown embodiment, switching volume 18 extends about equally across both of the adjacent plates 22 and 24, and switching volume 36 extends about equally across both of the adjacent plates 24 and 34. In other embodiments, the switching volume 18 may be primarily, or entirely, within only one of the plates 22 and 24; and similarly the switching volume 36 may be primarily, or entirely, within only one of the plates 24 and 34.

The two switching volumes may have different programming characteristics relative to one another so that the switching volumes may be independently operated. In some embodiments, switching volume 18 may have different programming characteristics than switching volume 36 due to a different geometry of switching volume 18 than switching volume 36 (i.e., due to a different amount of contact area between plates 22 and 24 than between plates 24 and 34). Such different geometry may be created by having plate 22 be of a different thickness than plate 34 (in the embodiment of FIG. 5, plate 22 is illustrated to be thinner than plate 34). In some embodiments, switching volume 18 may have different programming characteristics than switching volume 36 due to a different composition within switching volume 18 than within switching volume 36. Such difference in composition may result from having plate 22 be of a different composition than plate 34. In some embodiments, switching volume 18 may have different programming characteristics than switching volume 36 due to both a different composition and a different geometry within switching volume 18 than within switching volume 36.

Figure 6:
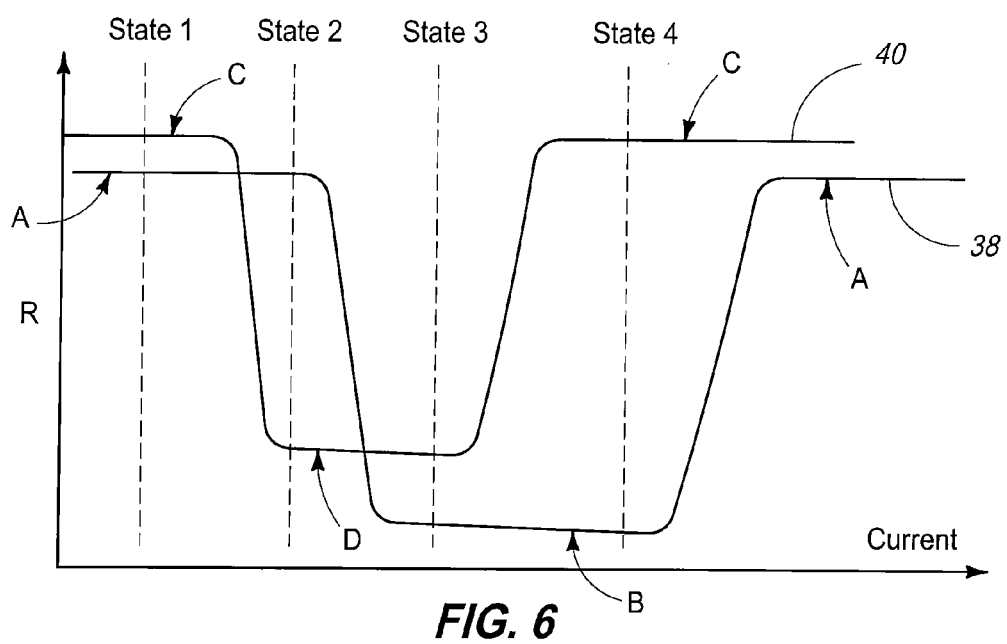
FIG. 6 is a graphical illustration of various memory states that may be utilized with the FIG. 5 PCRAM cell.

Memory cell 10c may be utilized as a multilevel cell by taking advantage of the different programming characteristics of the switching volumes 18 and 36. FIG. 6 diagrammatically illustrates an example relationship between resistance (R) and current through the memory cell, and shows two curves 38 and 40 that represent memory states of the individual switching volumes in various operational modes. Specifically, curve 38 shows that one of the switching volumes reversibly transitions between a first memory state "A" and a second memory state "B"; and curve 40 shows that the other switching volume reversibly transitions between a first memory state "C" and a second memory state "D". The transition from the "A" state to the "B" state occurs under first programming conditions, from the "B" state to the "A" state under second programming conditions, from the "C" state to the "D" state under third programming conditions, and from the "D" state to the "C" state under fourth programming conditions. The first, second, third and fourth programming conditions all differ from one another so that the memory cell has four selectable memory states "A/C", "A/D", "B/D" and "B/C"; which are designated as States 1-4 in FIG. 6.

Although the embodiment of FIG. 5 utilizes three plates and two switching regions, in other embodiments analogous memory cells may be configured to comprise more than three plates and accordingly more than two switching regions. Such analogous memory cells could thus have more selectable memory states than the four states shown in FIG. 6.

Figure 7:
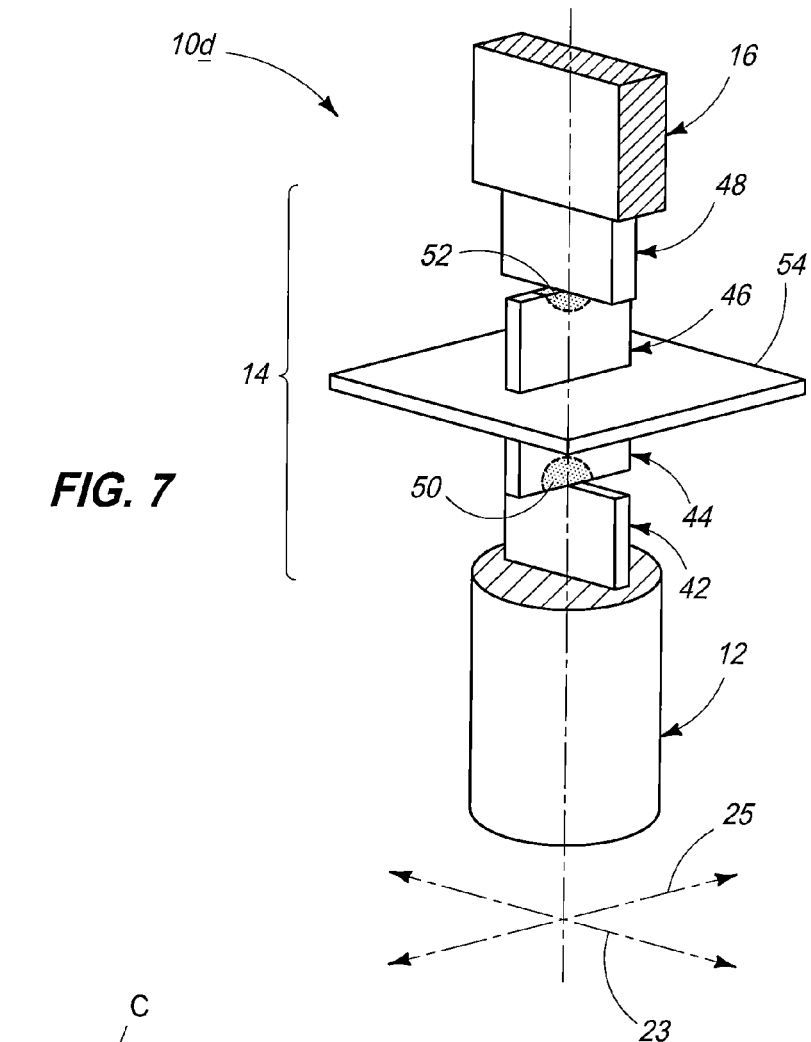
FIG. 7 is a diagrammatic, three-dimensional view of another example embodiment PCRAM cell.

Some phase change materials transition between phases more rapidly than others, and such characteristic may be taken advantage of in some embodiments that form multilevel cells. FIG. 7 shows an example memory cell 10d configured to utilize different switching rates between two switching regions to attain a multilevel cell.

The memory cell 10d comprises programmable material 14 configured to include four separate programmable material plates 42, 44, 46 and 48; with such plates being oriented edgewise between electrodes 12 and 16. The plates may comprise any suitable phase change material. In some embodiments, the plates may comprise chalcogenide; and may, for example, comprise one or more of germanium, antimony and tellurium (for instance $Ge_2Sb_2Te_5$). In some embodiments, each of the plates 42, 44, 46 and 48 may be considered to have an upper edge and a lower edge. Thus, the lower edge of plate 44 may be considered to be against the upper edge of plate 42; and similarly the lower edge of plate 48 may be considered to be against the upper edge of plate 46. In the shown embodiment, plates 42 and 48 extend primarily along a first axis 23, and plates 44 and 46 extend primarily along a second axis 25. In other embodiments, the plates may extend in other directions, provided that the adjacent edges of plates 42 and 44 overlap and directly contact one another, and that the adjacent the edges of plates 46 and 48 overlap and directly contact one another.

A barrier material 54 is shown provided between plates 44 and 46. Such barrier material may comprise any suitable composition; and in some embodiments may comprise a conductive material, such as, for example, tungsten. The barrier material can simplify fabrication in embodiments in which plates 44 and 46 are of different compositions relative to one another since it provides more surface to support plate 46 than does the upper edge of plate 44. However, in other embodiments (discussed below with reference to FIG. 9) the barrier may be omitted. If barrier 54 is utilized, such barrier may be kept very thin (for instance, the thickness may be less than or equal to about 10 angstroms) so that it does not significantly impact operational performance of the memory cell.

The memory cell 10d comprises two switching volumes 50 and 52. In the shown embodiment, switching volume 50 is entirely in plate 44, and switching volume 52 is entirely in plate 46. In other embodiments, the switching volume 50 may extend partially or entirely into plate 42; and/or the switching volume 52 may extend partially or entirely into plate 48.

The two switching volumes have different switching rates relative to one another so that the switching volumes may be independently operated by controlling a duration or slope of a programming pulse. Switching volume 50 may have a different switching rate than switching volume 52 due to a different composition within switching volume 50 than within switching volume 52. Such difference in composition may result from having plate 44 be of a different composition than plate 46, and/or having plate 42 be of a different composition than plate 48.

Figure 8:
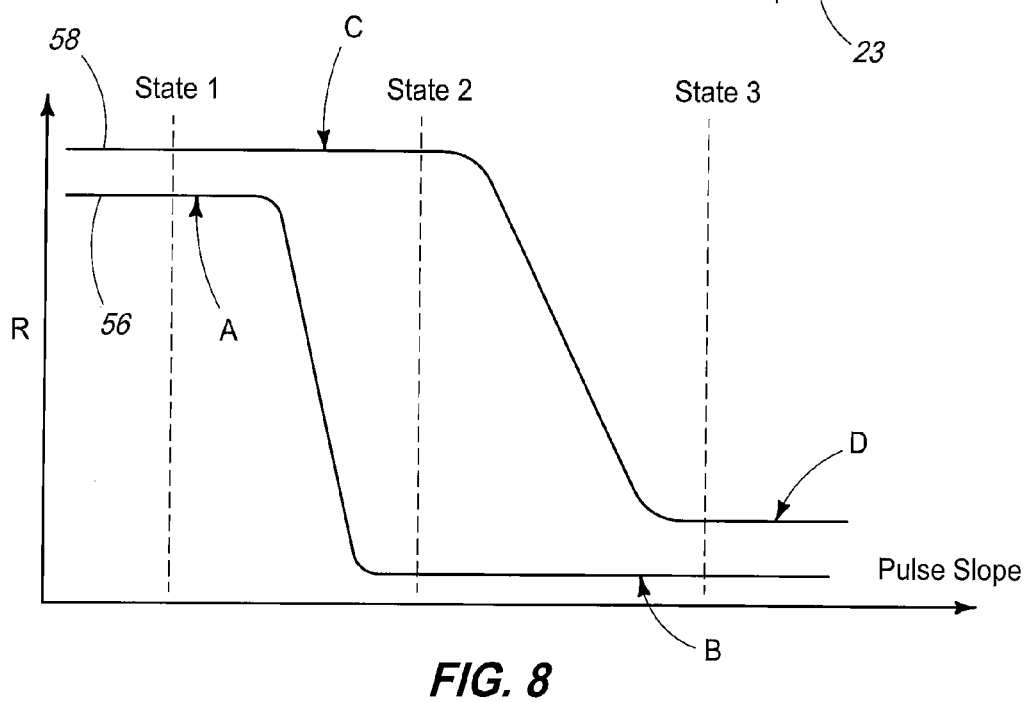
FIG. 8 is a graphical illustration of various memory states that may be utilized with the FIG. 7 PCRAM cell.

FIG. 8 diagrammatically illustrates an example relationship between resistance (R) and programming pulse duration or slope (labeled as "pulse slope" along the x-axis) through the memory cell, and shows two curves 56 and 58 that represent memory states of the individual switching volumes in various operational modes. Specifically, curve 56 shows that one of the switching volumes reversibly transitions between a first memory state "A" and a second memory state "B"; and curve 58 shows that the other switching volume reversibly transitions between a first memory state "C" and a second memory state "D". The transition from the "A" state to the "B" state occurs under first programming conditions, from the "B" state to the "A" state under second programming conditions, from the "C" state to the "D" state under third programming conditions, and from the "D" state to the "C" state under fourth programming conditions.

The cell may be operated as follows. FIG. 8 shows the cell starting in the state "A/C". A pulse may be utilized which is of appropriate duration or slope to switch only the faster switching volume, and thus form the memory state "B/C". A pulse may then be utilized which is of sufficient duration or slope to switch the slower switching volume, and thus form the memory state "B/D". The cell may then be returned to the memory state "A/C" by utilizing a pulse of sufficient duration or slope to switch both switching volumes. It is noted that the memory cell only has three selectable memory states "A/C", "B/C" and "B/D" (which are designated as States 1-3 in FIG. 6), because there is no pulse which can switch the slower switching volume without also switching the faster switching volume. However, in other embodiments analogous memory cells may be configured to comprise more than four plates and accordingly more than three memory states.

Figure 9:
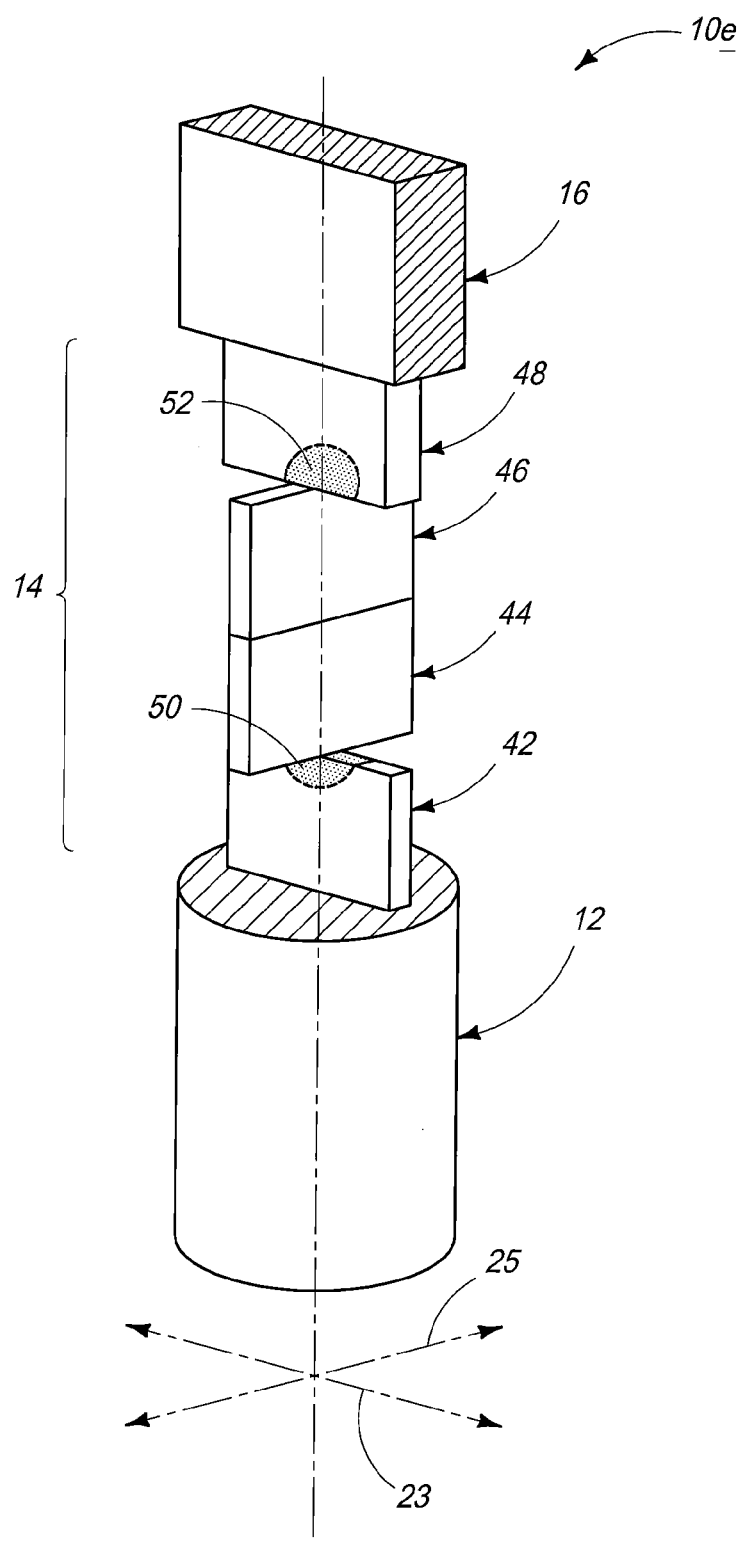
FIG. 9 is a diagrammatic, cross-sectional view of another example embodiment PCRAM cell.

As indicated above, the barrier 54 of the memory cell 10d shown in FIG. 7 may be optional in some embodiments. FIG. 9 shows a memory cell 10e analogous to that of FIG. 7, but lacking the barrier material 54. According, the third plate 46 is formed directly along an upper edge of the second plate 44. The memory cell 10e may be operated identically to the memory cell 10d discussed above with reference to FIGS. 7 and 8. FIG. 9 shows switching volumes 50 and 52 within plates 42 and 48, respectively, to illustrate an alternative operational configuration to that of FIG. 7 (where the switching volumes 50 and 52 are shown within plates 44 and 46, respectively).

The various memory cells described above can be formed utilizing any suitable methodology. Some example methods are described with reference to FIGS. 10-91.

Figure 10:
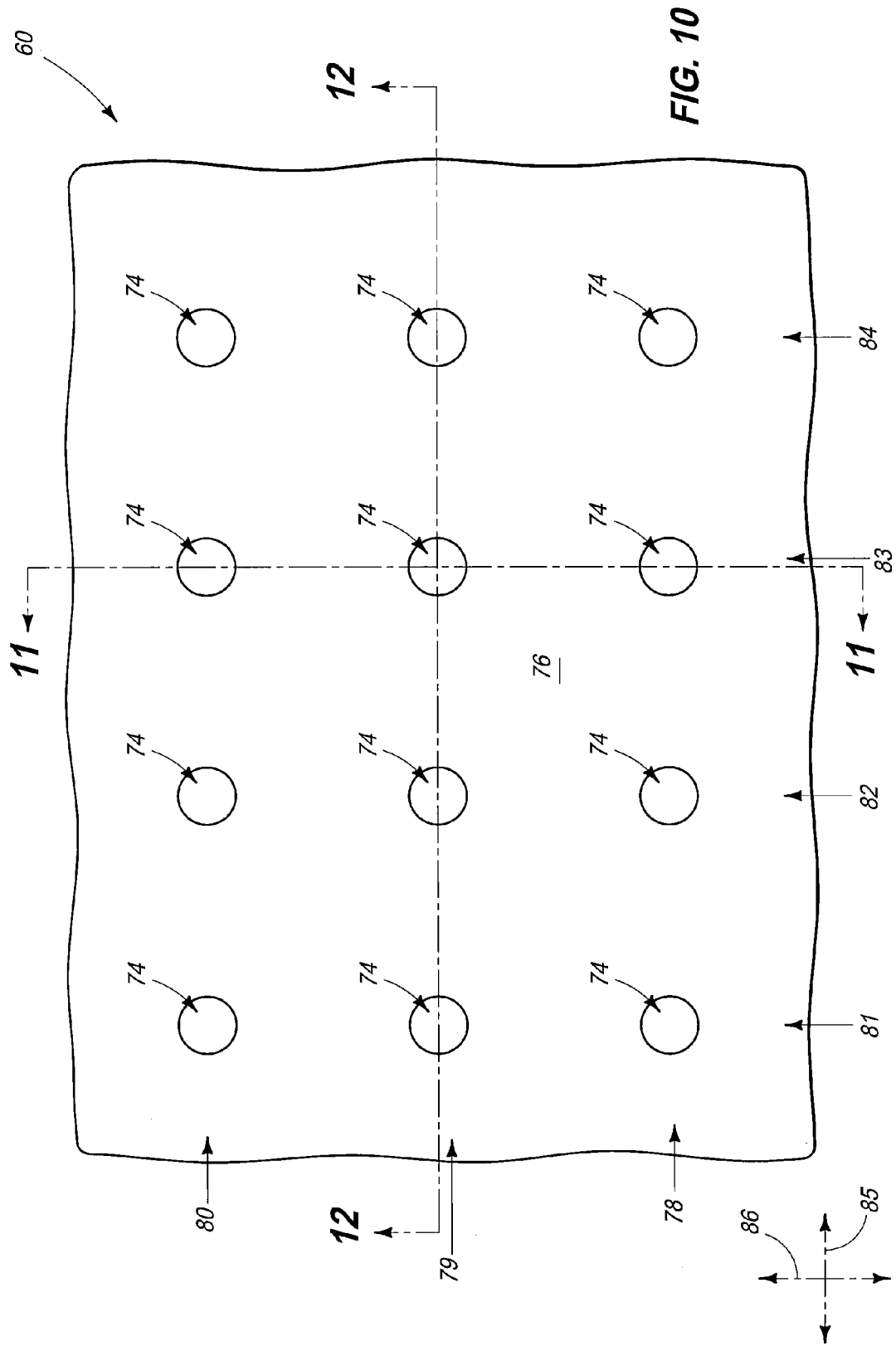
FIGS. 10-12 are a diagrammatic top view, and diagrammatic sectional side views of a semiconductor construction at a processing stage of an example embodiment method of forming a memory array. The cross-sectional side view of FIG. 11 is along the lines 11-11 of FIGS. 10 and 12, and the cross-sectional side view of FIG. 12 is along the lines 12-12 of FIGS. 10 and 11.
Figure 11:
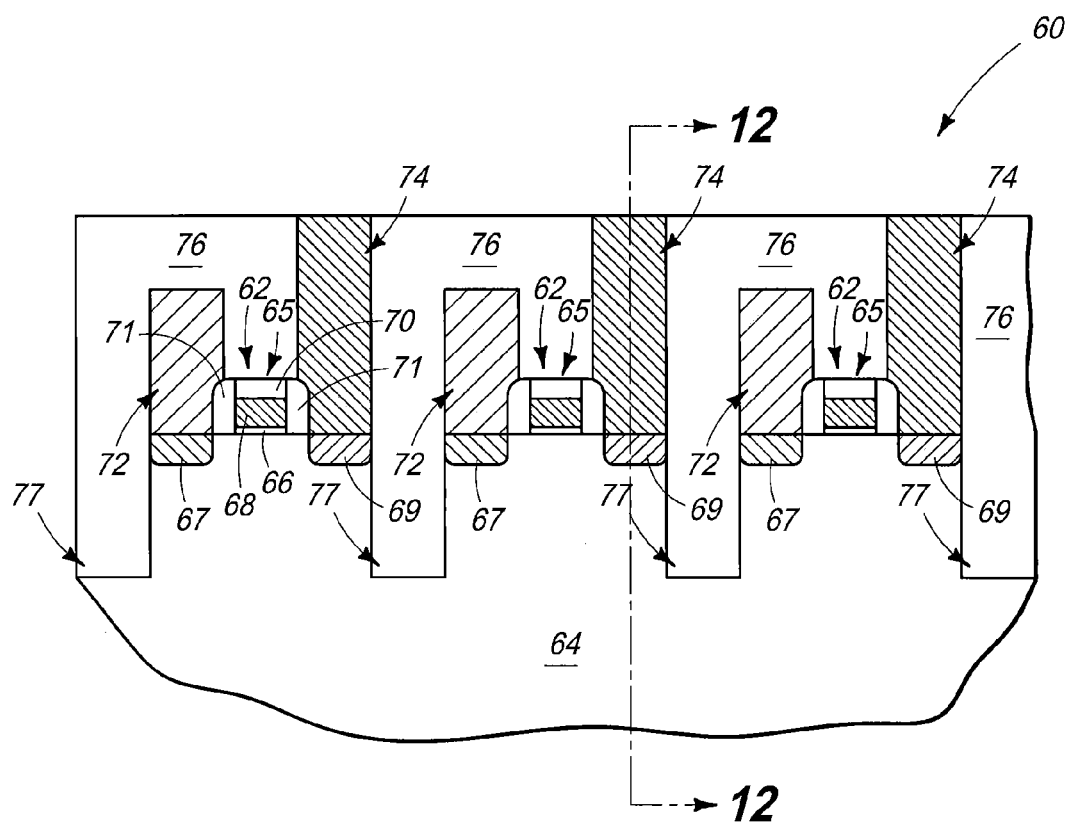
Figure 12:
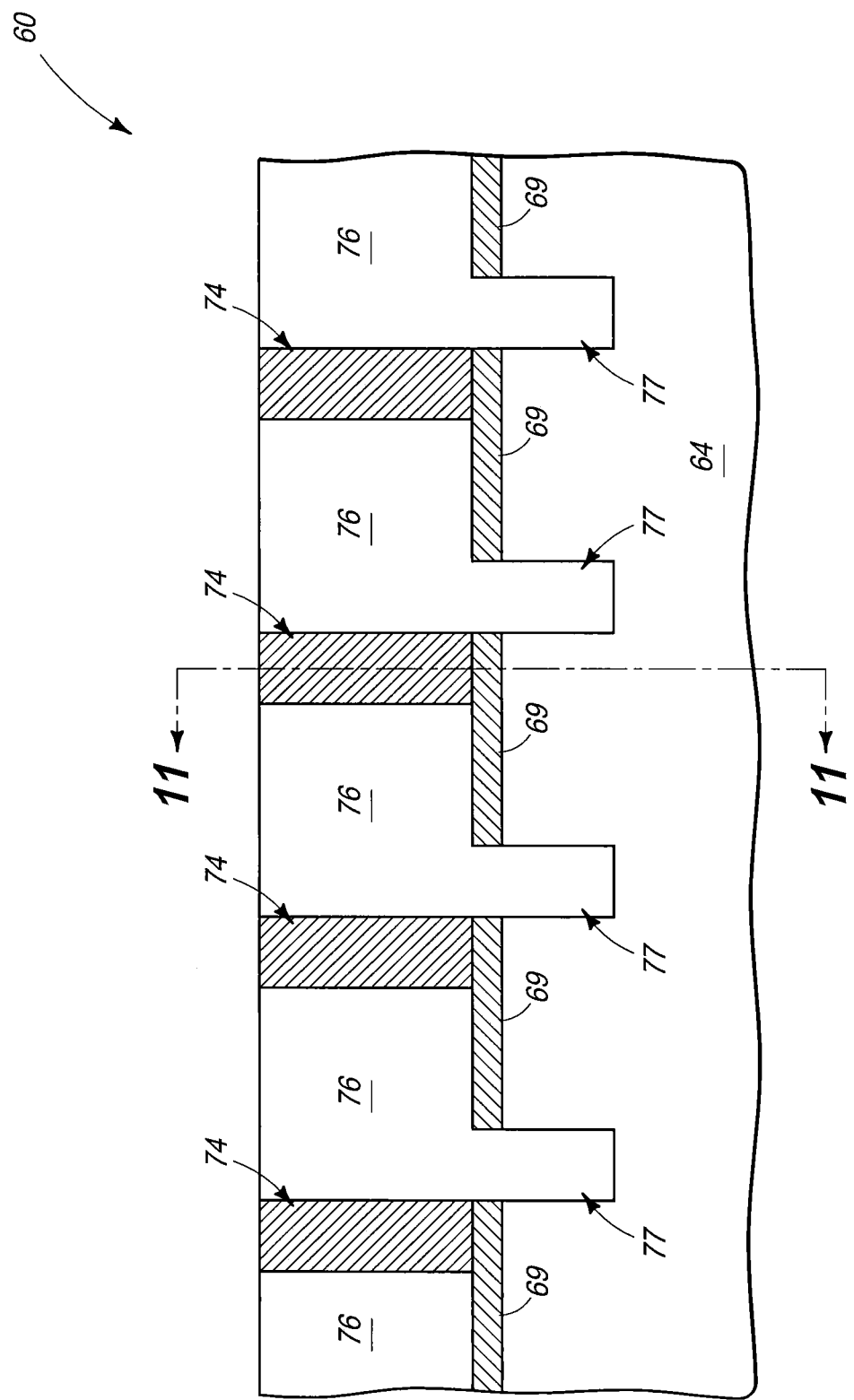

Referring to FIGS. 10-12, a semiconductor construction 60 is illustrated at a processing stage associated with the fabrication of a memory array. The semiconductor construction includes a plurality of planar field effect transistors 62 supported by a base 64.

Base 64 may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 64 is shown to be homogenous, the base may comprise numerous materials in some embodiments. For instance, base 64 may correspond to a semiconductor substrate containing one or more materials associated with integrated circuit fabrication. In such embodiments, the materials may correspond to one or more of refractory metal materials, barrier materials, diffusion materials, insulator materials, etc.

Each of the transistors comprises a gate stack 65, and a pair of source/drain regions 67 and 69 on opposing sides of the gate stack. The gate stacks include gate dielectric 66, electrically conductive gate material 68 and electrically insulative capping material 70. The gate dielectric may comprise any suitable composition or combination of compositions, such as, for example, silicon dioxide. The gate material may comprise any suitable composition or combination of compositions, such as, for example, one or more of various metals, metal-containing materials and conductively-doped semiconductor materials. The insulative capping material 70 may comprise any suitable composition or combination of compositions, such as, for example, one or more of silicon dioxide, silicon nitride and silicon oxynitride.

In the shown embodiment, sidewall spacers 71 are on opposing sides of the gate stacks. Such sidewall spacers may comprise any suitable composition or combination of compositions, and in some embodiments may comprise or more of silicon oxide, silicon oxynitride and silicon nitride.

The gate stacks may correspond to access lines (i.e. wordlines) that extend in and out of the page relative to the cross-section of FIG. 11.

A pair of electrically conductive contacts 72 and 74 are adjacent each of the transistor gate stacks, with the contacts 72 being electrically coupled to the source/drain regions 67 and with the contacts 74 being electrically coupled to the source/drain regions 69. The contacts 72 may be ultimately connected to sense lines (i.e., bit lines), which are not shown. The contacts 74 may be ultimately utilized as bottom electrodes of memory cells through processing described below with reference to FIGS. 13-43, and the transistors may be utilized as select devices for such memory cells. In the shown embodiment, the contacts 74 are in one-to-one correspondence with the transistors.

The contacts 72 and 74 may comprise any suitable composition or combination of compositions, such as, for example, one or more of various metals, metal-containing materials and conductively-doped semiconductor materials.

Dielectric material 76 is shown extending between the contacts 74, over the transistors 62 and contacts 72, and within isolation trenches 77 that extend into base 64. Dielectric material 76 may comprise any suitable composition or combination of compositions. Although the dielectric material is shown to be homogeneous, in some embodiments multiple dielectric materials may be utilized. For instance, the dielectric material within the trenches may comprise one or both of silicon dioxide and silicon nitride, and the dielectric material over the trenches may comprise one or more of various glasses, such as, for example, borophosphosilicate glass, phosphosilicate glass, fluorosilicate glass, etc.

The construction 60 is shown having a planarized upper surface that extends across dielectric material 76 and contacts 74 (shown in FIGS. 11 and 12). Such planarized upper surface may be formed by any suitable processing, including, for example, chemical-mechanical polishing (CMP).

The contacts 74 may be considered to be arranged as an array of rows 78-80 and columns 81-84 (shown in FIG. 10); with the rows extending along a first axis 85 and the columns extending along a second axis 86 which intersects the first axis. In the shown embodiment, the second axis is approximately orthogonal to the first axis. In other embodiments, the first and second axes may intersect at other angles.

In some embodiments, the contacts 74 are utilized as bottom electrodes of memory cells, and accordingly programmable material is formed directly on the contacts 74. In other embodiments, one or more additional conductive materials may be formed over the contacts to create bottom electrodes of the memory cells. In some embodiments, the planar transistors may be replaced by vertical transistors, bipolar junction transistors or diodes.

Figure 13:
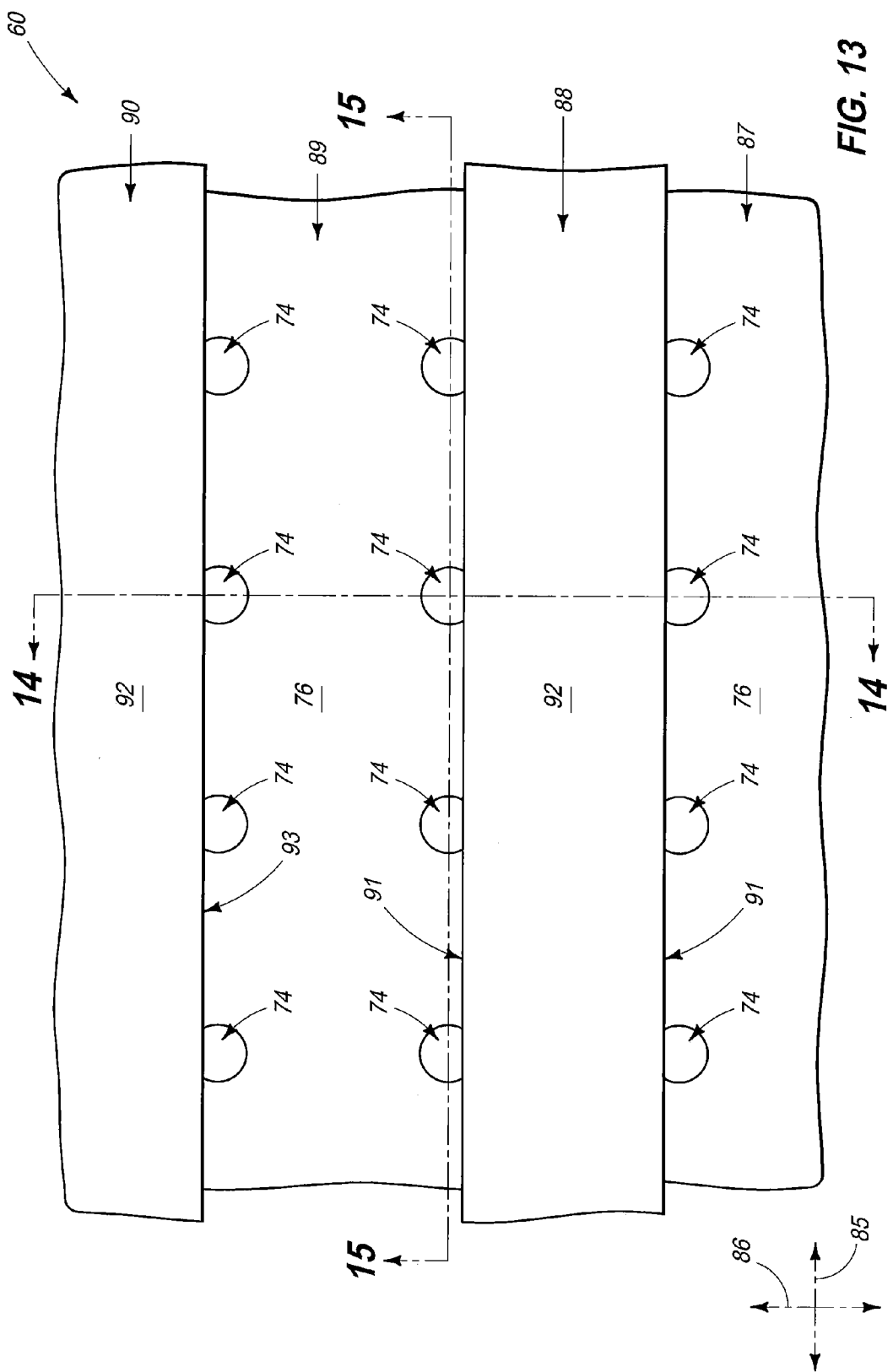
FIGS. 13-15 are a diagrammatic top view, and diagrammatic sectional side views of the semiconductor construction of FIGS. 10-12 at a processing stage subsequent to that of FIGS. 10-12. The cross-sectional side view of FIG. 14 is along the lines 14-14 of FIGS. 13 and 15, and the cross-sectional side view of FIG. 15 is along the lines 15-15 of FIGS. 13 and 14.
Figure 14:
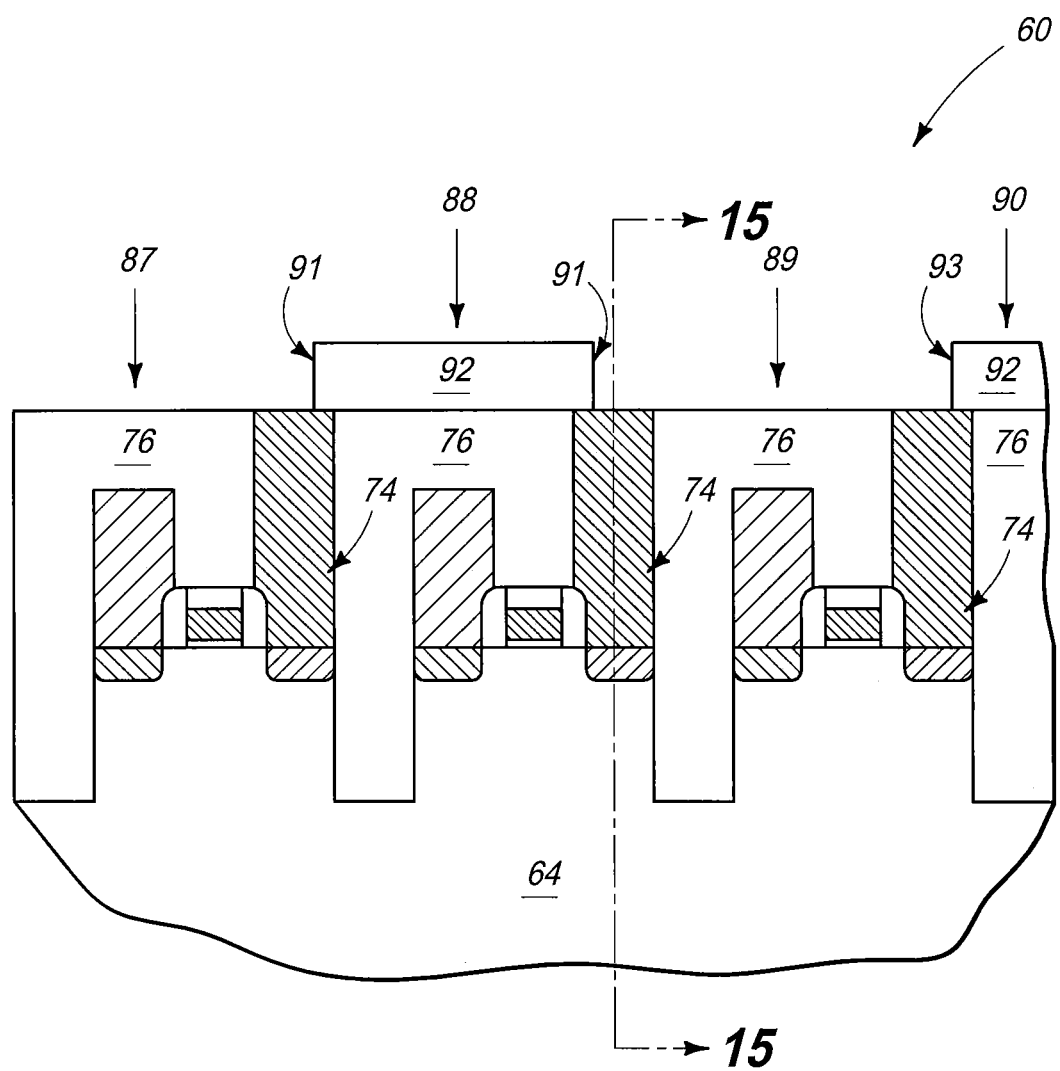
Figure 15:
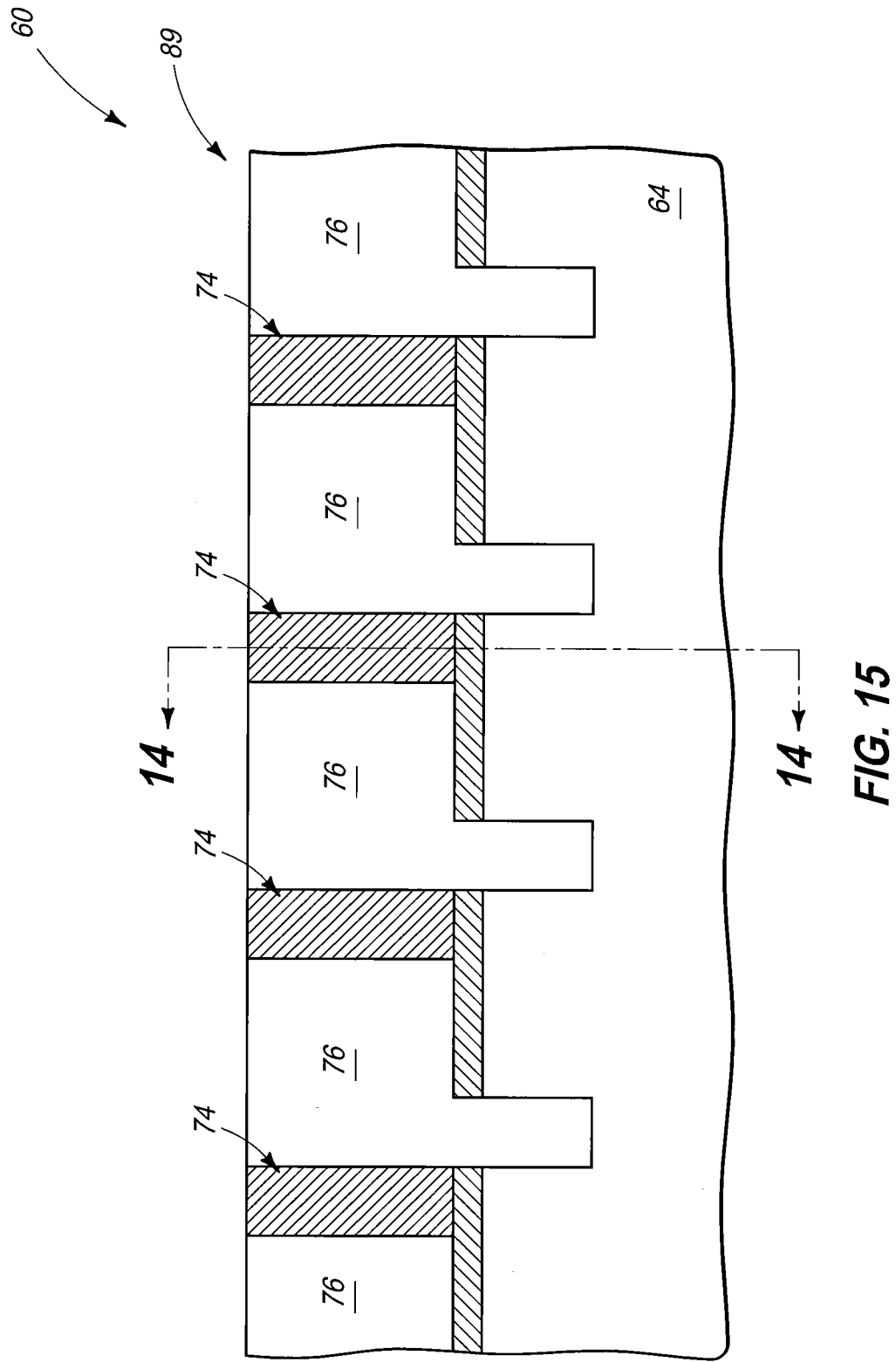

Referring to FIGS. 13-15, blocks 88 and 90 are formed over contacts 74. The blocks are configured as strips that extend primarily along the first axis 85. The blocks 88 and 90 extend across alternating spaces between adjacent rows of the bottom electrodes, and partially cover the bottom electrodes. Since the blocks only cover alternating spaces between the rows, some spaces between the rows remain after formation of the blocks. Such spaces are labeled as spaces 87 and 89 in FIG. 13. The spaces 87 and 89, together with the blocks 88 and 90, form a pattern over contacts 74; with such pattern having the spaces 87 and 89 alternating with the blocks 88 and 90.

The blocks 88 and 90 have outer sidewall edges 91 and 93, respectively. Portions of such edges are directly over the underlying contacts 74, and thus may be considered to extend upwardly from upper surfaces of such contacts.

The blocks 88 and 90 comprise a material 92. Such material may comprise any suitable composition or combination of compositions, and in some embodiments may comprise one or both of silicon dioxide and silicon nitride. The material 92 may be patterned into blocks 88 and 90 by any suitable process. For instance, material 92 may be formed entirely across an upper surface of construction 60, and then a photolithographically-patterned photoresist mask (not shown) may be formed over material 92 to define a pattern of blocks 88 and 90. Such pattern may be transferred from the patterned photoresist mask into material 92 with one or more suitable etches, and then the photoresist mask may be removed to leave the construction shown in FIGS. 13-15.

Figure 16:
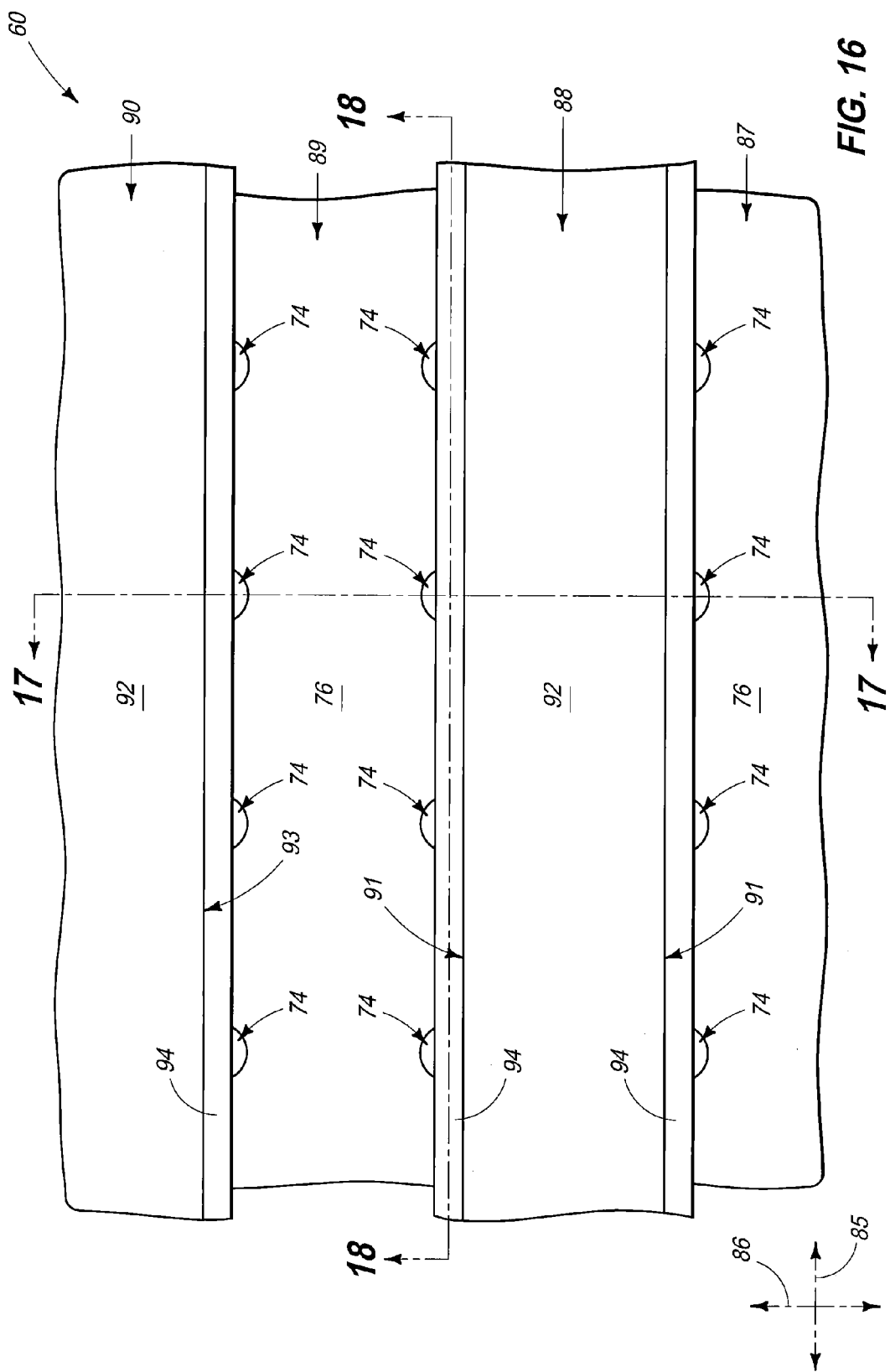
FIGS. 16-18 are a diagrammatic top view, and diagrammatic sectional side views of the semiconductor construction of FIGS. 10-12 at a processing stage subsequent to that of FIGS. 13-15. The cross-sectional side view of FIG. 17 is along the lines 17-17 of FIGS. 16 and 18, and the cross-sectional side view of FIG. 18 is along the lines 18-18 of FIGS. 16 and 17.
Figure 17:
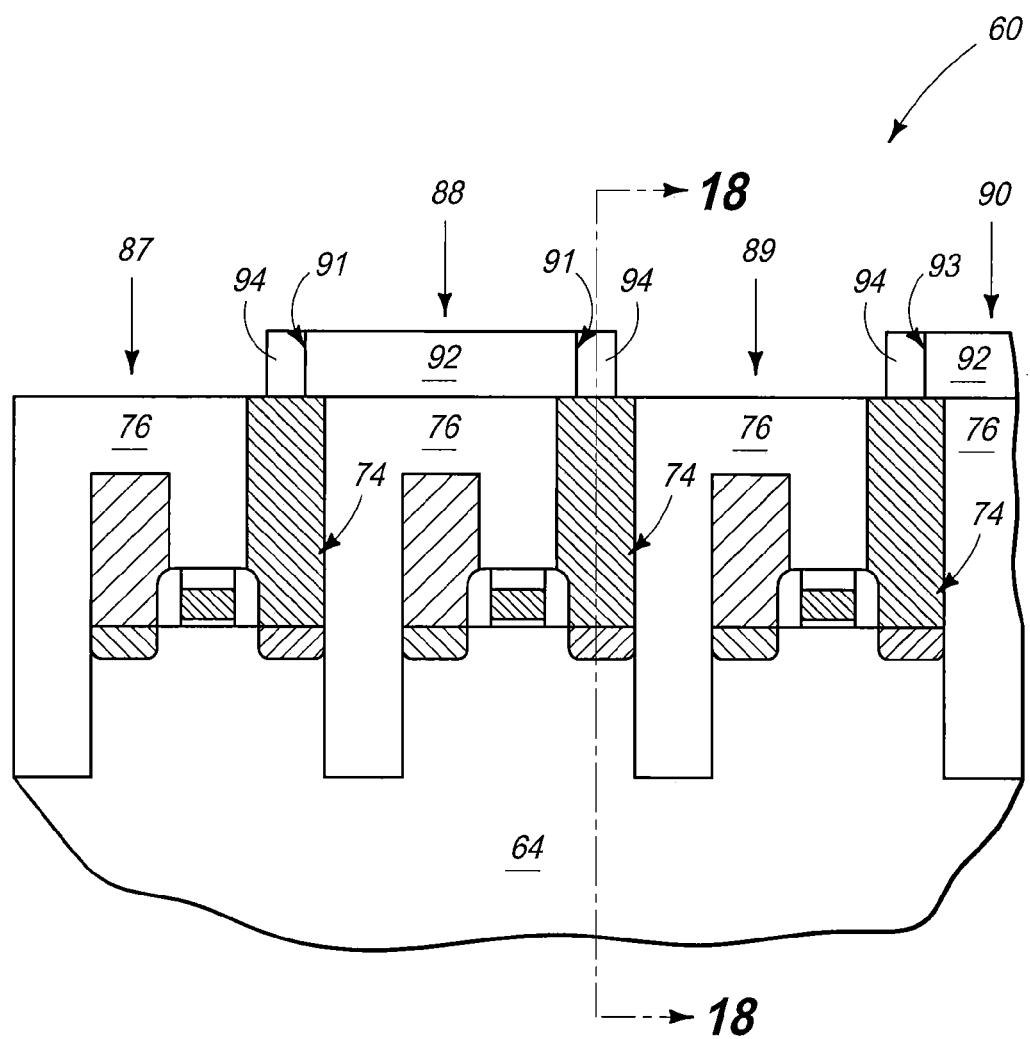
Figure 18:
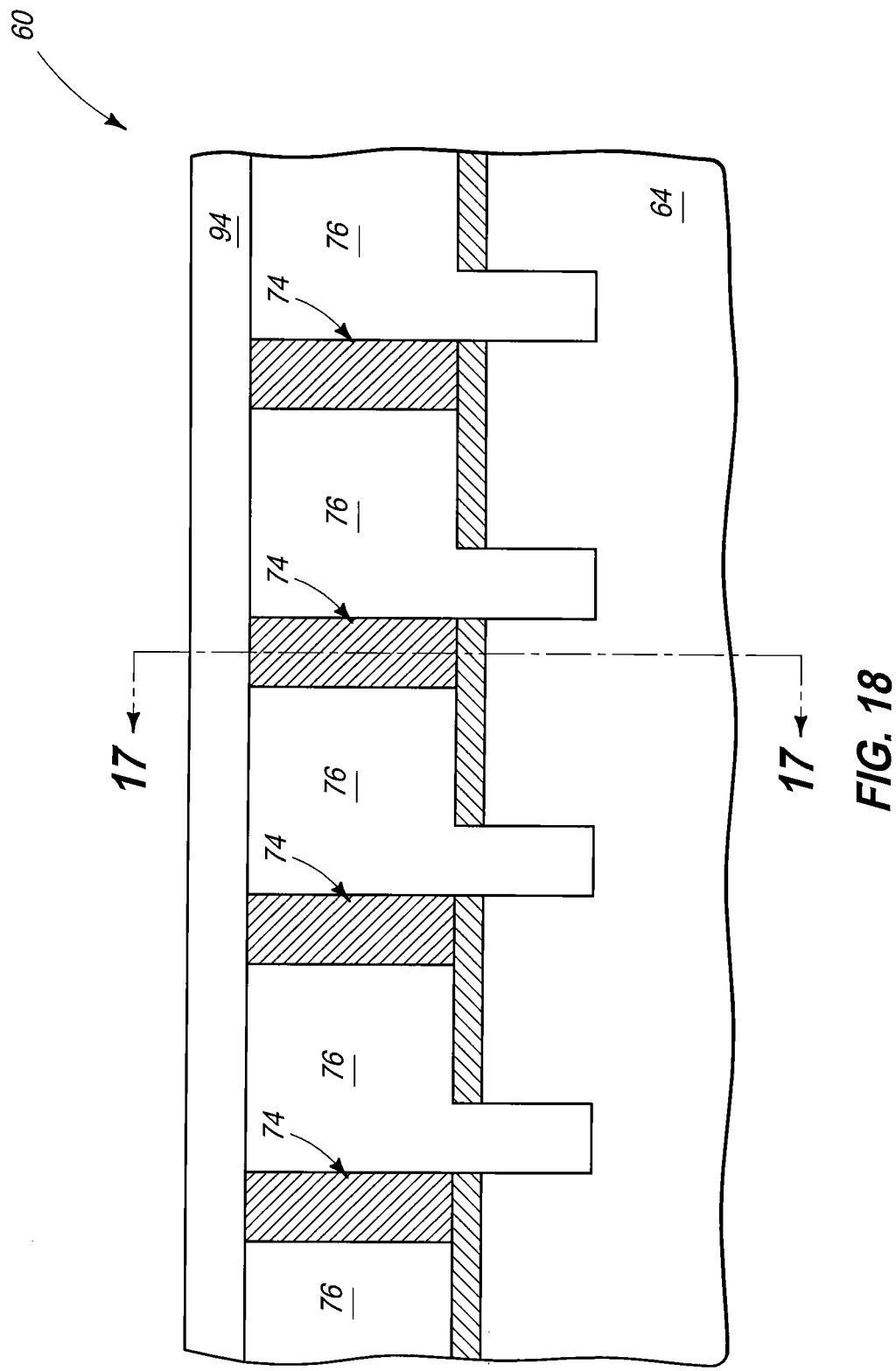

Referring to FIGS. 16-18, sacrificial spacer material 94 is formed along the sidewalls 91 and 93 of blocks 88 and 90, respectively. The sacrificial spacer material may comprise any suitable composition or combination of compositions, and is a material which may be selectively removed relative to the material 92 of blocks 88 and 90. For instance, the sacrificial spacer material may comprise material known in the art as low temperature silicon nitride.

The sacrificial spacer material may be formed along the sidewalls be any suitable process. For instance, in some embodiments a layer of the sacrificial spacer material may be formed across the blocks 88 and 90, along the sidewalls 91 and 93, and across the spaces 87 and 89 between the blocks. Subsequently, such layer may be subjected to anisotropic etching to remove portions of the layer along horizontal surfaces, while leaving the layer along the vertical sidewall surfaces to form the configuration shown in FIGS. 16-18.

Figure 19:
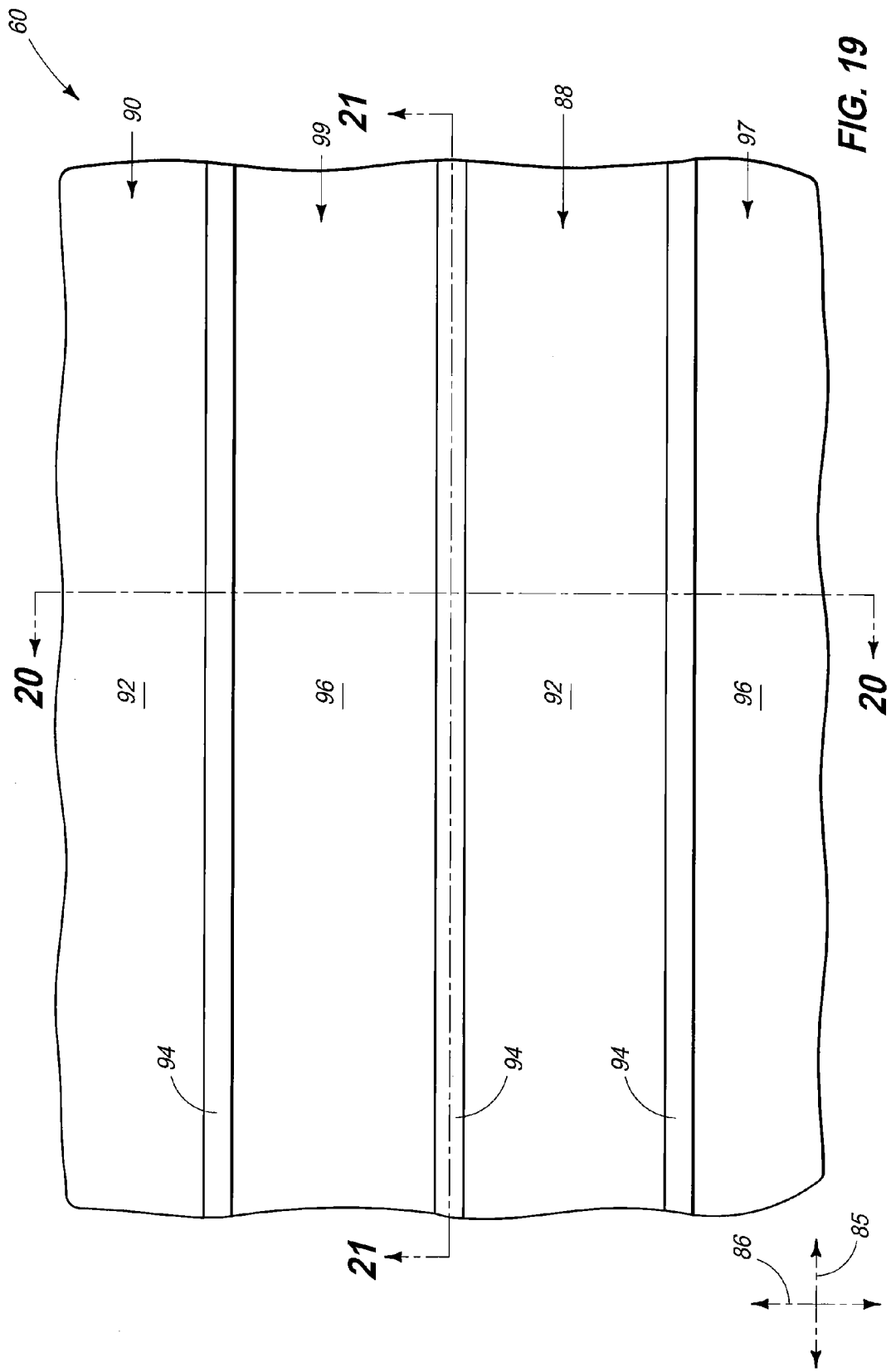
FIGS. 19-21 are a diagrammatic top view, and diagrammatic sectional side views of the semiconductor construction of FIGS. 10-12 at a processing stage subsequent to that of FIGS. 16-18. The cross-sectional side view of FIG. 20 is along the lines 20-20 of FIGS. 19 and 21, and the cross-sectional side view of FIG. 21 is along the lines 21-21 of FIGS. 19 and 20.
Figure 20:
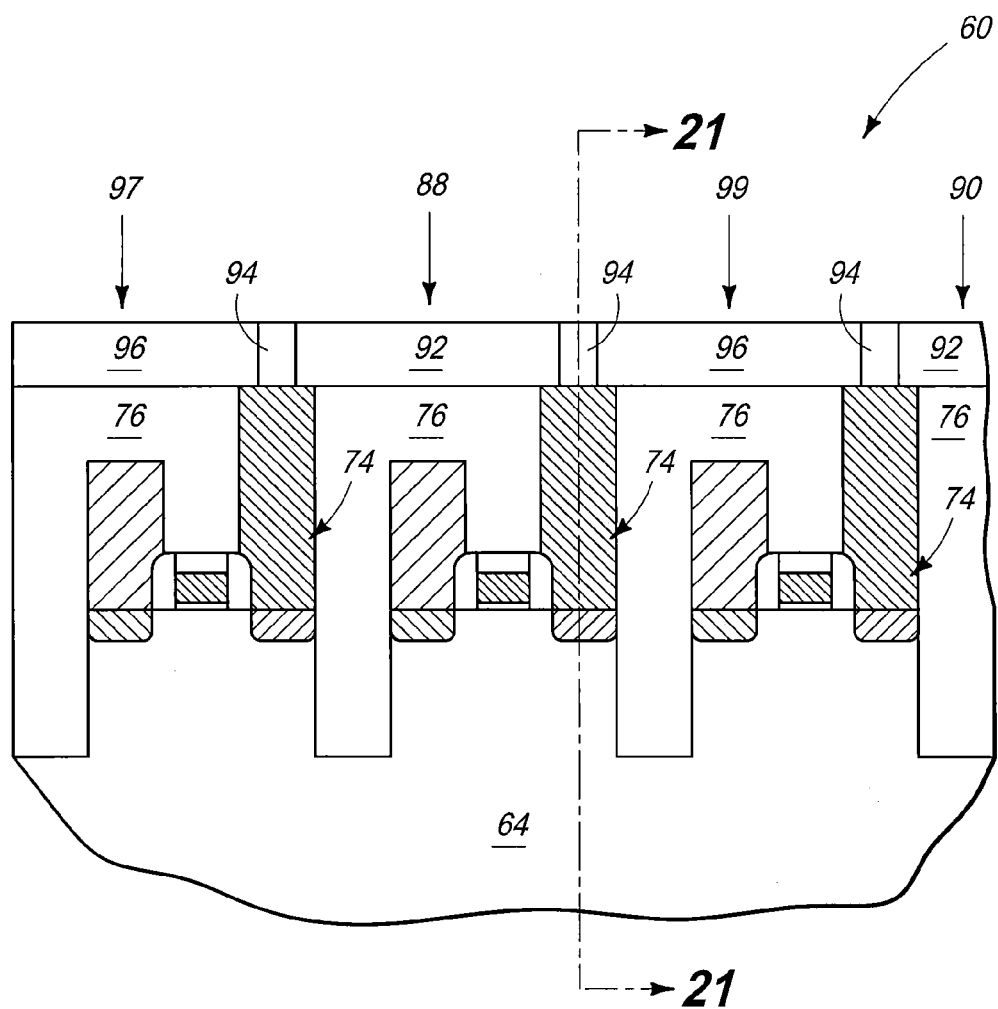
Figure 21:
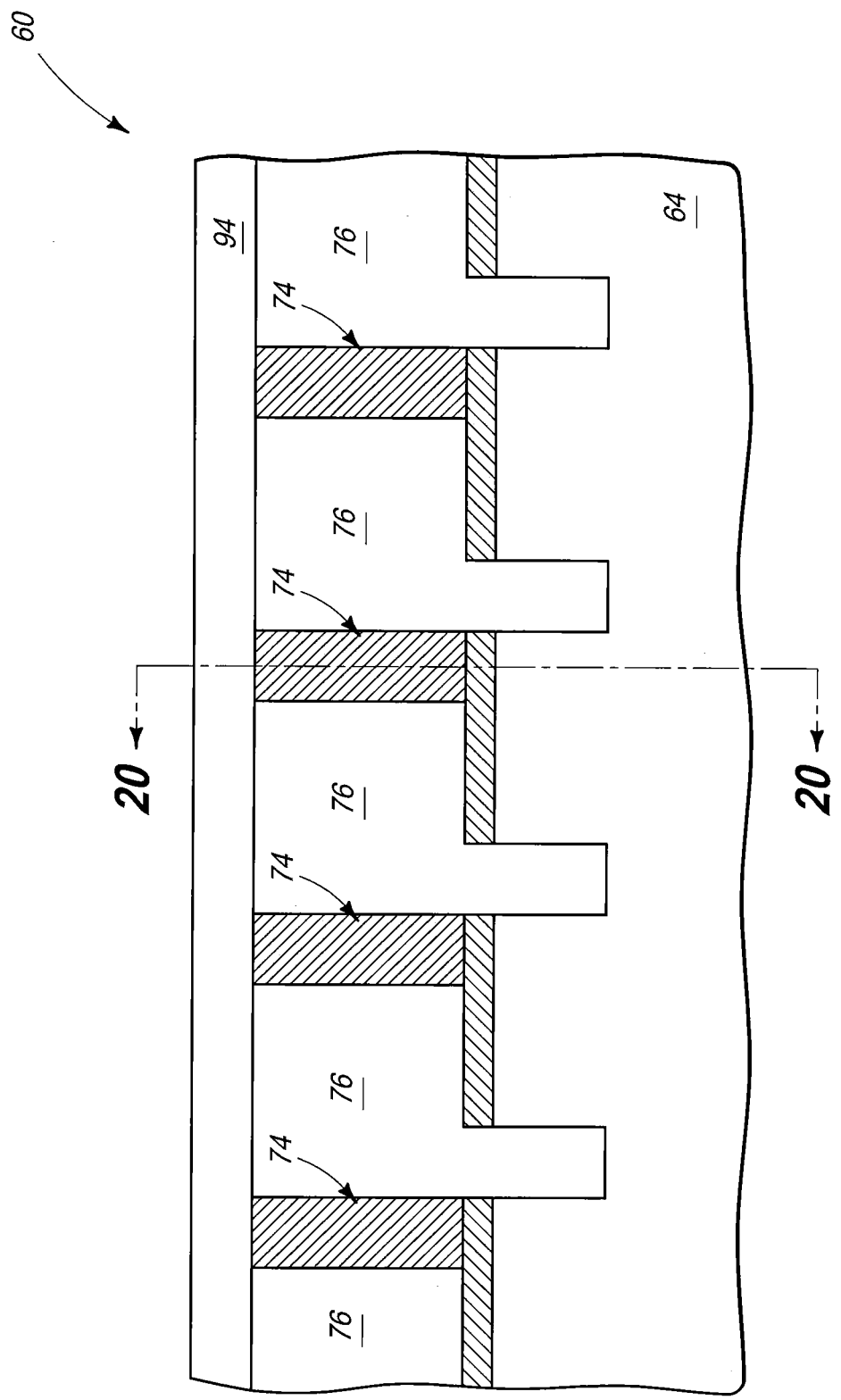

Referring to FIGS. 19-21, a material 96 is provided within the spaces 87 and 89 (FIG. 16), and patterned into blocks 97 and 99. In some embodiments, materials 92 and 96 may be referred to as first and second materials, respectively; and blocks 88 and 90 may be referred to as first blocks, while blocks 97 and 99 are referred to as second blocks.

The material 96 may be patterned into blocks 97 and 99 utilizing any suitable processing. In some embodiments, material 96 is provided within spaces 87 and 89 (FIG. 16) and over blocks 92, and is then removed from over blocks 92 utilizing planarization (such as, for example, CMP) to form the construction of FIGS. 19-21.

Material 96 may comprise any suitable composition or combination of compositions, and in some embodiments may comprise, consist essentially of, or consist of silicon dioxide.

Figure 22:
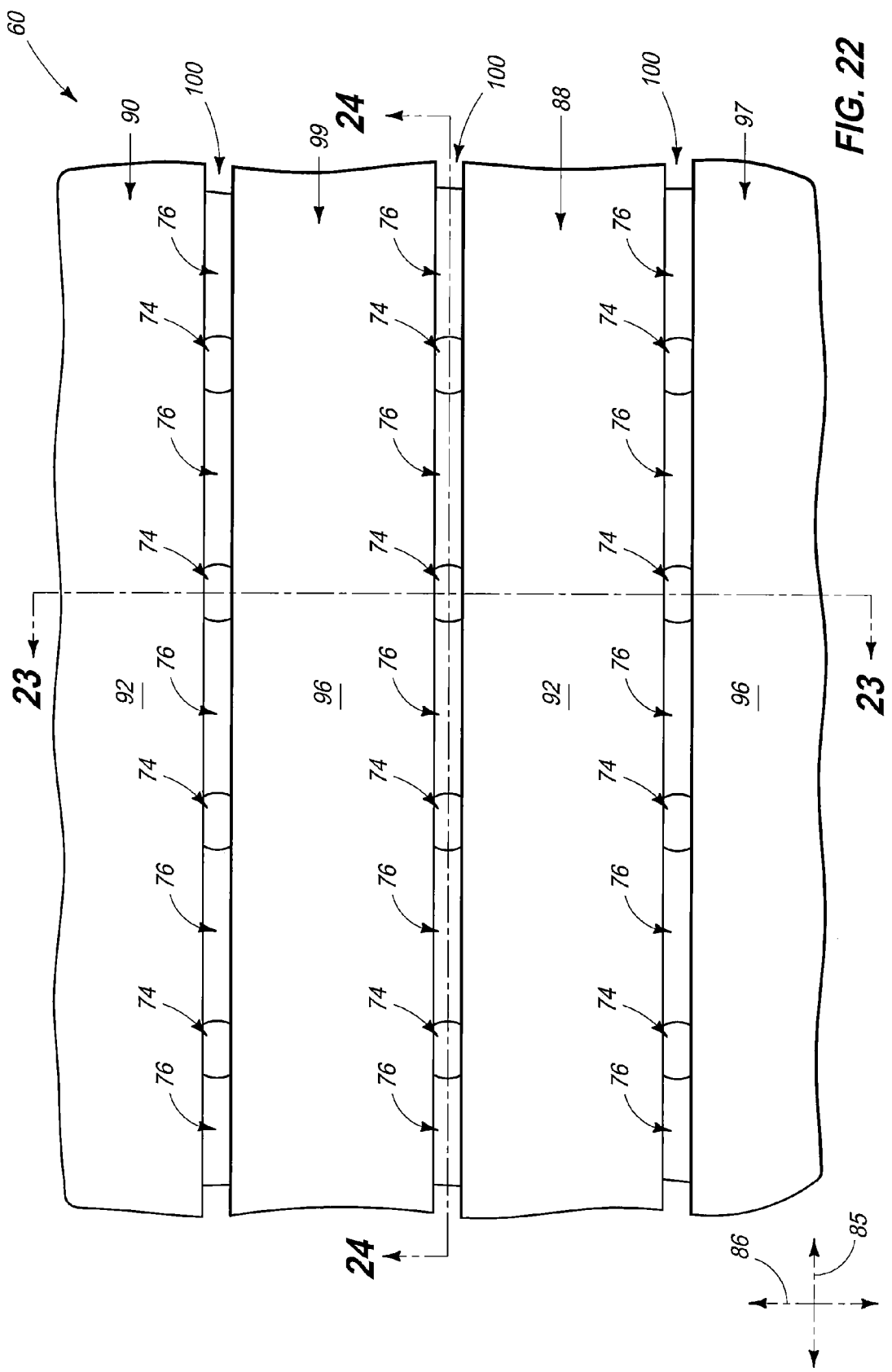
FIGS. 22-24 are a diagrammatic top view, and diagrammatic sectional side views of the semiconductor construction of FIGS. 10-12 at a processing stage subsequent to that of FIGS. 19-21. The cross-sectional side view of FIG. 23 is along the lines 23-23 of FIGS. 22 and 24, and the cross-sectional side view of FIG. 24 is along the lines 24-24 of FIGS. 22 and 23.
Figure 23:
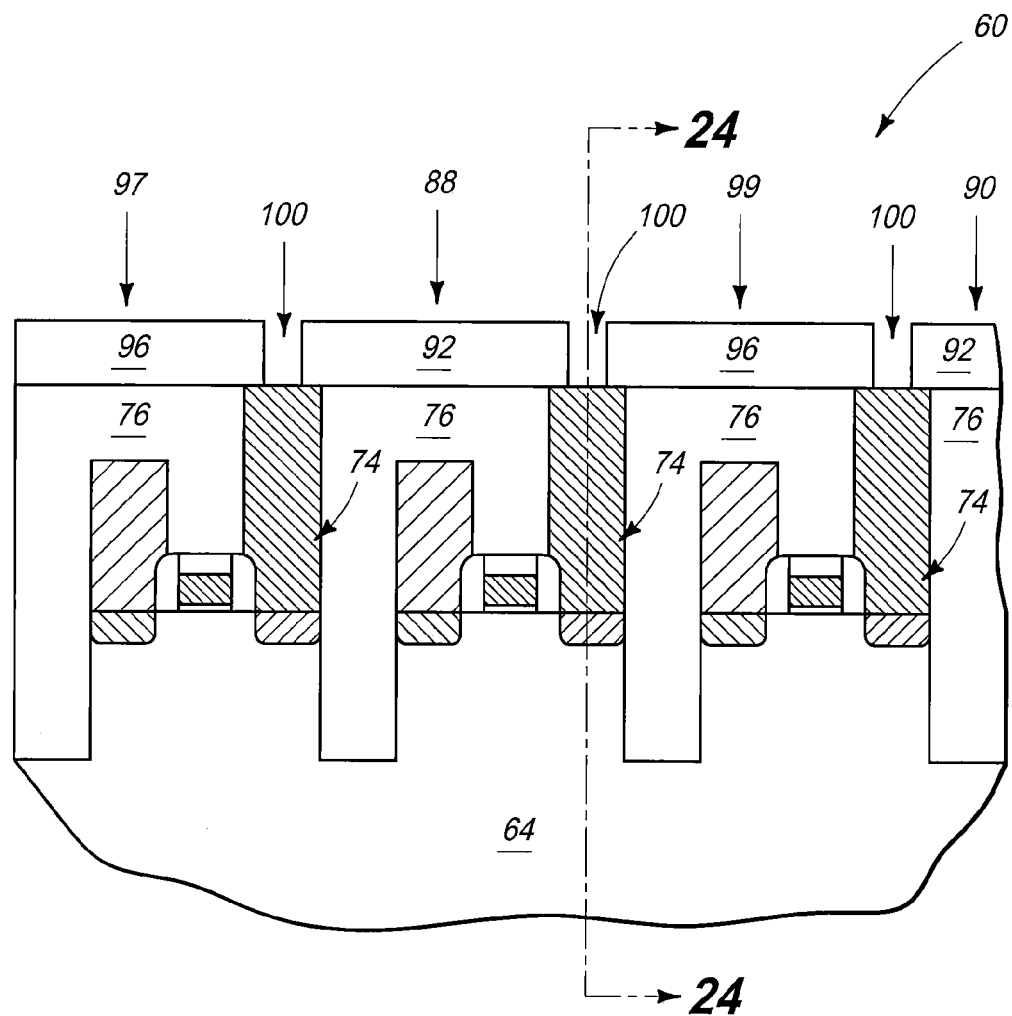
Figure 24:
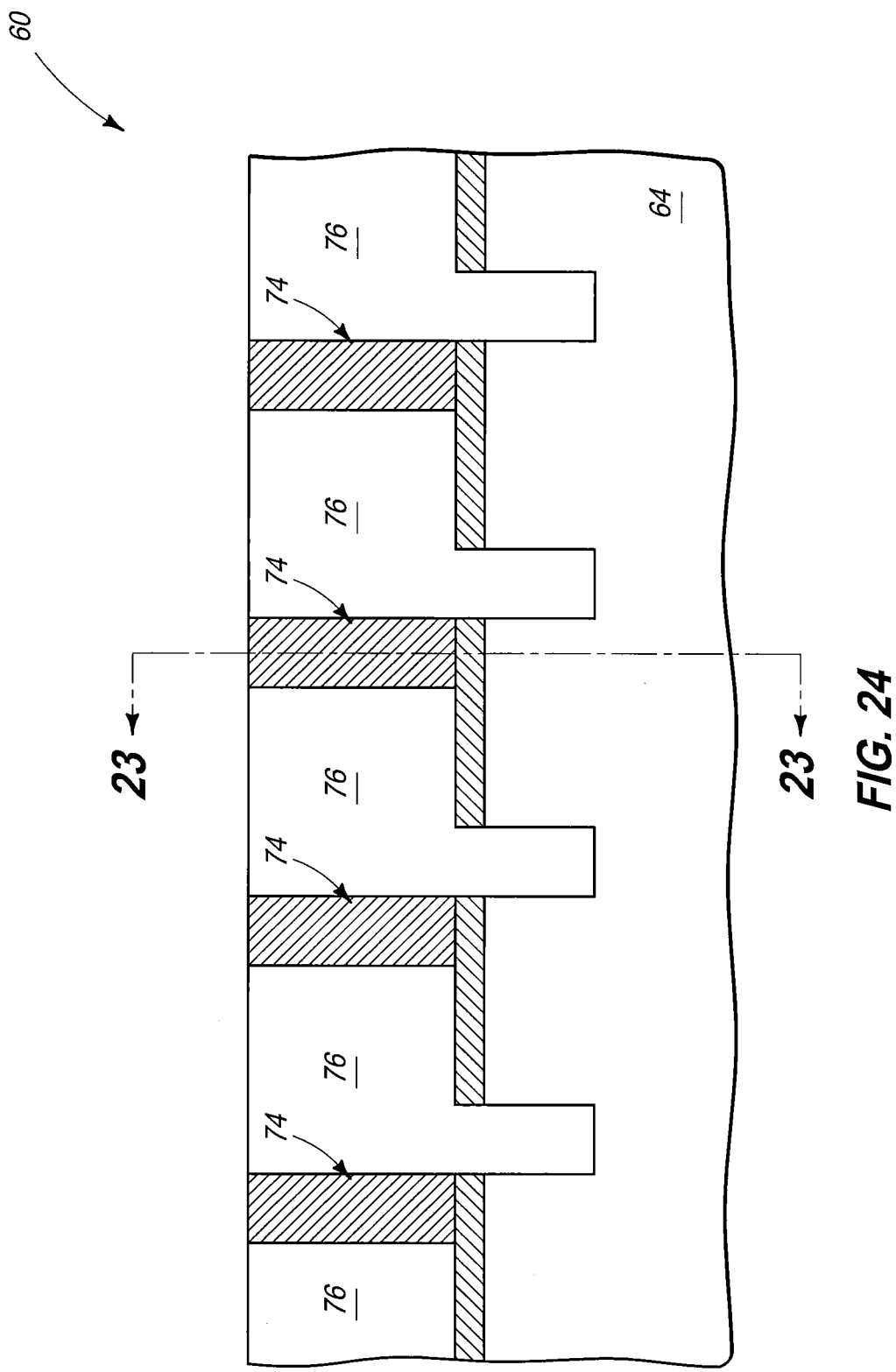

Referring to FIGS. 22-24, material 94 (FIGS. 19-21) is selectively removed relative to materials 92 and 96 to form gaps 100 between the blocks 97, 88, 99 and 90. For purposes of interpreting this disclosure and the claims that follow, a first material is considered to be selectively removed relative to a second material if the first material is removed at a faster rate than the second material; which can include, but is not limited to, processes which are 100 percent selective for the first material relative to the second material. In some embodiments, material 94 may comprise low temperature silicon nitride, while materials 92 and 96 comprise silicon dioxide, and the selective removal of material 94 may utilize a wet etch.

The gaps 100 are along the sidewalls 91 and 93 (FIG. 16) of blocks 88 and 90, and the upper surfaces of contacts 74 are exposed within such gaps.

Figure 25:
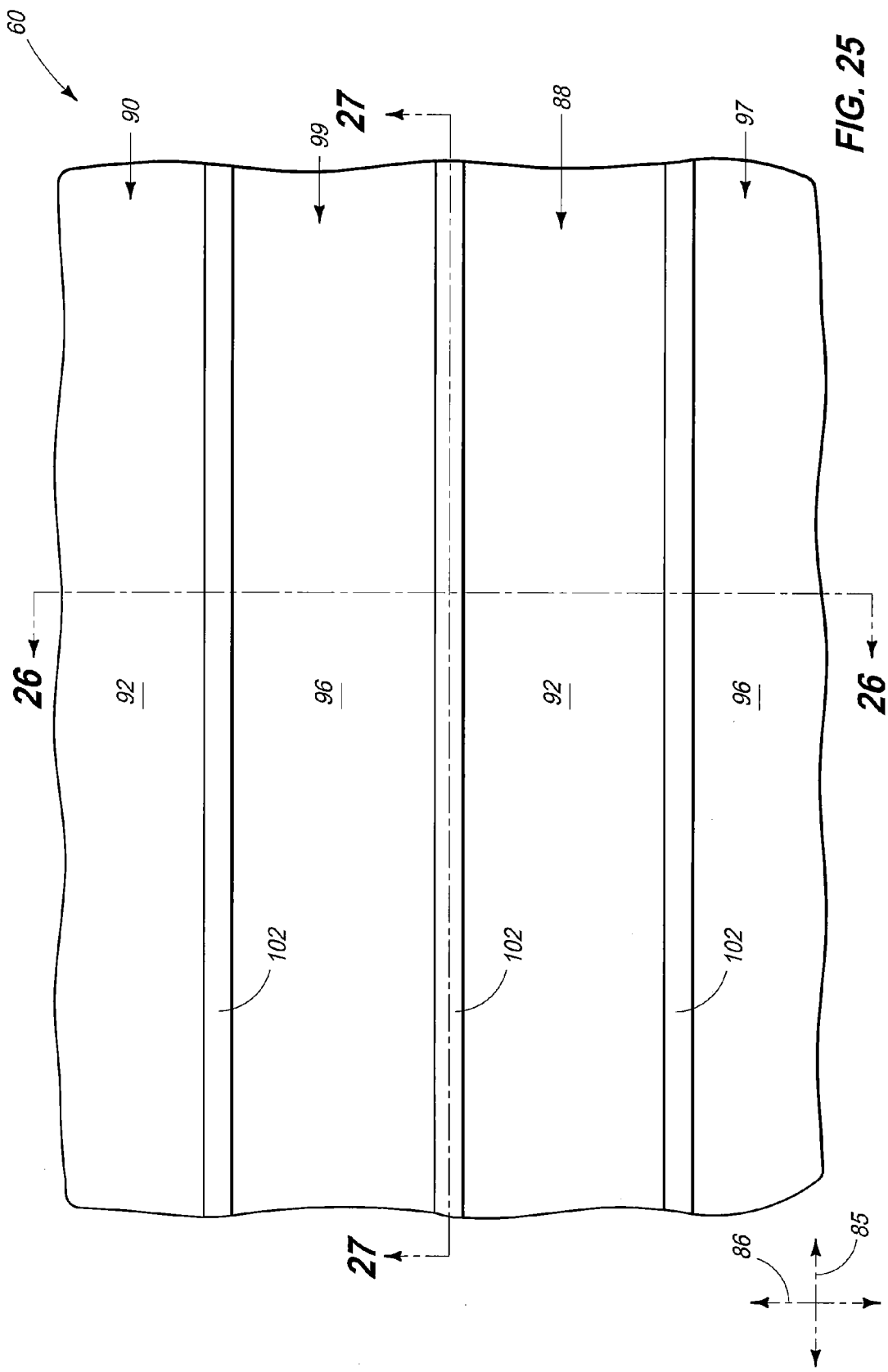
FIGS. 25-27 are a diagrammatic top view, and diagrammatic sectional side views of the semiconductor construction of FIGS. 10-12 at a processing stage subsequent to that of FIGS. 22-24. The cross-sectional side view of FIG. 26 is along the lines 26-26 of FIGS. 25 and 27, and the cross-sectional side view of FIG. 27 is along the lines 27-27 of FIGS. 25 and 26.
Figure 26:
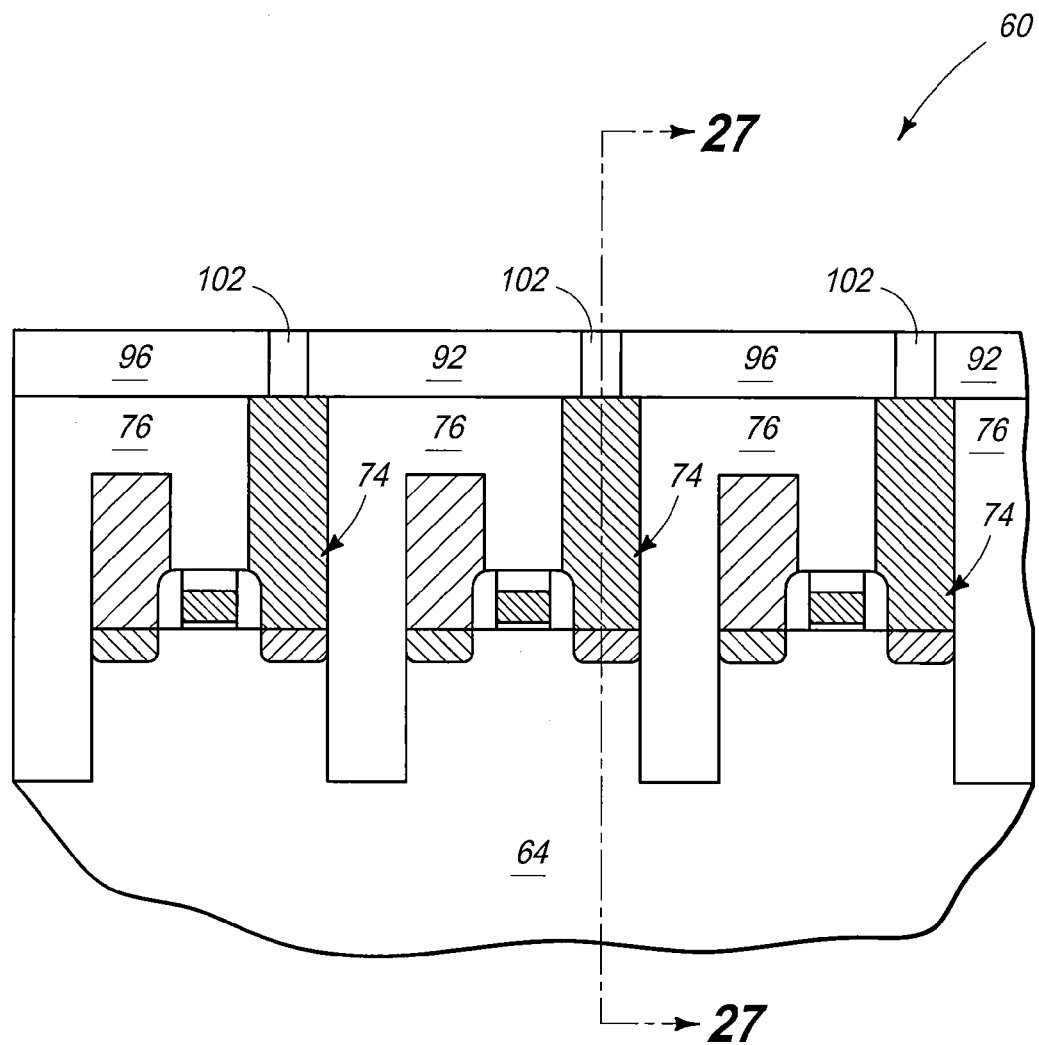
Figure 27:
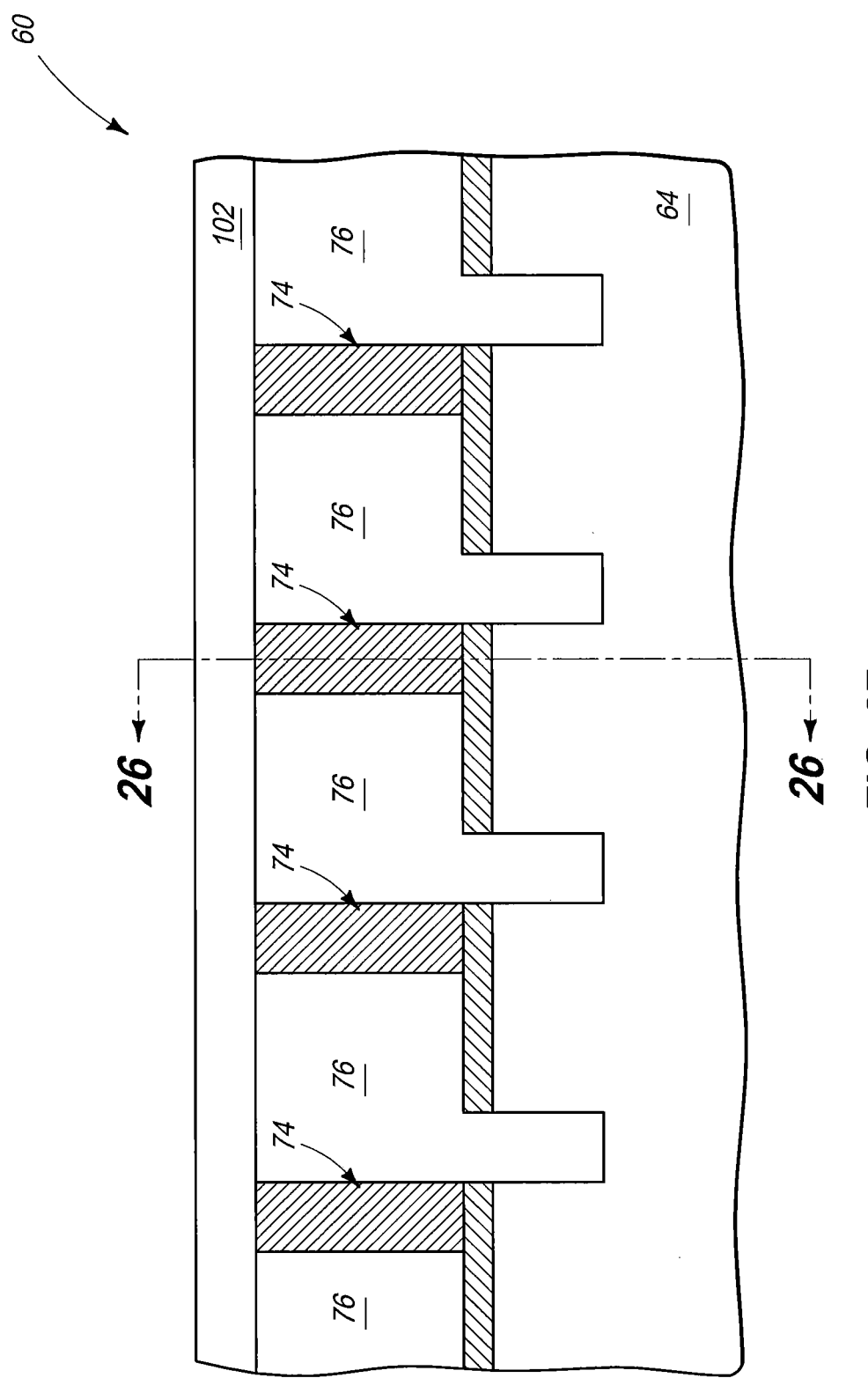

Referring to FIGS. 25-27, the gaps 100 (FIGS. 22-24) are filled with programmable material 102. The programmable material may comprise phase change material; and in some embodiments may comprise chalcogenide. For instance, the programmable material may be a chalcogenide comprising one or more of germanium, antimony and tellurium (such as, for example, $Ge_2Sb_2Te_5$). The programmable material may be initially formed over blocks 97, 88, 99 and 90, as well is within the gaps between the blocks, and may then be removed from over the blocks by planarization (for instance, CMP) to leave the construction shown in FIGS. 25-27. In some embodiments, the programmable material 102 may be considered to be patterned as first programmable material lines that are along the sidewalls 91 and 93 (FIG. 16) of blocks 88 and 90.

In the shown embodiment, the programmable material is directly against upper surfaces of contacts 74. The contacts may correspond to bottom electrodes in such embodiments, and the programmable material 102 may correspond to a first programmable material plate supported edgewise over the bottom electrodes.

Figure 28:
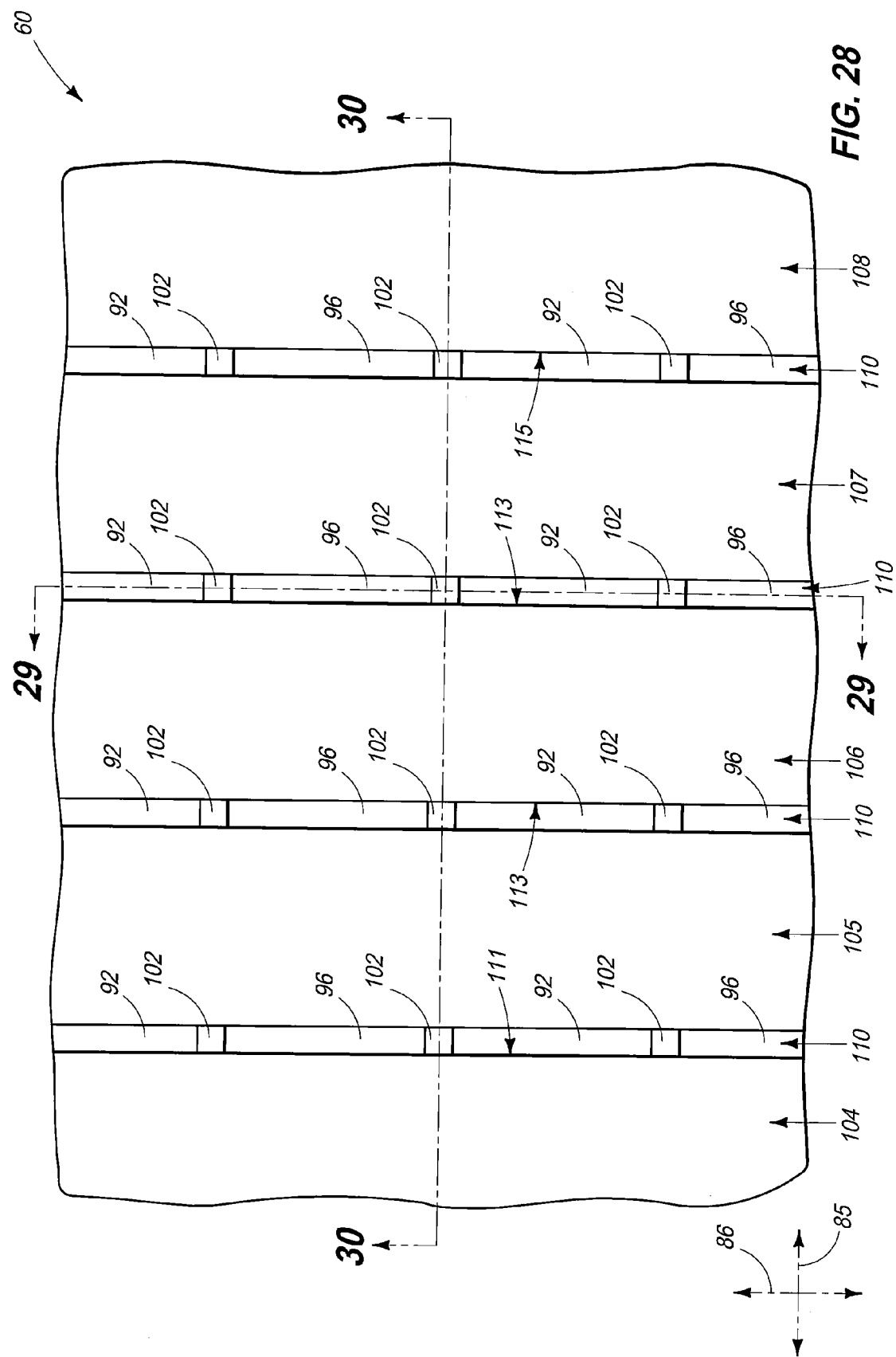
FIGS. 28-30 are a diagrammatic top view, and diagrammatic sectional side views of the semiconductor construction of FIGS. 10-12 at a processing stage subsequent to that of FIGS. 25-27. The cross-sectional side view of FIG. 29 is along the lines 29-29 of FIGS. 28 and 30, and the cross-sectional side view of FIG. 30 is along the lines 30-30 of FIGS. 28 and 29.
Figure 29:
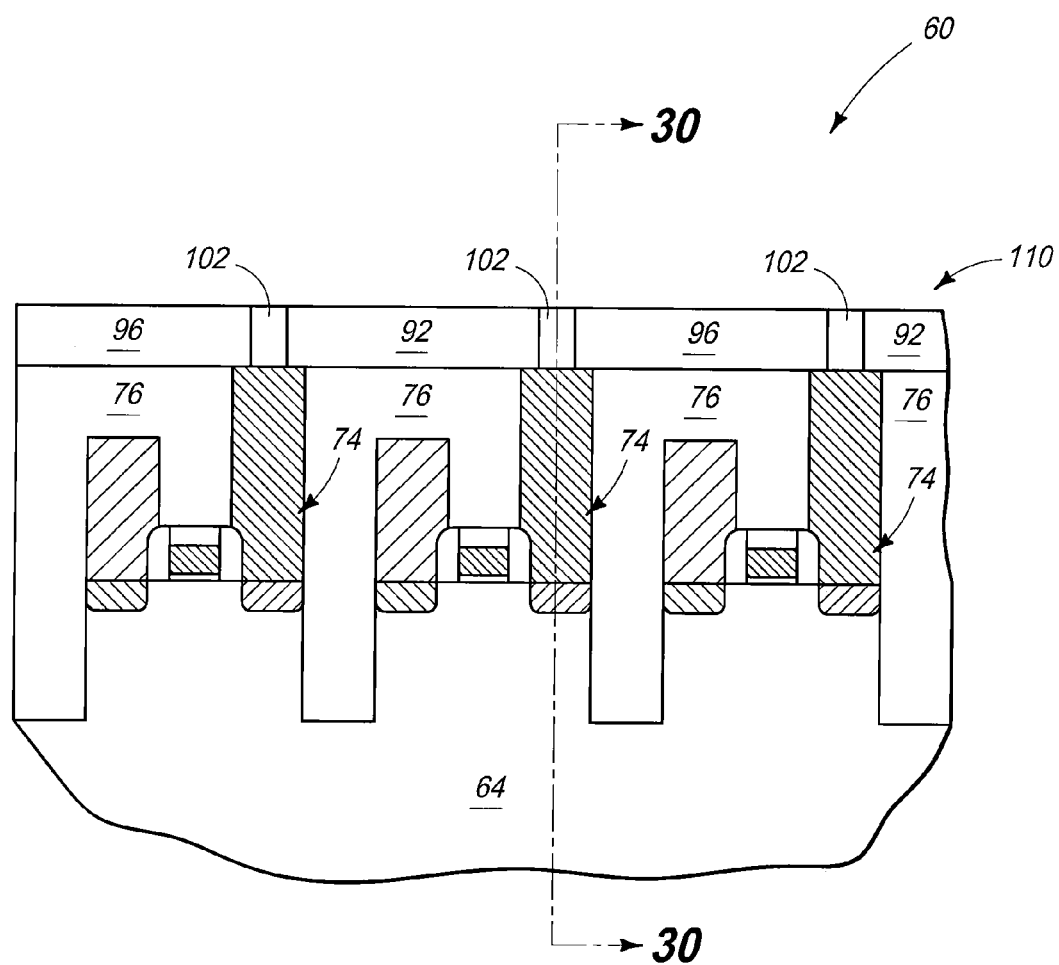
Figure 30:
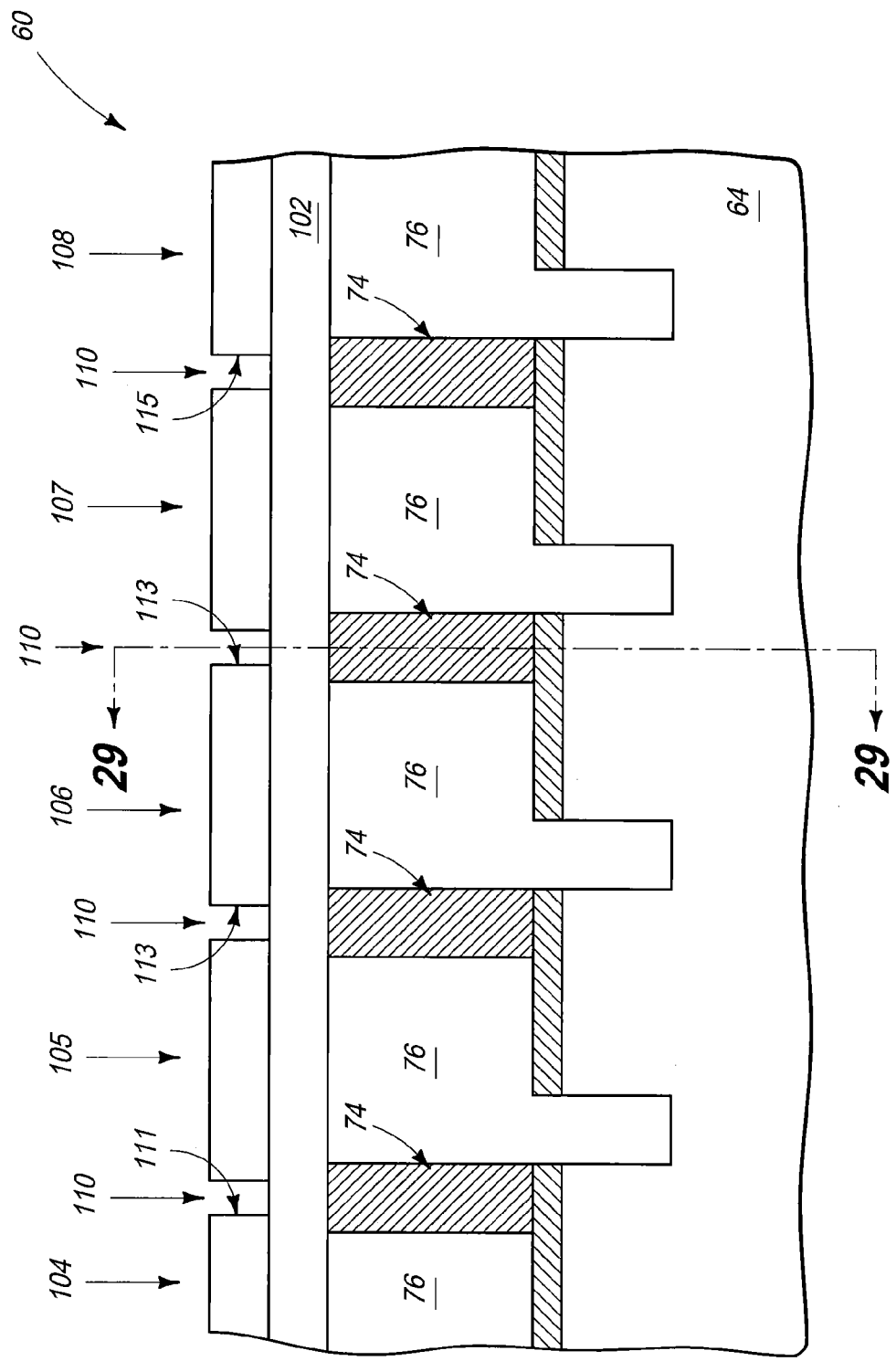

Referring to FIGS. 28-30, blocks 104-108 are formed over the materials 92, 96 and 102, and along the second axis 86. The blocks 104-108 are spaced from one another by gaps 110.

The blocks 104-108 and gaps 110 may be formed utilizing any suitable processing. For instance, blocks 104-108 may be formed utilizing processing analogous to that described above for forming the blocks 97, 88, 99 and 90, and gaps 100, of FIGS. 22-24. Accordingly, in some embodiments blocks 104, 106 and 108 may be initially formed from a material patterned as strips extending orthogonal to the material blocks 88, 90, 97 and 99 (FIG. 25); a layer of sacrificial material (not shown) may be formed along sidewalls of such strips; blocks 105 and 107 may be formed from another material provided within spaces between the blocks 104, 106 and 108; and finally the sacrificial material may be removed to leave the construction of FIGS. 28-30. The sacrificial material utilized during fabrication of gaps 110 may be identical to the sacrificial material 94 described above with reference to FIGS. 16-18, and in some embodiments may be referred to as a second sacrificial material to distinguish it from the first sacrificial material 94.

As another example, the blocks 104-108 may be formed from a single dielectric material provided entirely across an upper surface of the shown construction, and the slots 110 may be formed by etching through such dielectric material while utilizing a photoresist mask to pattern locations of the gaps. The photoresist mask may have been subjected to soaking and/or freezing to reduce a width of the patterned slots to a dimension less than could be achieved with photolithography alone.

The blocks 104, 106 and 108 have edges 111, 113 and 115 that are directly over the bottom electrodes corresponding to contacts 74, as can be seen in FIGS. 28 and 30.

Figure 31:
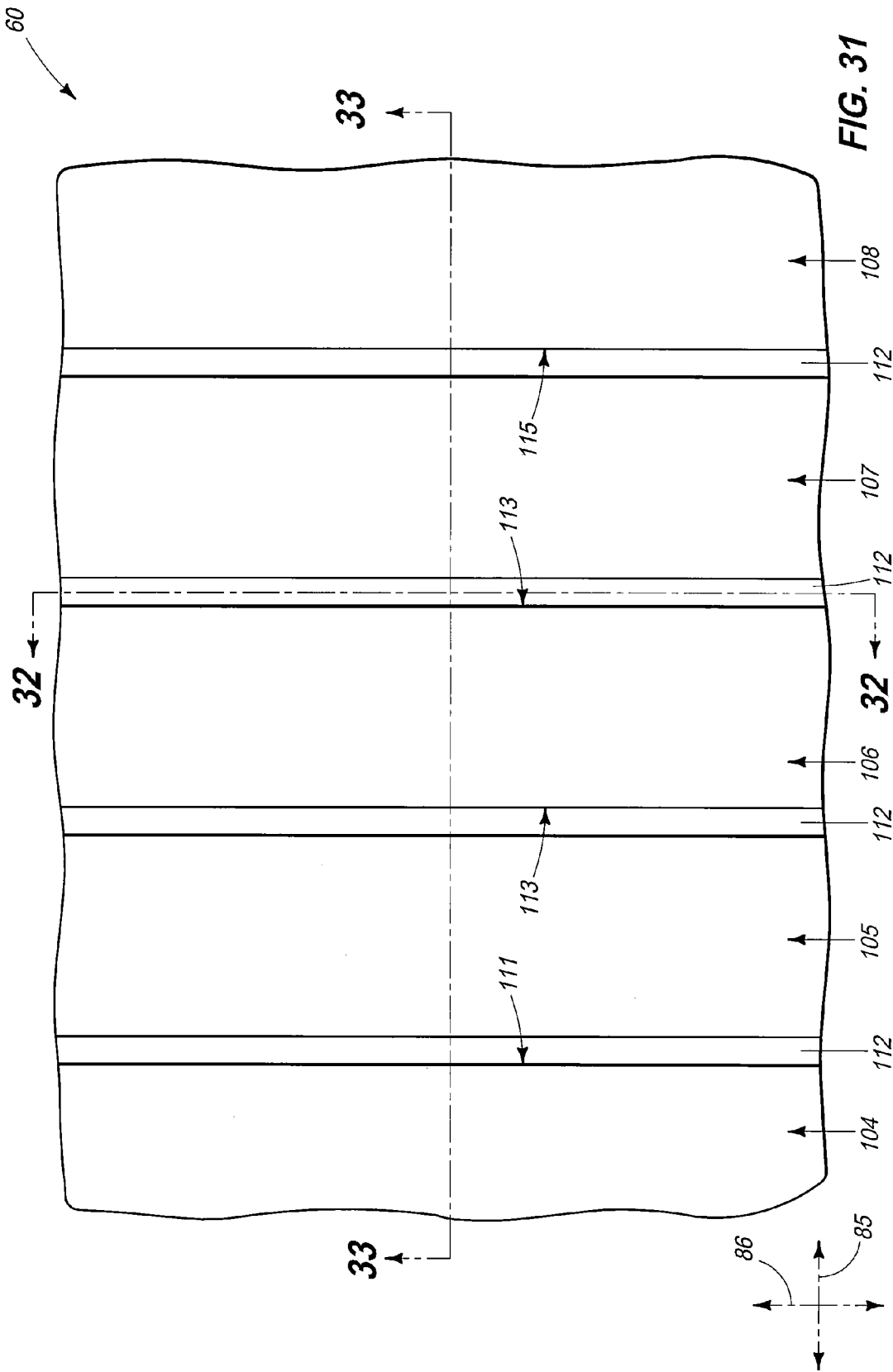
FIGS. 31-33 are a diagrammatic top view, and diagrammatic sectional side views of the semiconductor construction of FIGS. 10-12 at a processing stage subsequent to that of FIGS. 28-30. The cross-sectional side view of FIG. 32 is along the lines 32-32 of FIGS. 31 and 33, and the cross-sectional side view of FIG. 33 is along the lines 33-33 of FIGS. 31 and 32.
Figure 32:
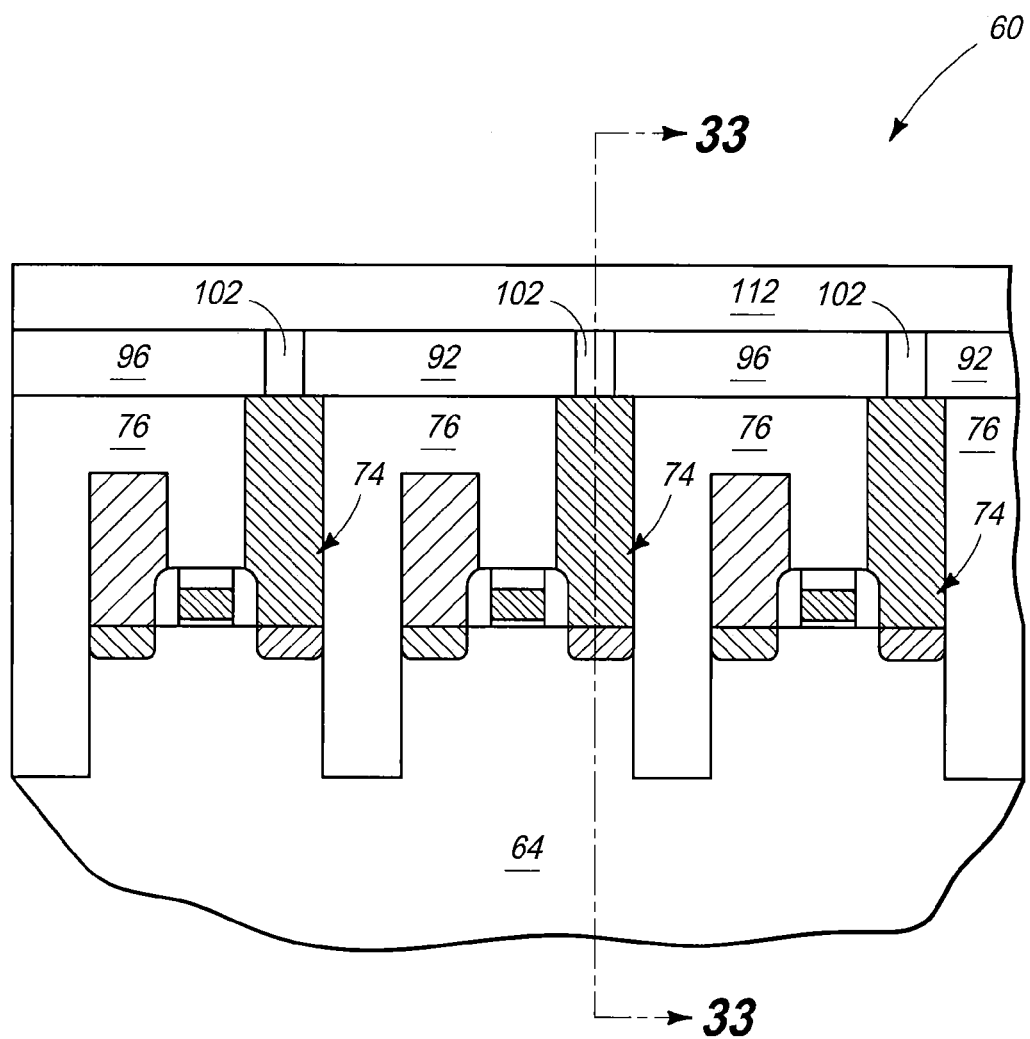
Figure 33:
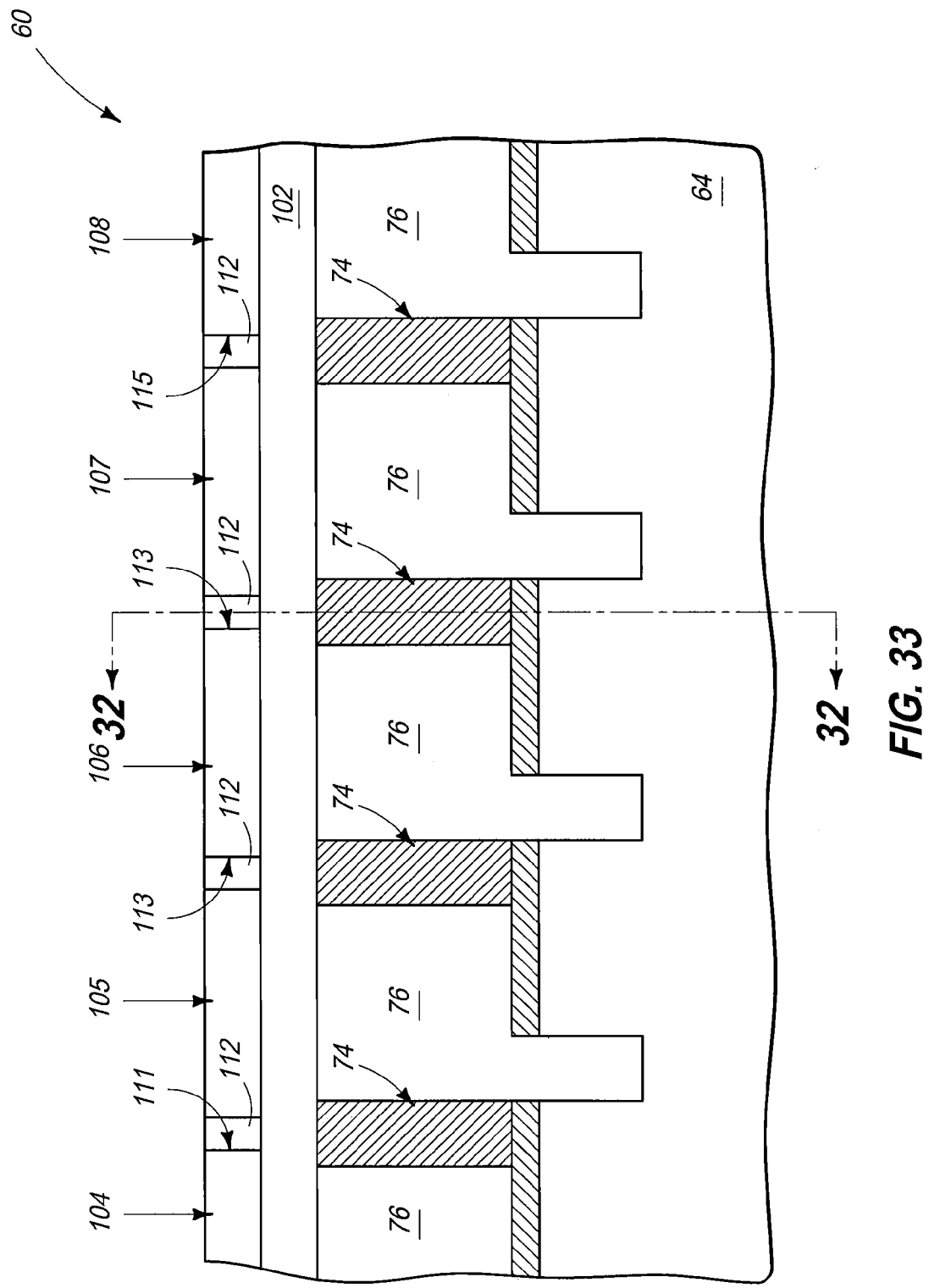

Referring to FIGS. 31-33, programmable material 112 is formed within the gaps 110 (FIGS. 28-30). The programmable material 112 may comprise phase change material; and in some embodiments may comprise chalcogenide. For instance, the programmable material may be a chalcogenide comprising one or more of germanium, antimony and tellurium (such as, for example, $Ge_2Sb_2Te_5$). The programmable material may be initially formed over blocks 104-108, as well is within the gaps between the blocks, and may then be removed from over the blocks by planarization (for instance, CMP) to leave the construction shown in FIGS. 31-33. In some embodiments, the programmable material 112 may be referred to as a second programmable material, to distinguish it from the first programmable material 102. The first and second programmable materials 102 and 112 may comprise the same compositions as one another in some embodiments, and may comprise different compositions from one another in other embodiments.

In some embodiments, the second programmable material 112 may be considered to be patterned as second programmable material lines that are along the sidewalls 111, 113 and 115 of blocks 104, 106 and 108. The second programmable material lines are directly over, and directly against, the lines of the first programmable material 102; and in the shown embodiment extend approximately orthogonally to the lines of the first programmable material.

Figure 34:
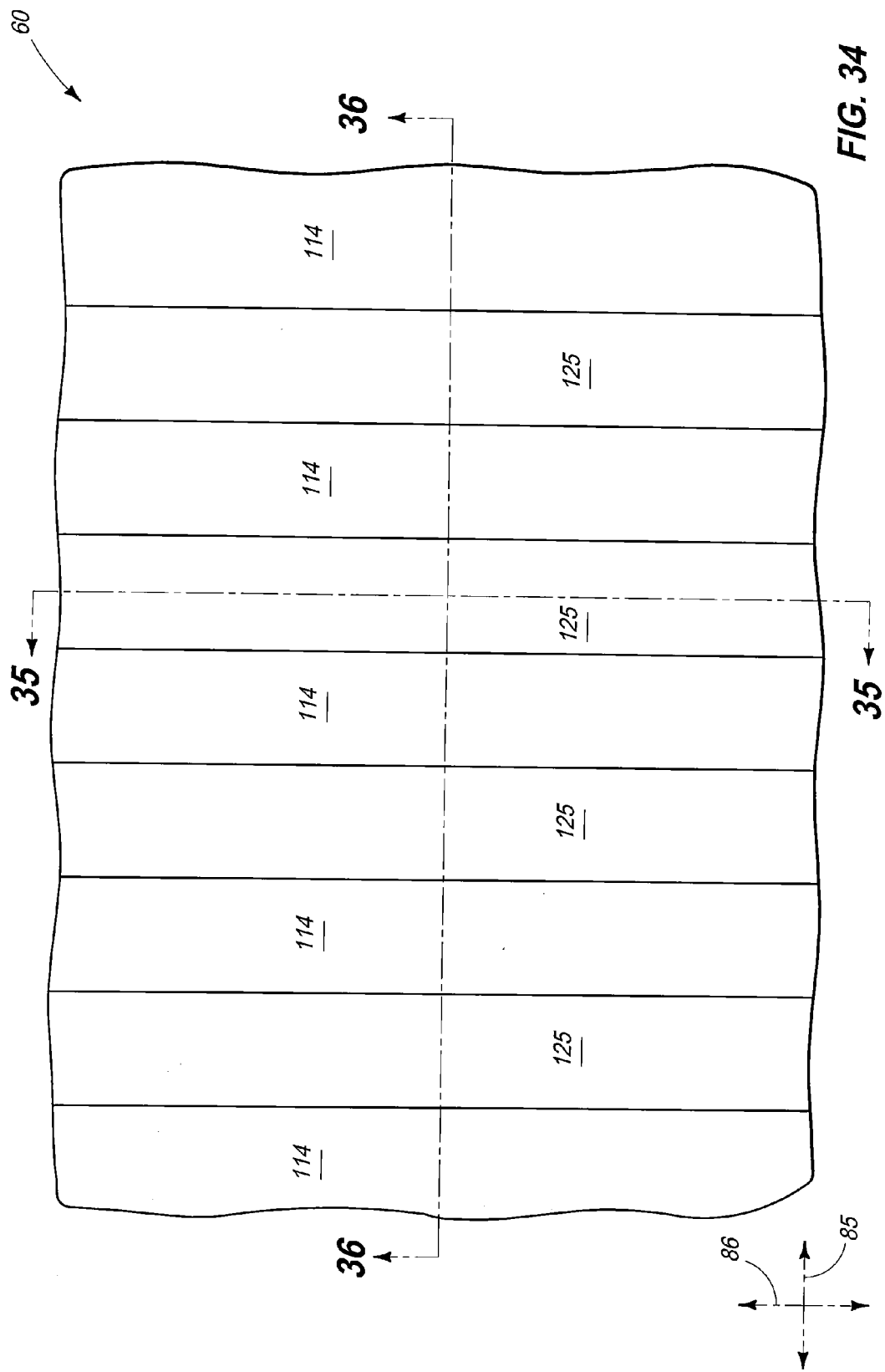
FIGS. 34-36 are a diagrammatic top view, and diagrammatic sectional side views of the semiconductor construction of FIGS. 10-12 at a processing stage subsequent to that of FIGS. 31-33. The cross-sectional side view of FIG. 35 is along the lines 35-35 of FIGS. 34 and 36, and the cross-sectional side view of FIG. 36 is along the lines 36-36 of FIGS. 34 and 35.
Figure 35:
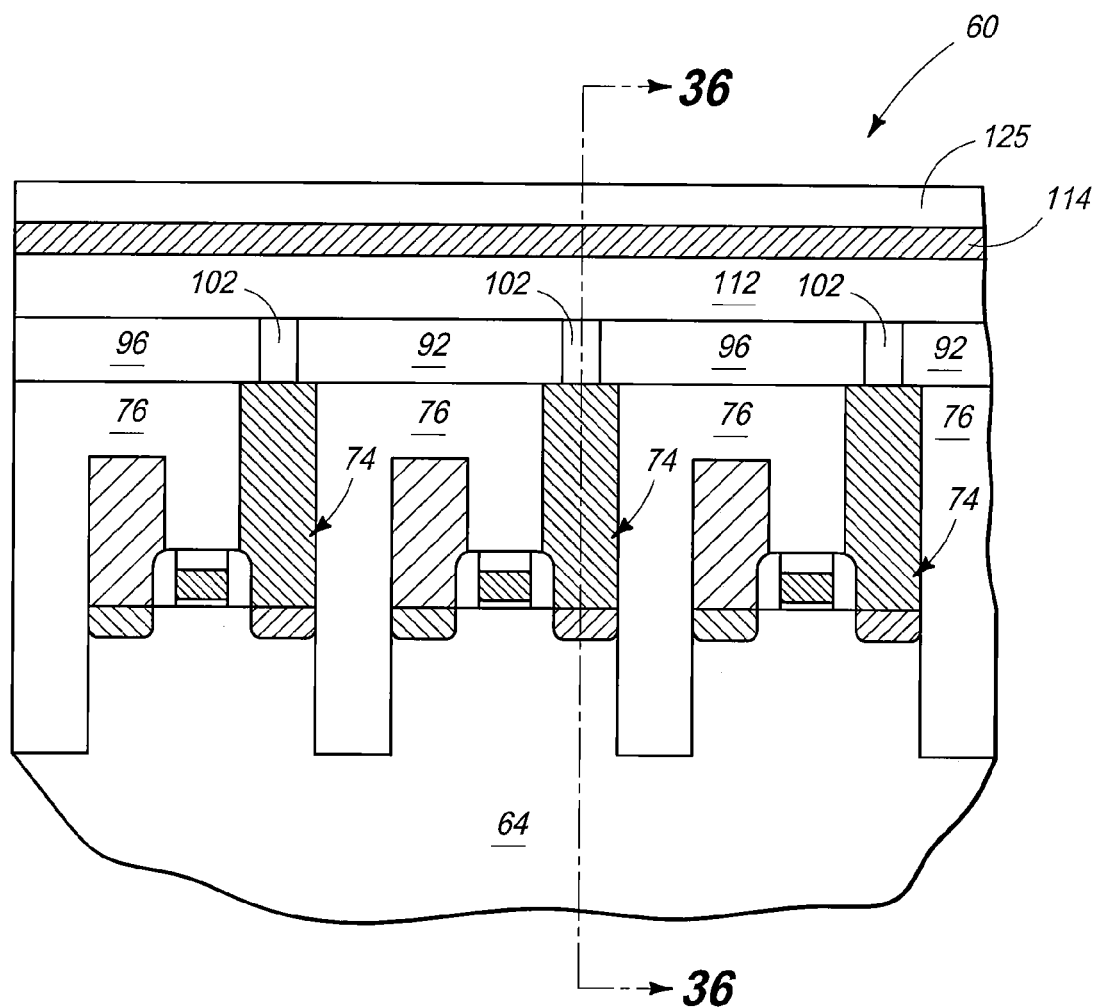
Figure 36:
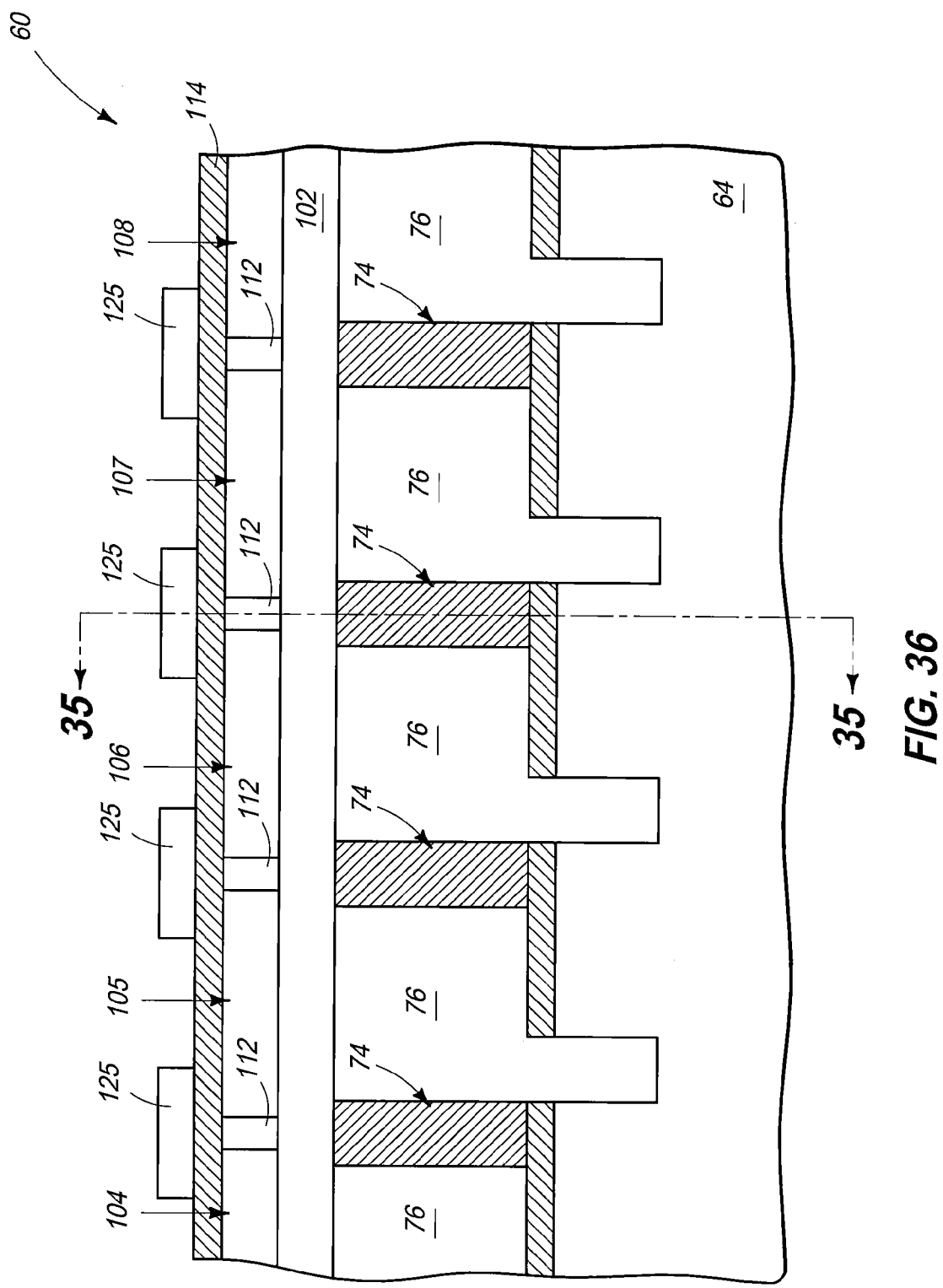

Referring to FIGS. 34-36, top electrode material 114 is provided across the second programmable material 112, and the blocks 104-108. The top electrode material may comprise any suitable composition or combination of compositions, and in some embodiments may comprise one or more of various metals, metal-containing materials, and conductively-doped semiconductor materials. The top electrode material may be formed utilizing any suitable processing, including, for example, one or more of atomic layer deposition (ALD), chemical vapor deposition (CVD), and physical vapor deposition (PVD).

Patterned masking material 125 is formed over the top electrode material. The patterned masking material may comprise, for example, photolithographically-patterned photoresist.

Figure 37:
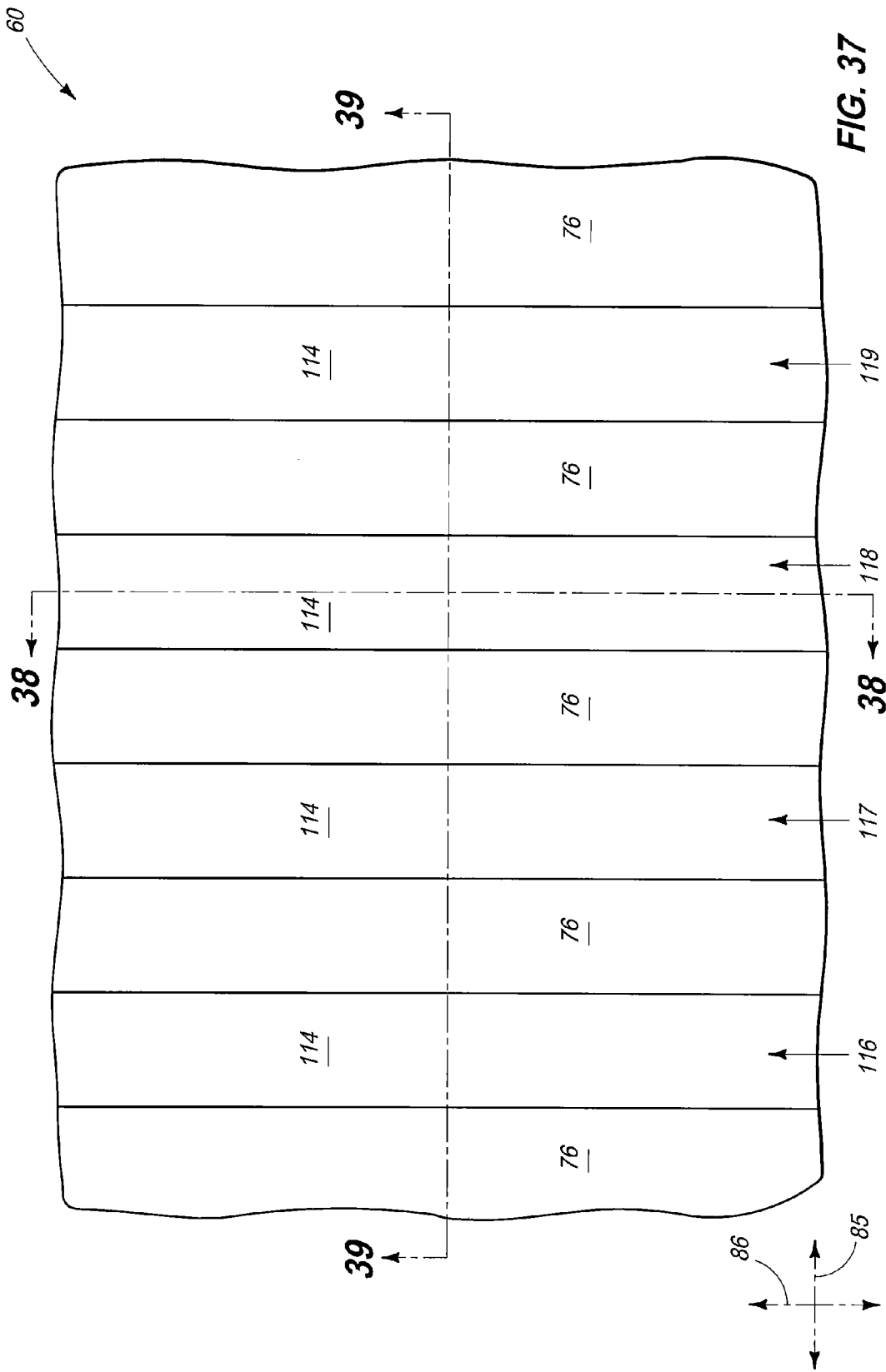
FIGS. 37-39 are a diagrammatic top view, and diagrammatic sectional side views of the semiconductor construction of FIGS. 10-12 at a processing stage subsequent to that of FIGS. 34-36. The cross-sectional side view of FIG. 38 is along the lines 38-38 of FIGS. 37 and 39, and the cross-sectional side view of FIG. 39 is along the lines 39-39 of FIGS. 37 and 38.
Figure 38:
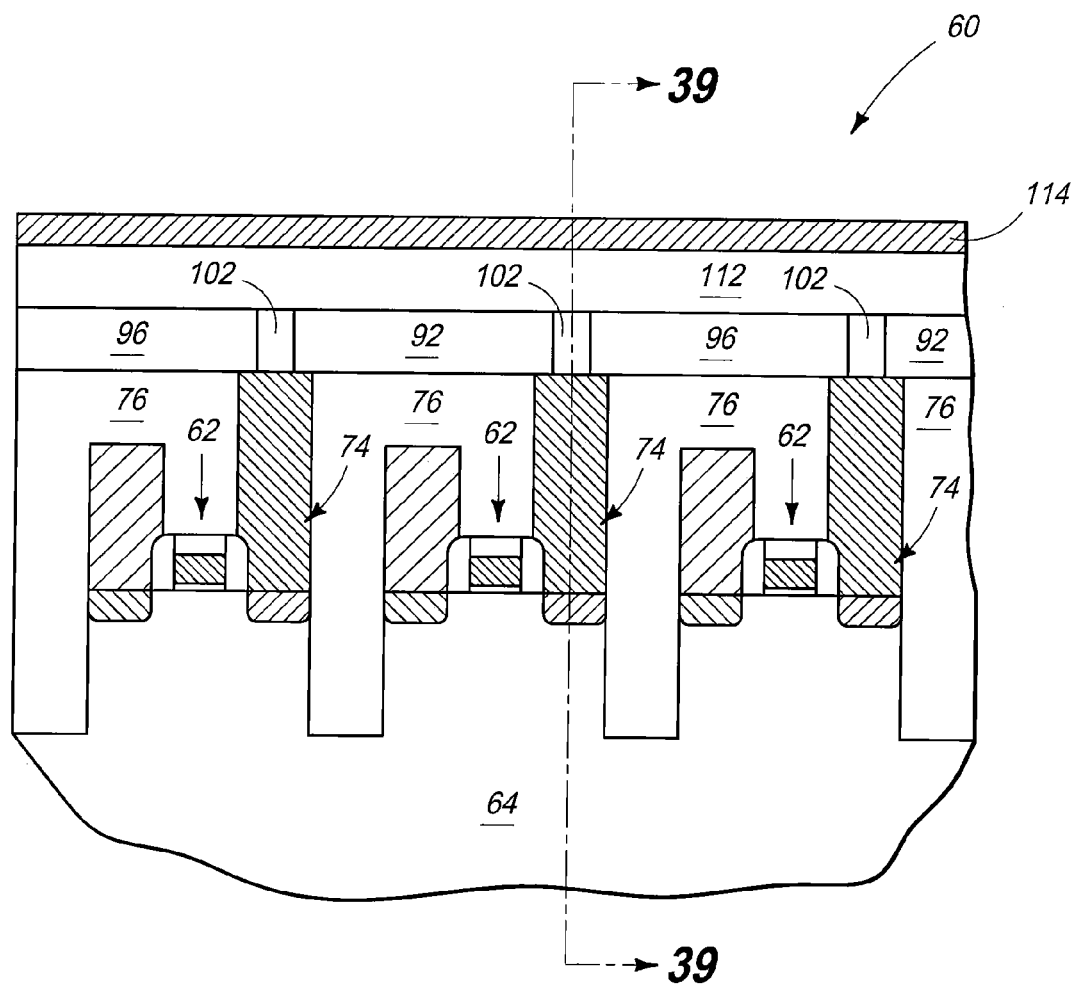
Figure 39:
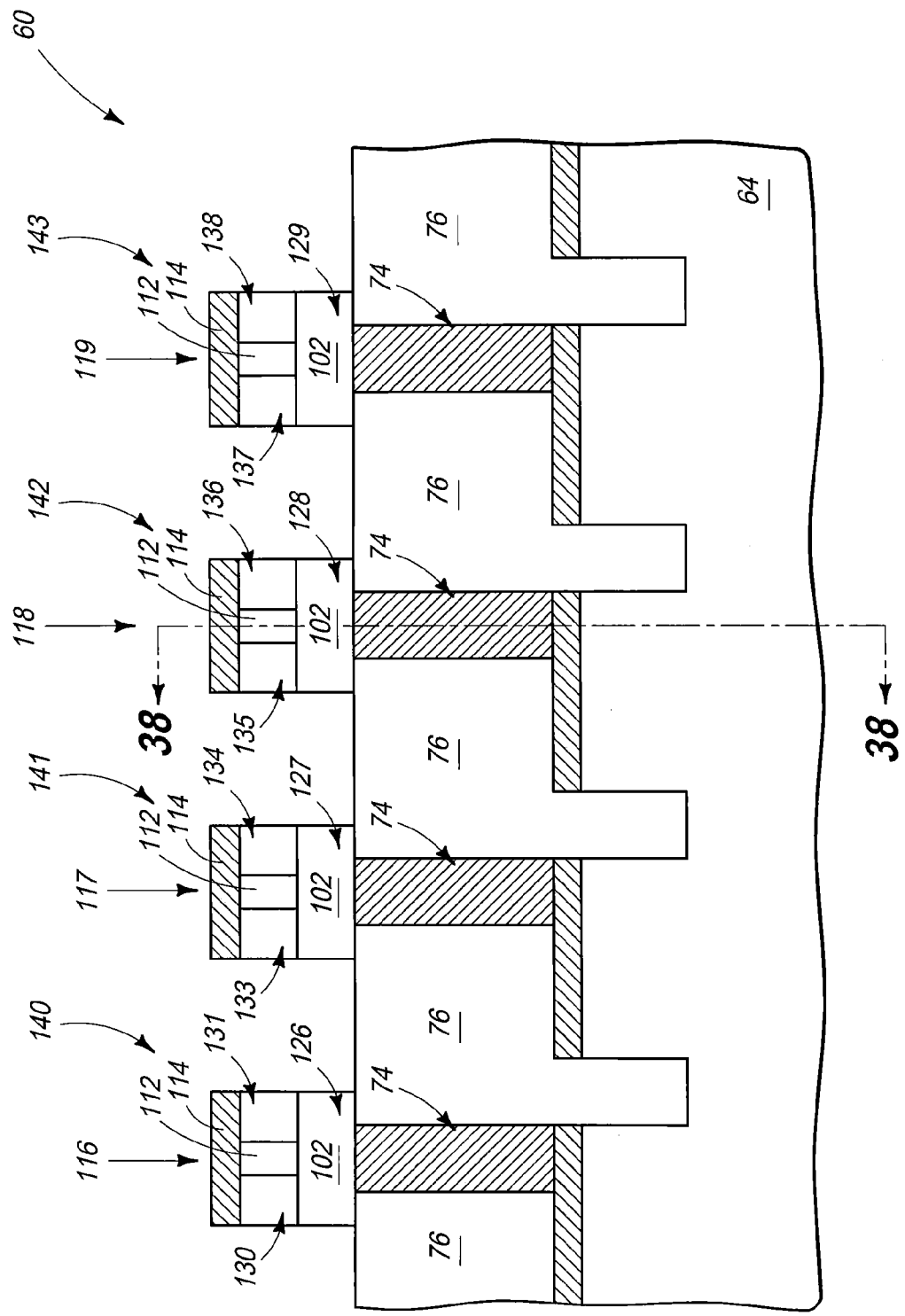

Referring to FIGS. 37-39, one or more etches are utilized to transfer a pattern from the patterned masking material 125 (FIGS. 34-36) through materials beneath the masking material, and to an upper surface of dielectric material 76 (or into material 76 in some embodiments), and then the patterned masking material is removed. Such patterns the top electrode material 114 into lines 116-119, and patterns the programmable material 112 into electrically isolated segments over the contacts 74 (with example segments being shown in FIG. 39 as segments 126-129). Additionally, FIG. 39 illustrates that block 104 (FIG. 31) is patterned into a line 130 under the top electrode line 116; block 105 (FIG. 31) is patterned into a line 131 under the top electrode line 116 and a line 133 under the top electrode line 117; block 106 (FIG. 31) is patterned into a line 134 under the top electrode line 117 and a line 135 under the top electrode line 118; block 107 (FIG. 31) is patterned into a line 136 under the top electrode line 118 and a line 137 under the top electrode line 119; and the block 108 (FIG. 31) is patterned into a line 138 under the top electrode line 119.

The bottom electrodes 74, segments of programmable material 102, lines of programmable material 112, and lines of conductive material 114 together form an array of memory cells; with example memory cells being shown in FIG. 39 as memory cells 140-143. Each memory cell has a first programmable material segment (for instance, the segment 126 within memory cell 140) that has an upper surface extending along a first axis (with such axis being along the cross-section of FIG. 39 in the illustrated embodiment). The adjacent segments of the first programmable material 102 (for instance, adjacent segments 126 and 127) are electrically isolated from one another by a gap in the shown embodiment. In subsequent processing, such gaps may be filled with dielectric material. The individual memory cells may also be considered to comprise segments of the second programmable material 112 that are directly between the top and bottom electrodes. Such segments of the second material extends along a second axis that is in and out of the page relative to the cross-section of FIG. 39. Unlike the segments of the first programmable material 102 that are separated from one another, the segments of the second programmable material 112 are connected to one another, and form lines that extend continuously along the bottom surfaces of the top electrode lines in the shown embodiment.

The individual memory cells are in one-to-one correspondence with the planar field effect transistors 62 (as shown in FIG. 38), and such transistors may be utilized as select devices during programming and/or reading of the individual memory cells.

FIGS. 37-39 illustrate a method of segregating the lines of the first programmable material 102 present at the processing stage of FIGS. 34-36 into electrically isolated segments which comprises cutting such lines into spaced-apart segments. Another method for segregating the lines into electrically isolated segments is to implant dopant within the lines in intervening regions between the desired segments. An example embodiment of such method is described with reference to FIGS. 40 and 41.

Figure 40:
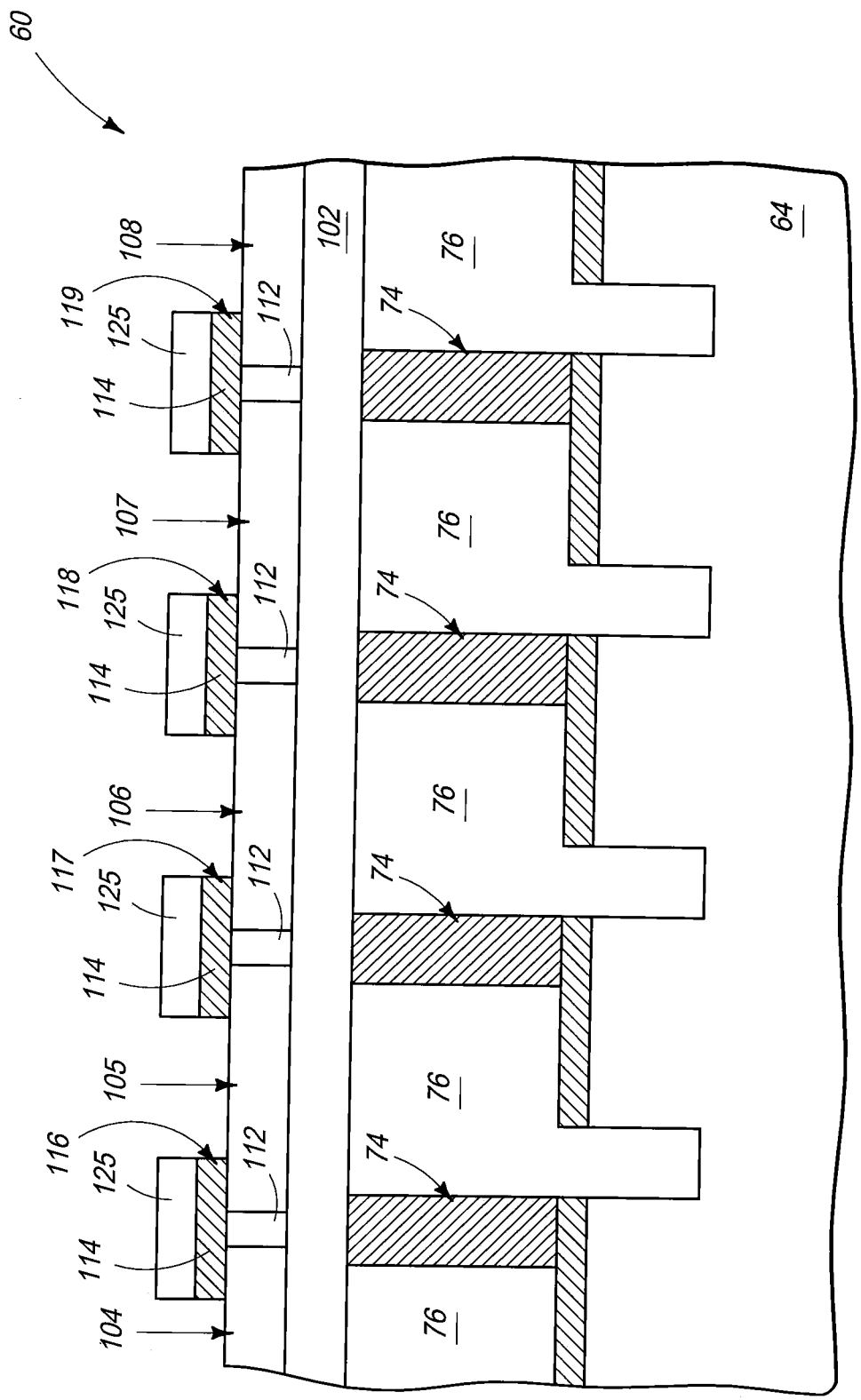
FIGS. 40 and 41 are views along the cross-section of FIG. 36 showing the construction of FIG. 36 at processing stages subsequent to that of FIG. 36 accordance with another example embodiment.

Referring to FIG. 40, a region of construction 60 is shown at a processing stage subsequent to that of FIG. 36. Etching has been conducted to transfer a pattern from the patterned masking material 125 through the top electrode material 114, and to thereby pattern the top electrode material 114 into the lines 116-119. In contrast to the above-discussed processing of FIG. 39, the etching has not been utilized to penetrate through the programmable material 102. The etching has also not been utilized to penetrate through the blocks 104-108; but in other embodiments (not shown) the etching could penetrate through the blocks 104-108 to expose an upper surface of programmable material 102.

Figure 41:
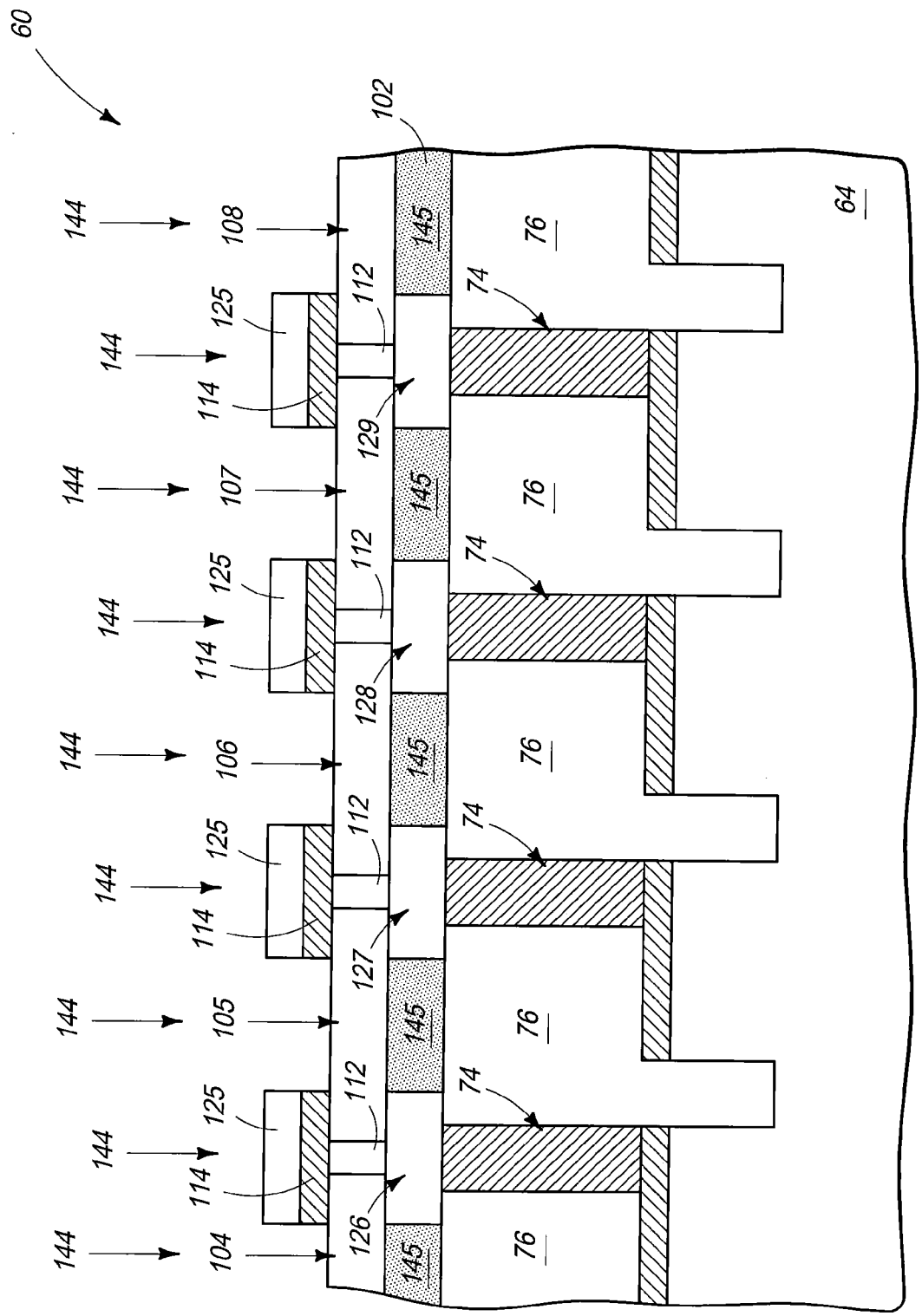

Referring to FIG. 41, dopant 144 is implanted into programmable material 102 while utilizing the patterned materials 114 and 125 as a mask. Such forms doped intervening regions 145 within programmable material 102, with the doped intervening regions being between the memory cell segments 126-129. Such doped intervening regions 145 may electrically isolate memory cell segments 126-129 from one another. Alternatively considered, the doping into the line of programmable material 102 at the processing stage of FIG. 41 segregates such line into the memory cell segments 126-129, and into the doped intervening regions 145 between such memory cell segments.

Dopant 144 may comprise any suitable dopant which increases electrically insulative properties of programmable material 102. Different dopants may be desired for different compositions of programmable material 102, and persons of ordinary skill in the art can choose the appropriate dopant for the particular programmable material 102 being utilized.

The embodiment of FIG. 41 shows the dopant 144 being implanted through blocks 104-108. In other embodiments, the blocks may be patterned during the patterning of conductive material 114, so that the dopant may be implanted directly into material 102, rather than through such blocks.

The above-described processing of FIG. 22 forms narrow trenches (or gaps) 100 which may be subsequently utilized for patterning the lines of first programmable material 102 (as shown at the processing stage of FIG. 25). Another method of forming lines of programmable material 102 is described with reference to FIGS. 42 and 43.

Figure 42:
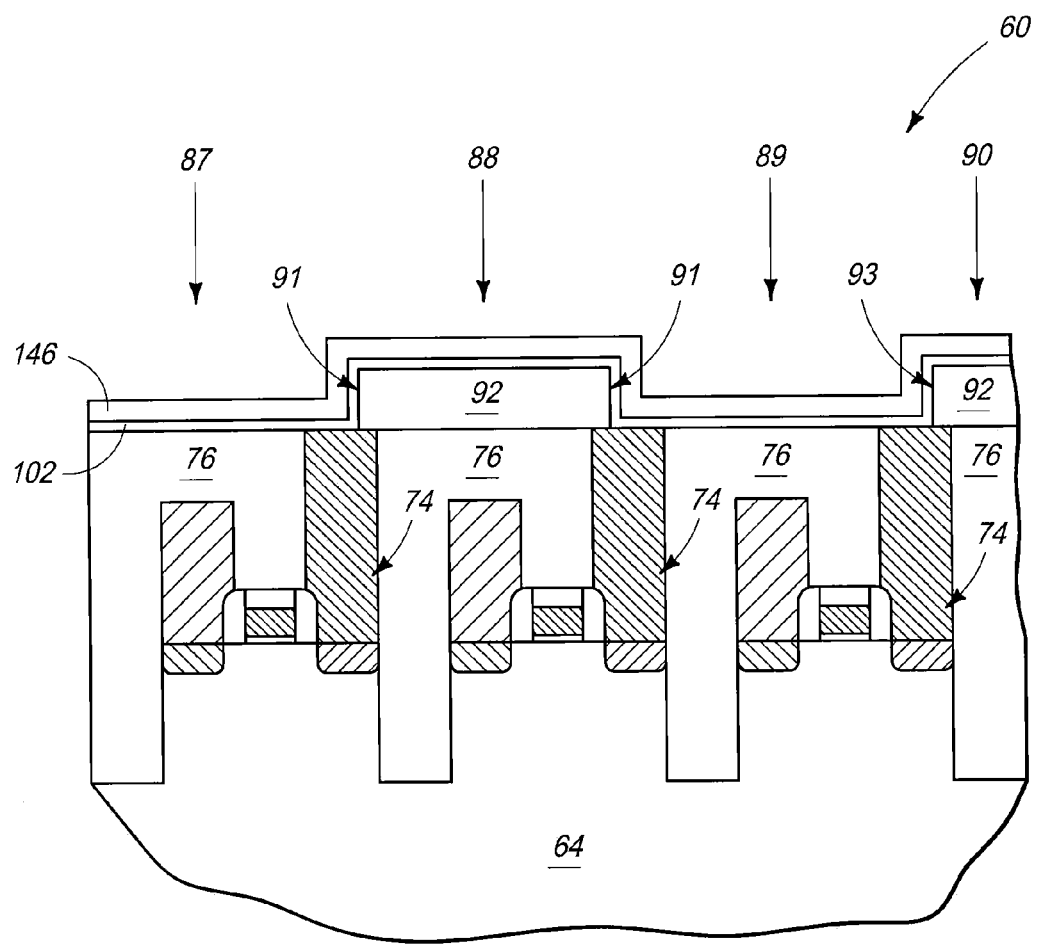
FIGS. 42 and 43 are views along the cross-section of FIG. 14 showing the construction of FIG. 14 at processing stages subsequent to that of FIG. 14 accordance with another example embodiment.

FIG. 42 shows a region of construction 60 at a processing stage subsequent to that of FIG. 14. A layer of first programmable material 102 is deposited to extend over blocks 88 and 90, along the sidewalls 91 and 93 of the blocks, and within the spaces 87 and 89 adjacent the blocks. Such layer may be formed utilizing any suitable processing, including, for example, one or more of ALD, CVD and PVD.

A layer of protective material 146 is deposited over programmable material 102. The protective material is provided to protect material 102 during a subsequent anisotropic etch, and may comprise any suitable composition or combination of compositions. In some embodiments, the protective material may comprise one or both of silicon dioxide and silicon nitride.

Figure 43:
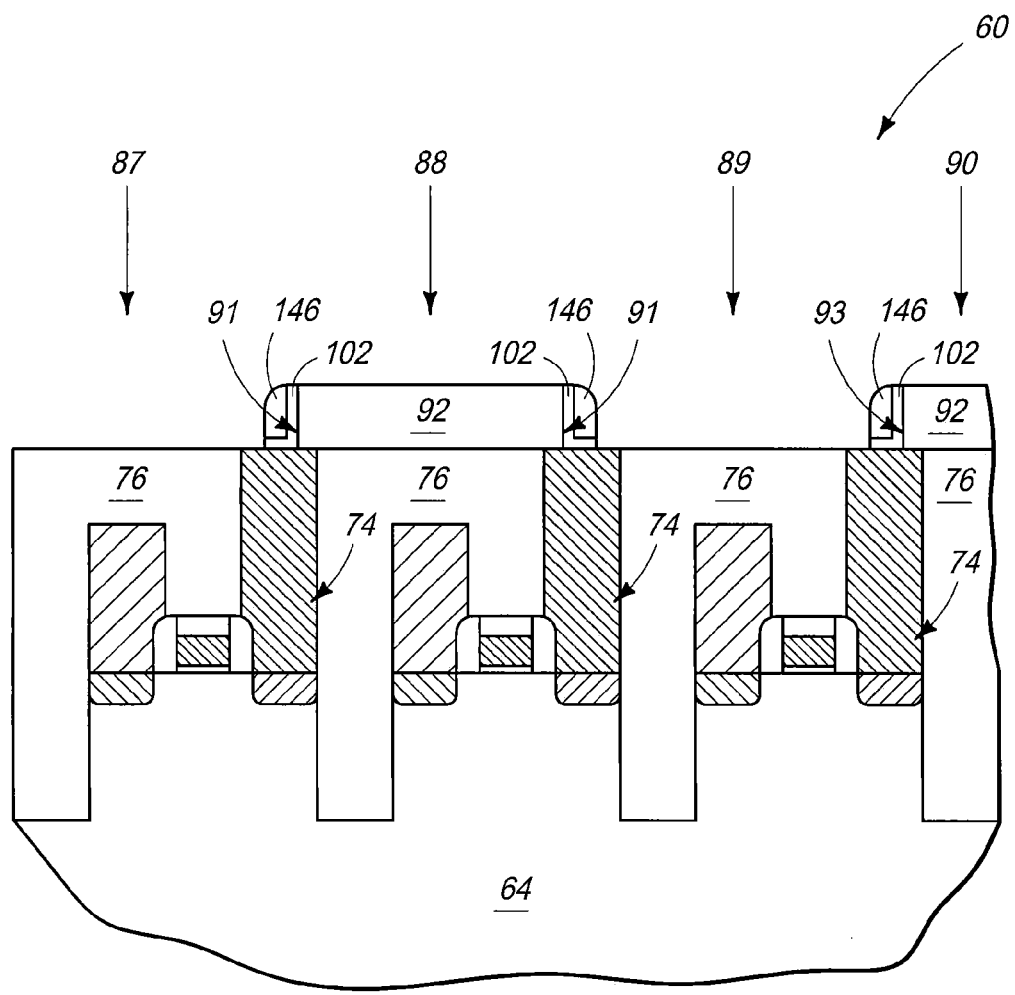

Referring to FIG. 43, materials 102 and 146 are subjected to an anisotropic etch to form lines of the programmable material 102 along the sidewalls 91 and 93 of blocks 88 and 90 (such lines would extend in and out of the page relative to the cross-section of FIG. 40, and would extend linearly along the axis 85 shown in FIG. 13). Subsequent processing analogous to that of FIGS. 28-39 may be utilized to incorporate the programmable material 102 of FIG. 43 into memory cells. Such memory cells may be analogous to those described with reference to FIGS. 37-39. However, whereas the programmable material 102 of the memory cells of FIGS. 37-38 forms plates which are rectangular-shaped along the cross-section of FIG. 38, the programmable material 102 of the embodiment of FIG. 43 forms plates which are "L-shaped" along the same cross-section.

Figure 44:
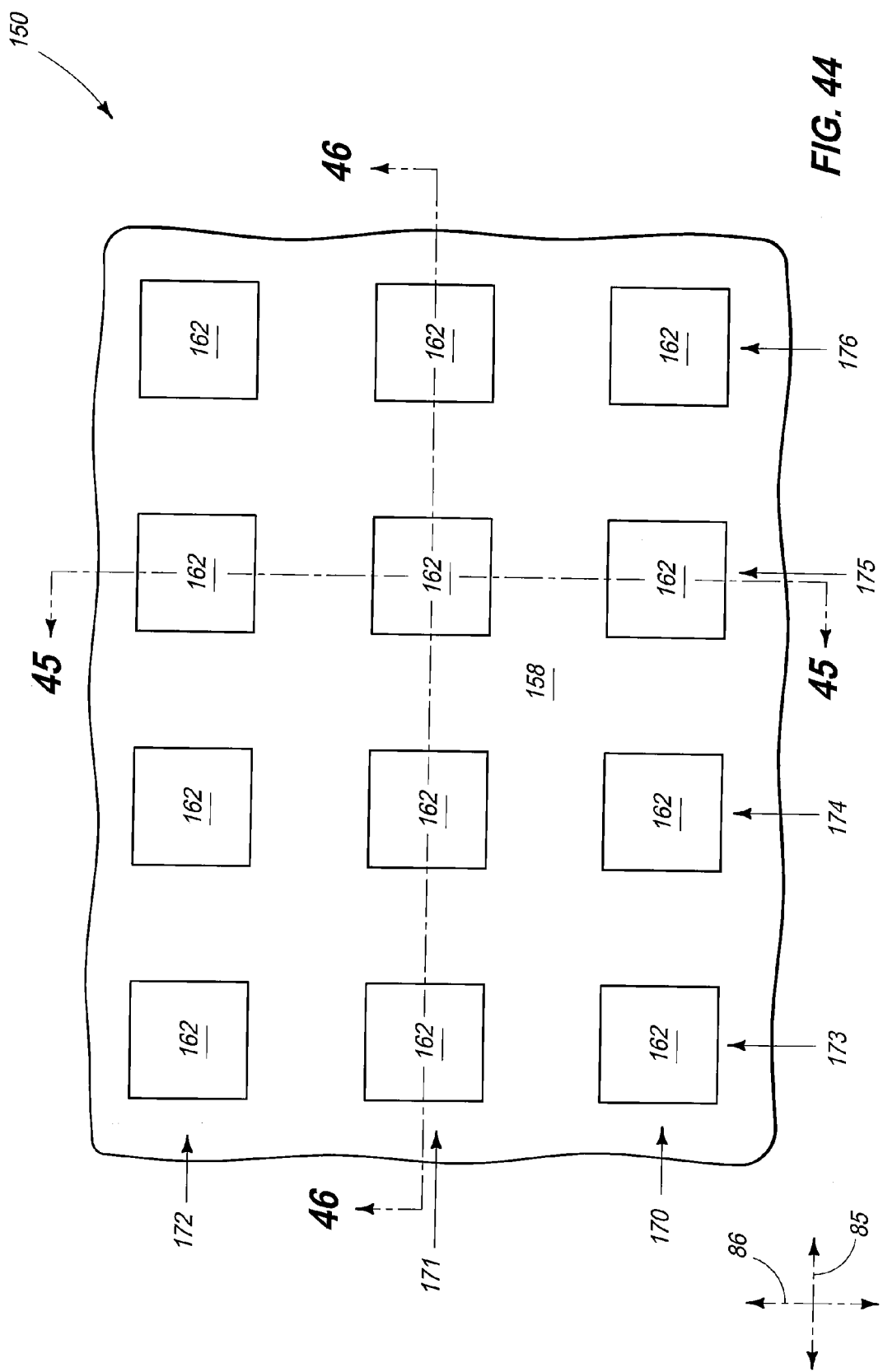
FIGS. 44-46 are a diagrammatic top view, and diagrammatic sectional side views of a semiconductor construction at a processing stage of another example embodiment method of forming a memory array. The cross-sectional side view of FIG. 45 is along the lines 45-45 of FIGS. 44 and 46, and the cross-sectional side view of FIG. 46 is along the lines 46-46 of FIGS. 44 and 45.
Figure 45:
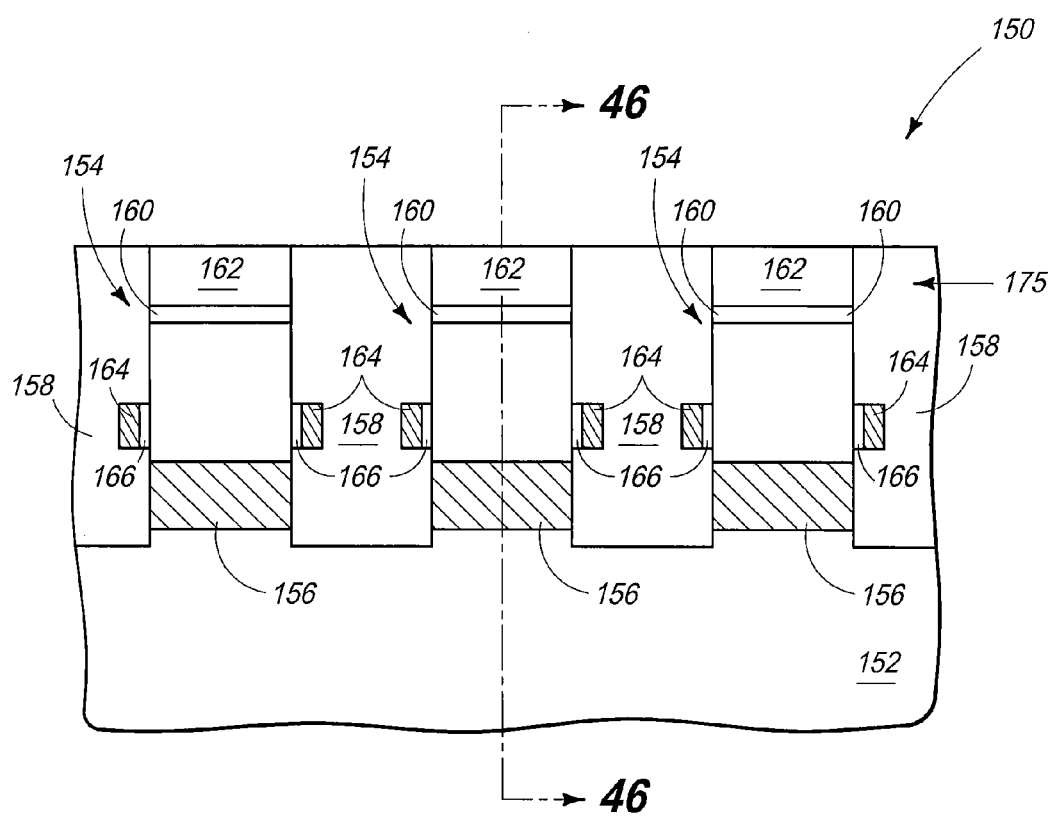
Figure 46:
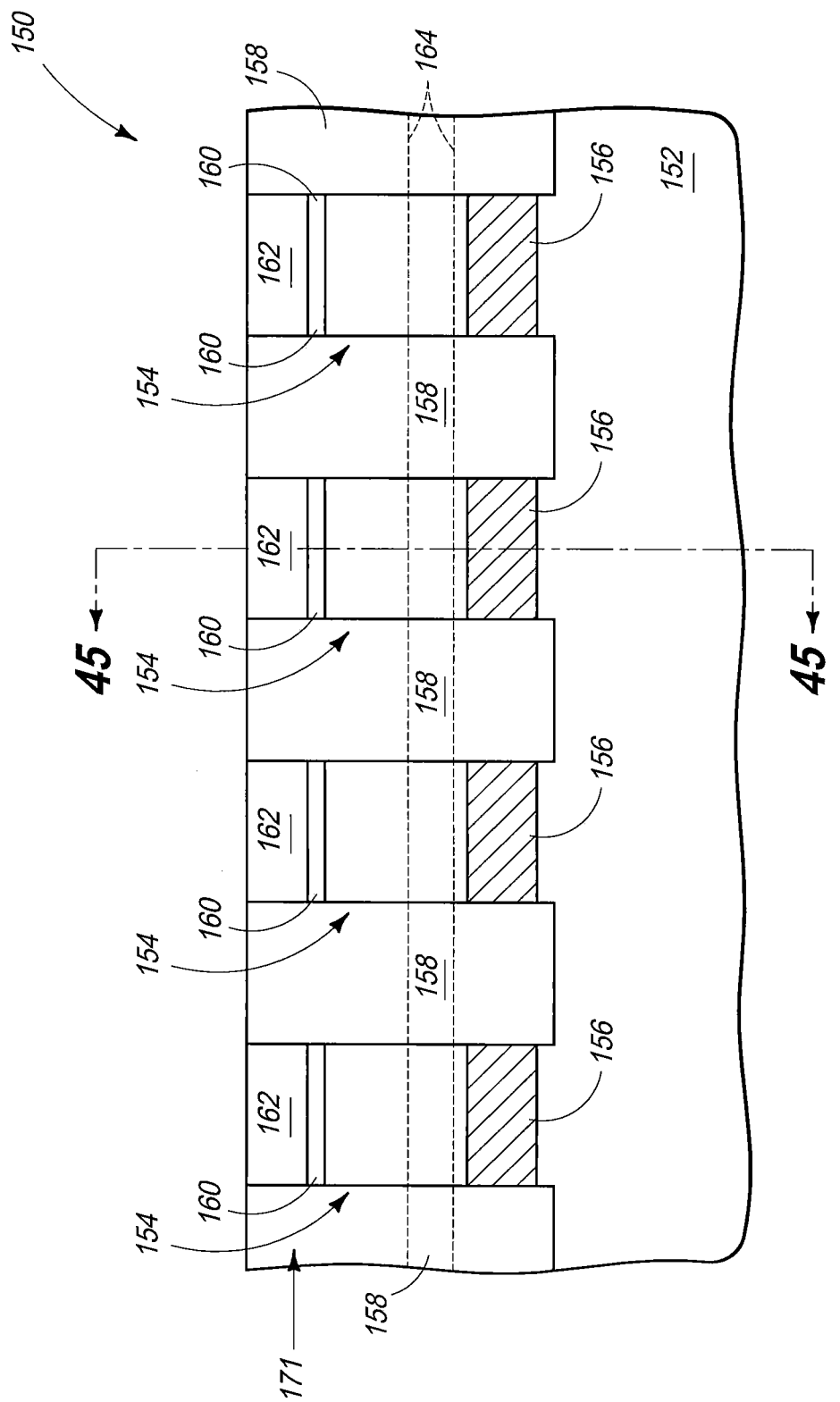

Referring next to FIGS. 44-46, a semiconductor construction 150 is illustrated at a processing stage associated with another example method for fabrication of a memory array. The semiconductor construction includes a plurality of substantially vertical transistor pillars 154 supported by a base 152. The base 152 may comprise monocrystalline silicon, and/or any of the compositions described above relative to base 64 (FIGS. 10-12).

The transistor pillars 154 are referred to as being "substantially vertical" pillars to indicate that they extend substantially orthogonally to a primary upper surface of the base 152. Specifically, the term "vertical" is used herein to define a relative orientation of an element or structure with respect to a major plane or surface of a wafer or substrate. A structure may be referred to as being "substantially vertical" to indicate that the structure is vertical to within reasonable tolerances of fabrication and measurement.

Each transistor pillar comprises semiconductor material extending upwardly from base 152, and comprises a conductively-doped source/drain region 156 within the semiconductor material.

The pillars are spaced-apart from one another, and dielectric material 158 is provided within the spaces between the pillars. The dielectric material may comprise any suitable composition or combination of compositions; and in some embodiments may include one or more of silicon dioxide, silicon nitride and any of various glasses.

The pillars 154 are capped by patterned masking materials 160 and 162. In some embodiments, such patterned masking materials may correspond to pad oxide 160 and silicon nitride 162. The pad oxide material may comprise silicon dioxide. The patterned masking materials may be utilized for patterning the transistor pillars 154 from the semiconductor material of base 152. In some embodiments, the pad oxide may have a thickness of about 95 Å, and the silicon nitride may have a thickness of about 1000 Å.

In the shown embodiment, a planarized surface extends across dielectric material 158 and masking material 162. Such planarized surface may be formed by, for example, CMP.

Although the vertical transistor pillars are shown to be square-shaped along the top-view of FIG. 44, in other embodiments the vertical transistor pillars may have any other suitable shape.

The vertical transistor pillars may be considered to be arranged as an array of rows 170-172 and columns 173-176; with the rows extending along the first axis 85 and the columns extending along the second axis 86. In the shown embodiment, the second axis is approximately orthogonal the first axis. In other embodiments, the first and second axes may intersect at other angles.

FIG. 45 shows access lines (i.e. wordlines) 164 extending along sidewalls of the vertical transistor pillars. Such access lines may comprise any suitable electrically conductive material (for instance, titanium nitride), and may be formed with any suitable processing. The access lines are spaced from semiconductor material of the pillars by gate dielectric 166. Such gate dielectric may comprise any suitable composition (for instance, silicon dioxide), and any suitable configuration. In some embodiments the gate dielectric may extend the full height of the vertical transistor pillars, rather than being a same vertical dimension as the access lines.

An access line 164 is illustrated in dashed-line view in FIG. 46. Such access line would be out of the plane of the cross-section of FIG. 46, but is diagrammatically illustrated to assist the reader in understanding the relative orientation of the access line to the illustrated row of vertical transistor pillars.

Figure 47:
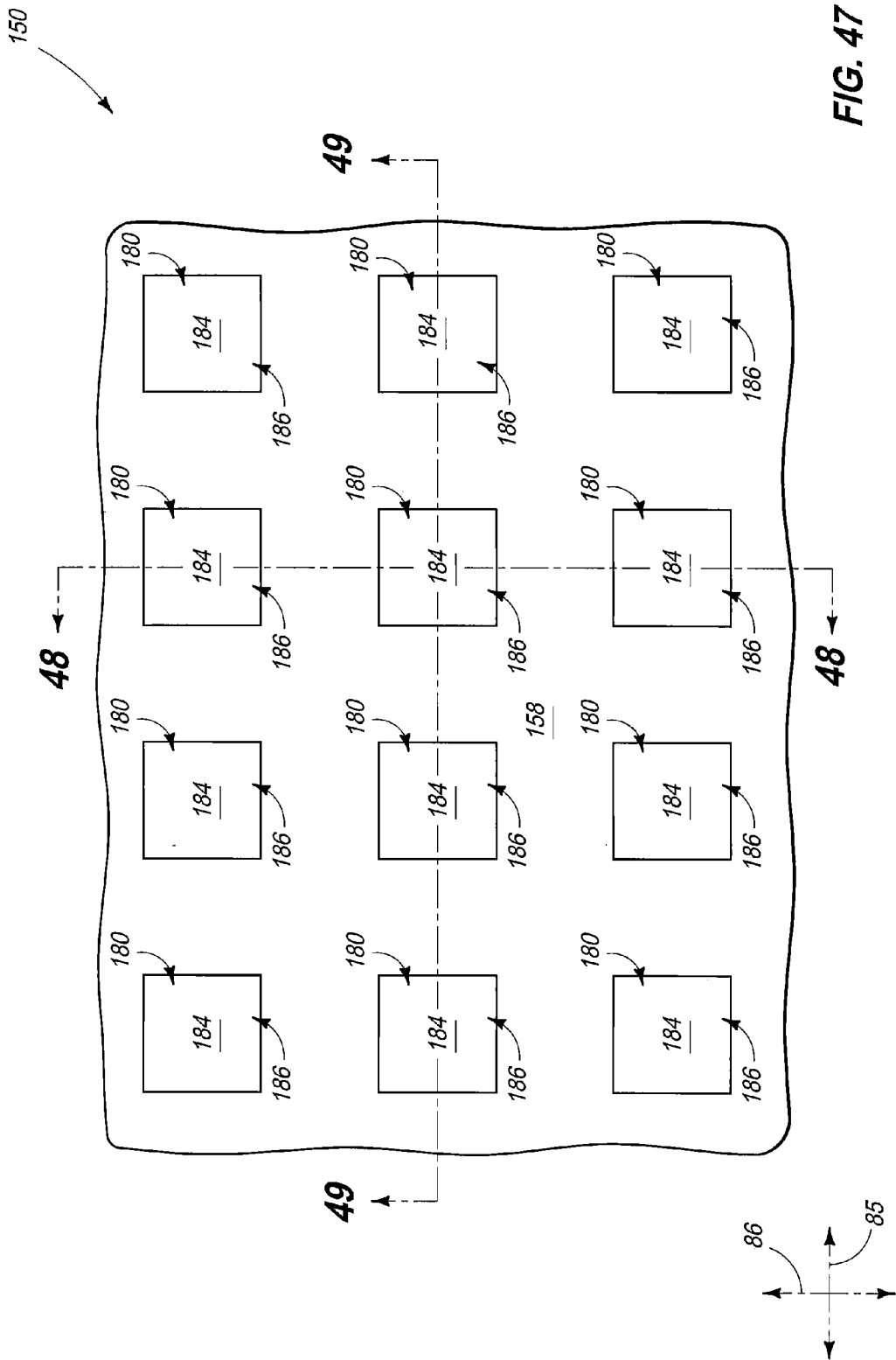
FIGS. 47-49 are a diagrammatic top view, and diagrammatic sectional side views of the semiconductor construction of FIGS. 44-46 at a processing stage subsequent to that of FIGS. 44-46. The cross-sectional side view of FIG. 48 is along the lines 48-48 of FIGS. 47 and 49, and the cross-sectional side view of FIG. 49 is along the lines 49-49 of FIGS. 47 and 48.
Figure 48:
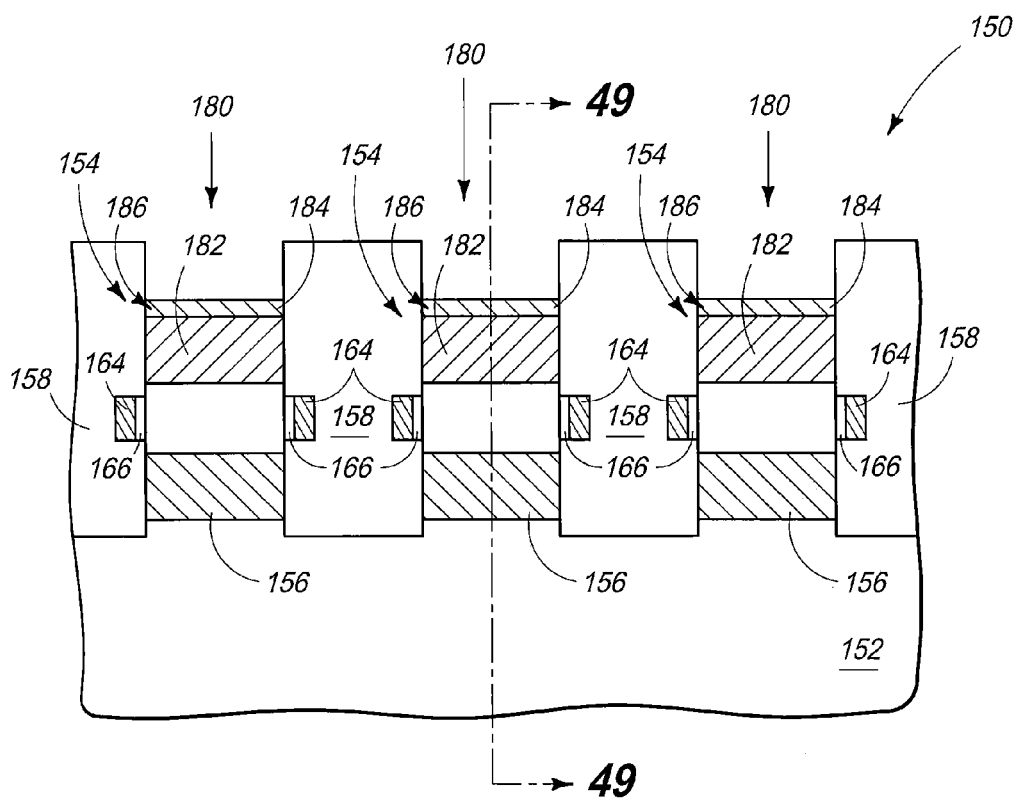
Figure 49:
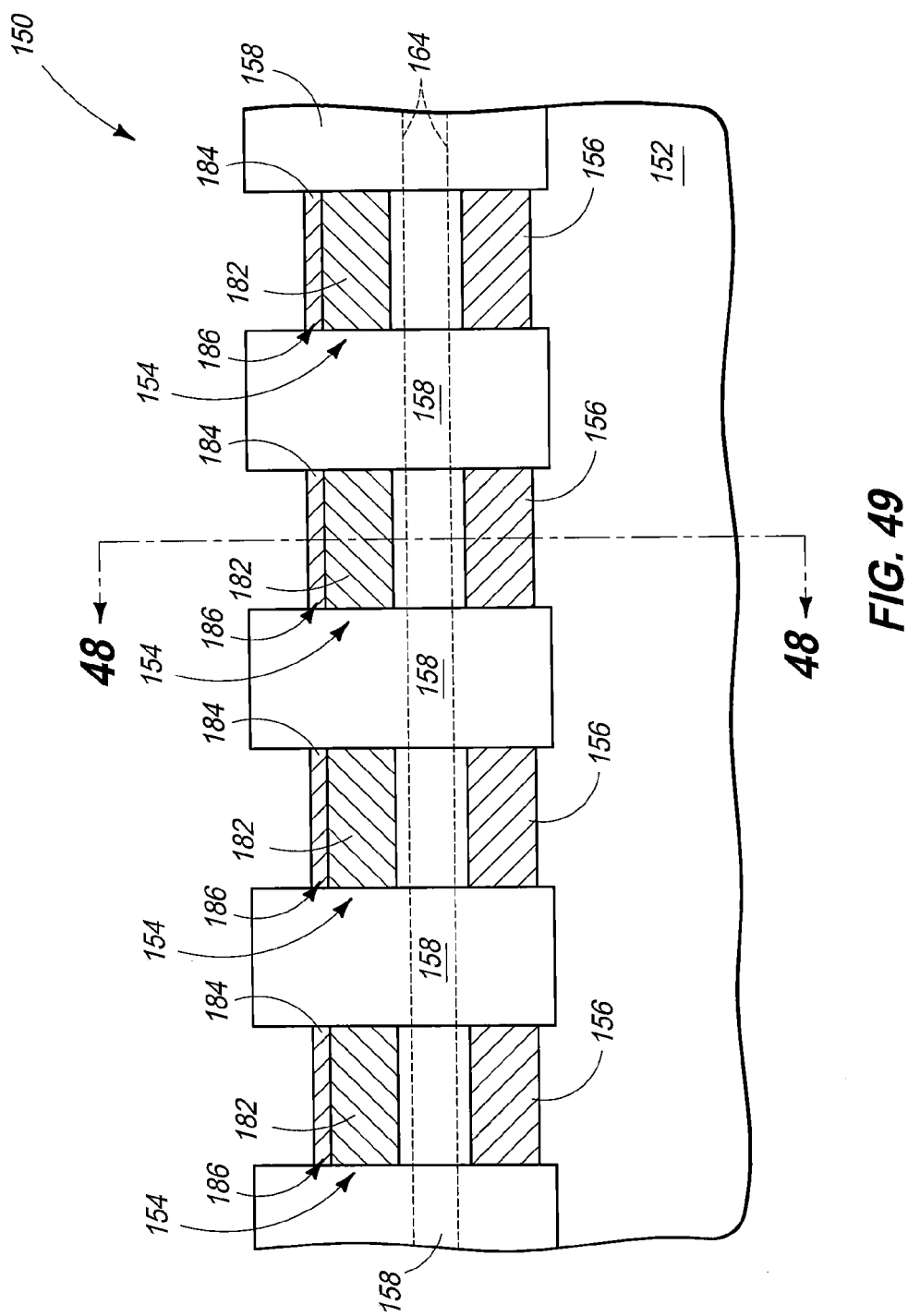

Referring to FIGS. 47-49, masking materials 160 and 162 (FIGS. 44-46) are removed to leave container-shaped openings 180 over the vertical transistor pillars 154. Source/drain regions 182 are formed at the tops of the vertical transistor pillars by implanting dopant into the semiconductor material of the vertical pillars. Electrically conductive bottom electrode material 184 is formed within the openings and directly against the top source/drain regions 182. The bottom electrode material may comprise any suitable composition or combination of compositions, and in some embodiments may comprise cobalt silicide. Such cobalt silicide may be formed by silicidation of silicon exposed at the tops of pillars 154 within the openings 180.

In some embodiments, the bottom electrode material 184 of FIGS. 47-49 may be considered to form an array of bottom electrodes 186 that are across a supporting base of semiconductor material. The array comprises rows along the axis 85, and columns along the axis 86. Such bottom electrodes may be considered to be exposed at the bottoms of the container-shaped openings 180 that extend into dielectric material 158.

Figure 50:
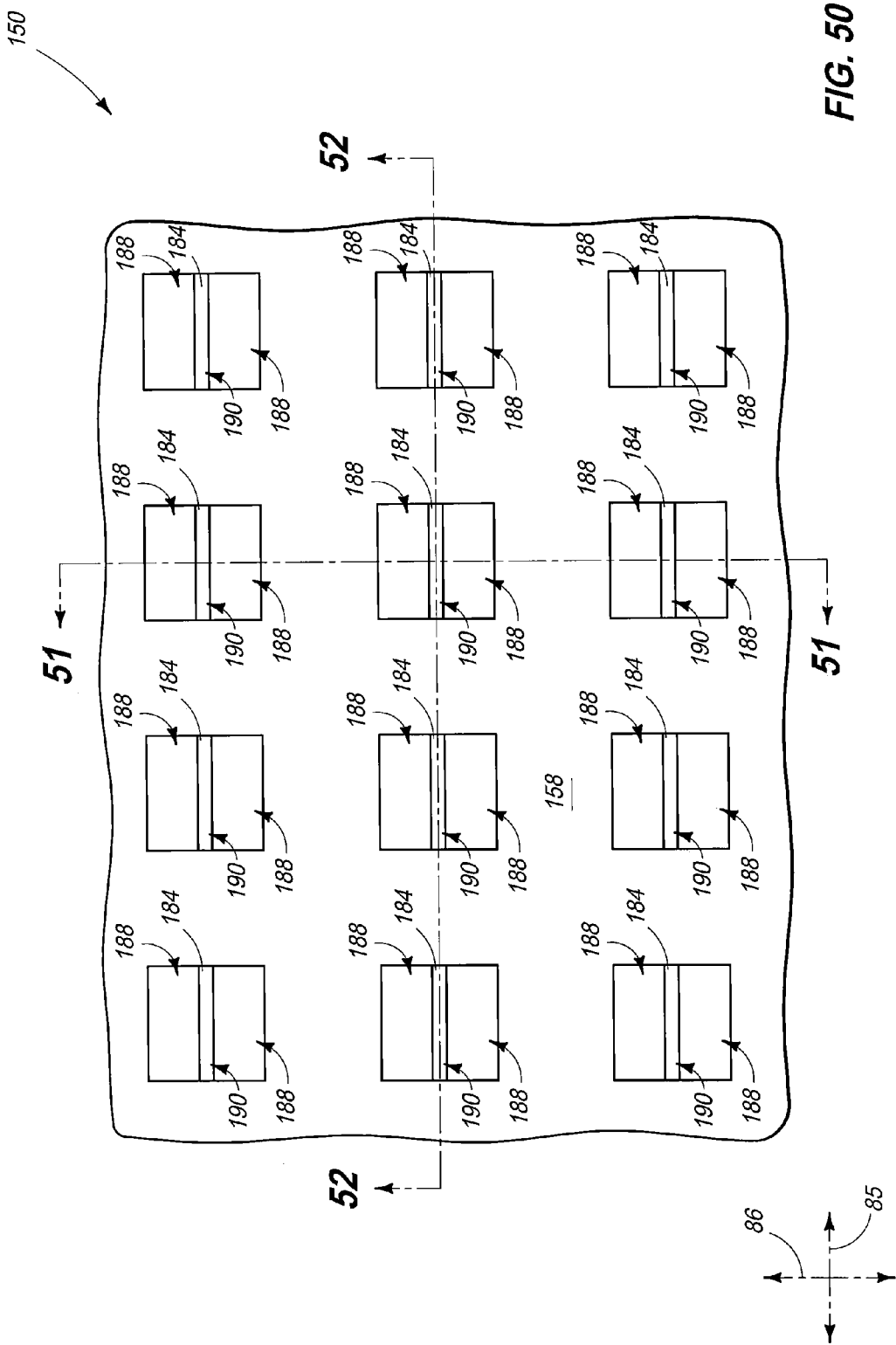
FIGS. 50-52 are a diagrammatic top view, and diagrammatic sectional side views of the semiconductor construction of FIGS. 44-46 at a processing stage subsequent to that of FIGS. 47-49. The cross-sectional side view of FIG. 51 is along the lines 51-51 of FIGS. 50 and 52, and the cross-sectional side view of FIG. 52 is along the lines 52-52 of FIGS. 50 and 51.
Figure 51:
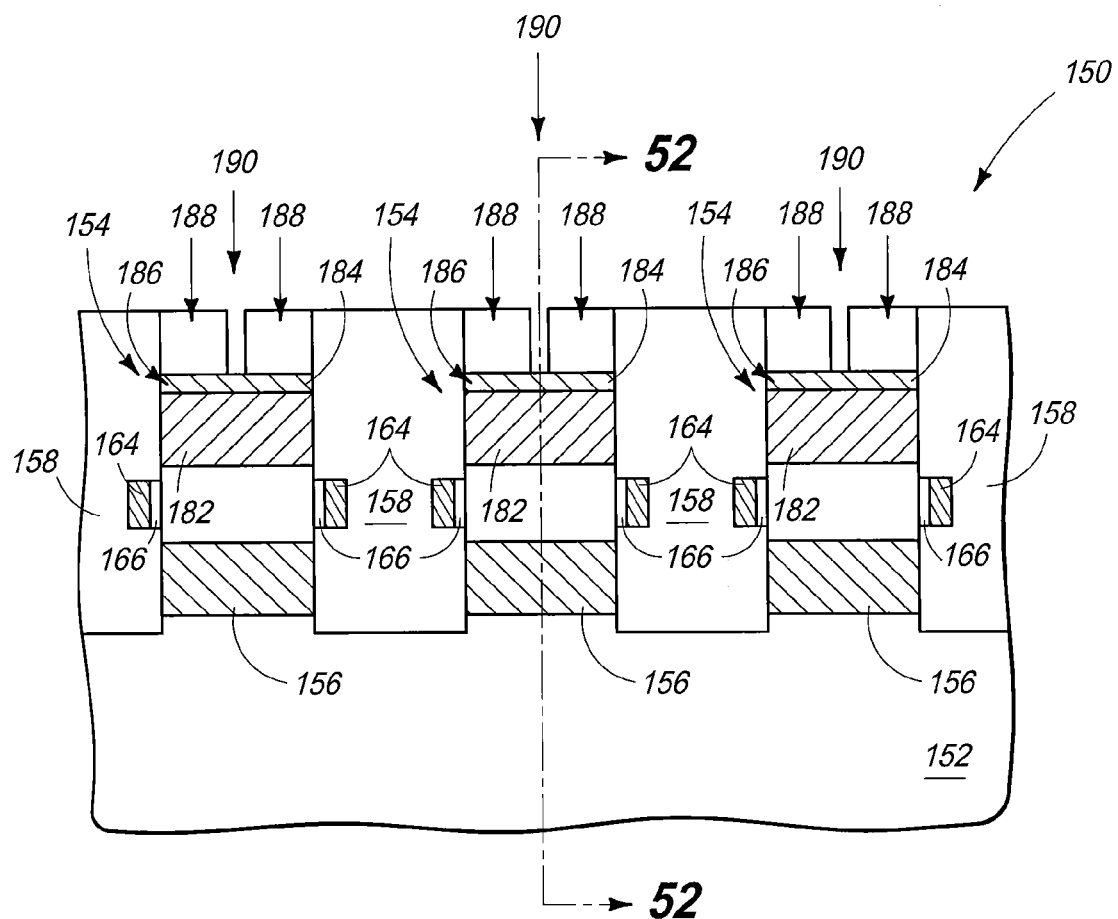
Figure 52:
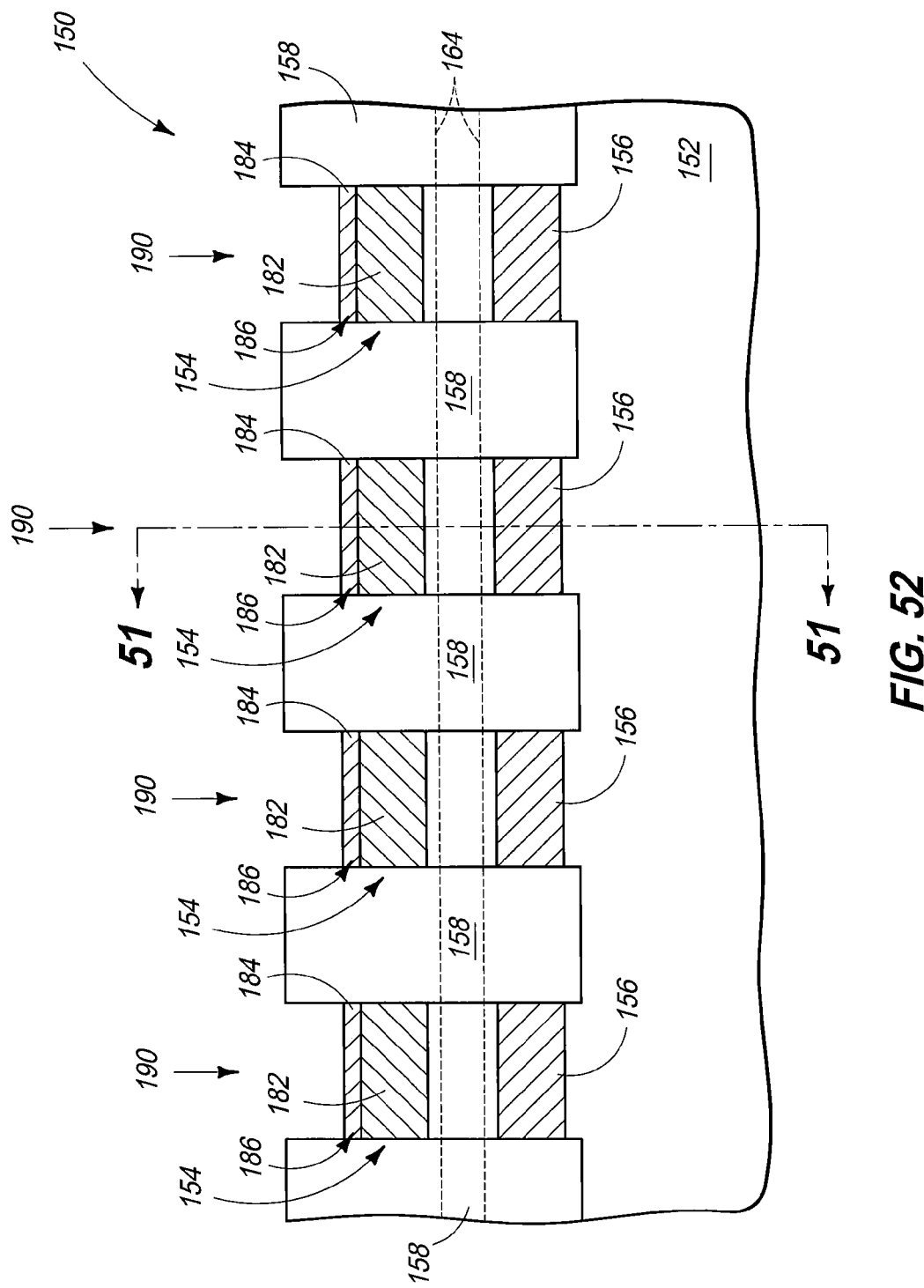

Referring to FIGS. 50-52, spacers 188 are formed within the openings 180 (FIGS. 47-49) to narrow the openings, and thereby form slots 190 over the bottom electrodes 186. The spacers 188 may comprise any suitable composition or combination of compositions, and in some embodiments may comprise one or both of silicon dioxide and silicon nitride. The slots 190 may be formed utilizing any suitable methodology. For instance, the slots may be formed by an etch into material of spacers 188 while patterning the locations of the slots with a photolithographically-patterned photoresist mask (not shown). In some embodiments, resist soaking and/or freezing methodology may be used to form the photoresist mask to be suitable to pattern features having dimensions less than can be achieved by photolithography alone. In some embodiments, the slots 190 may be formed utilizing a sacrificial spacer with methodology analogous to that described above with reference to FIGS. 14-24 for fabrication of the slots 100.

The slots 190 extend along the direction of axis 85 in the shown embodiment.

Figure 53:
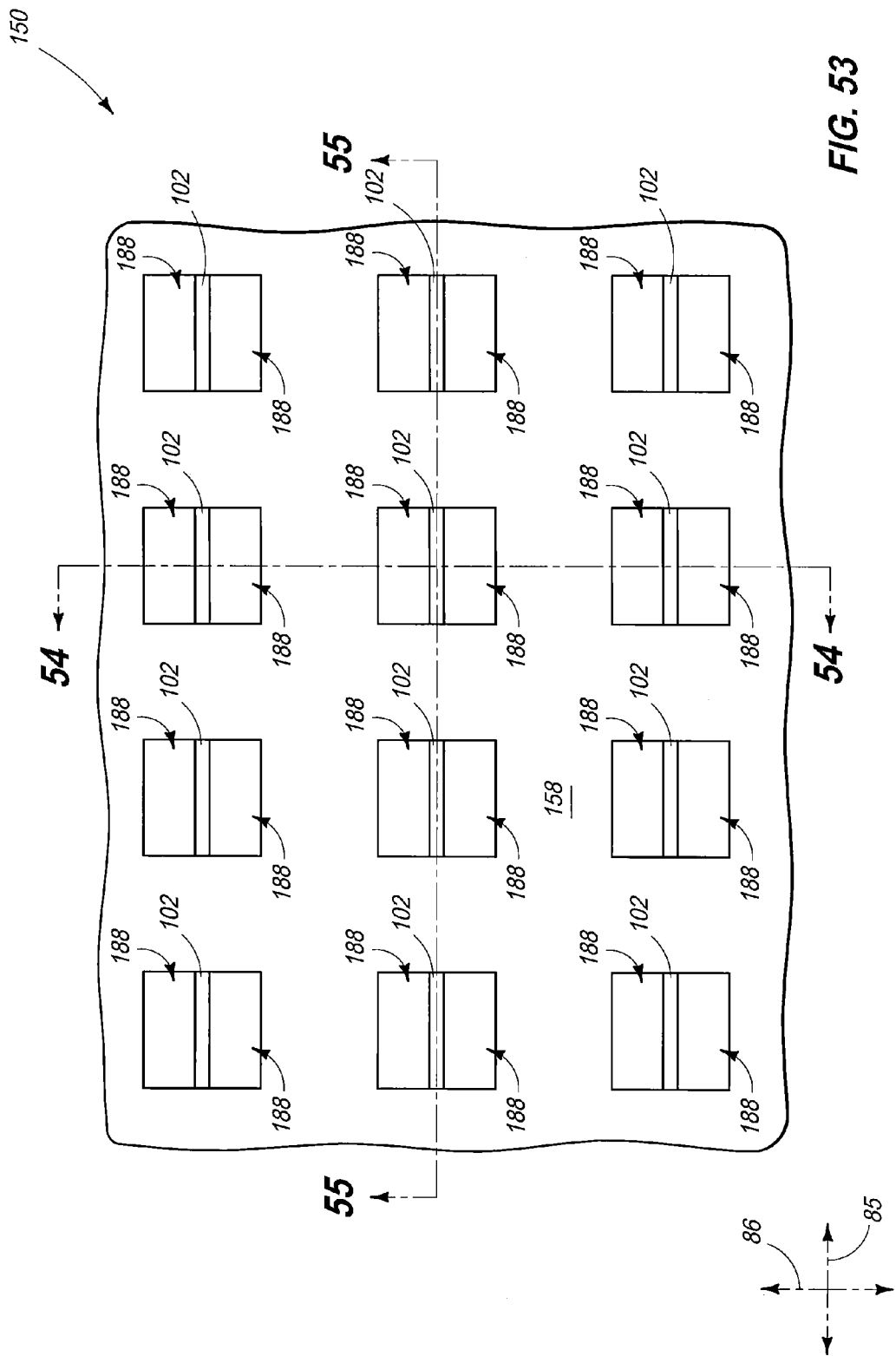
FIGS. 53-55 are a diagrammatic top view, and diagrammatic sectional side views of the semiconductor construction of FIGS. 44-46 at a processing stage subsequent to that of FIGS. 50-52. The cross-sectional side view of FIG. 54 is along the lines 54-54 of FIGS. 53 and 55, and the cross-sectional side view of FIG. 55 is along the lines 55-55 of FIGS. 53 and 54.
Figure 54:
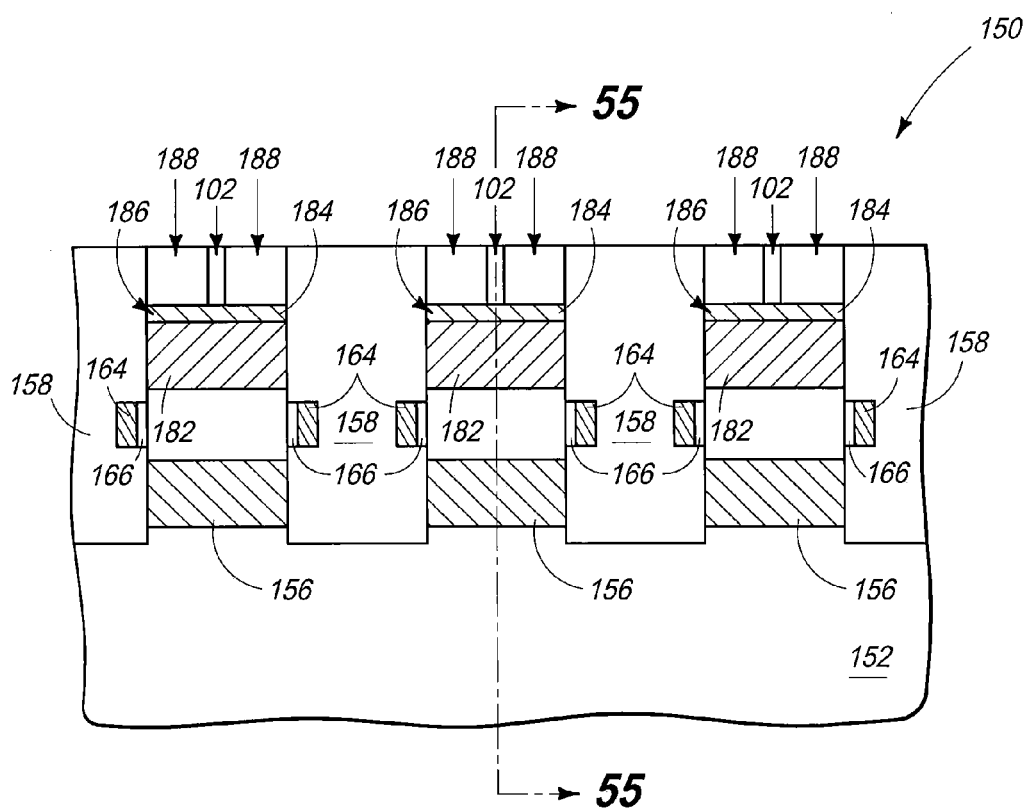
Figure 55:
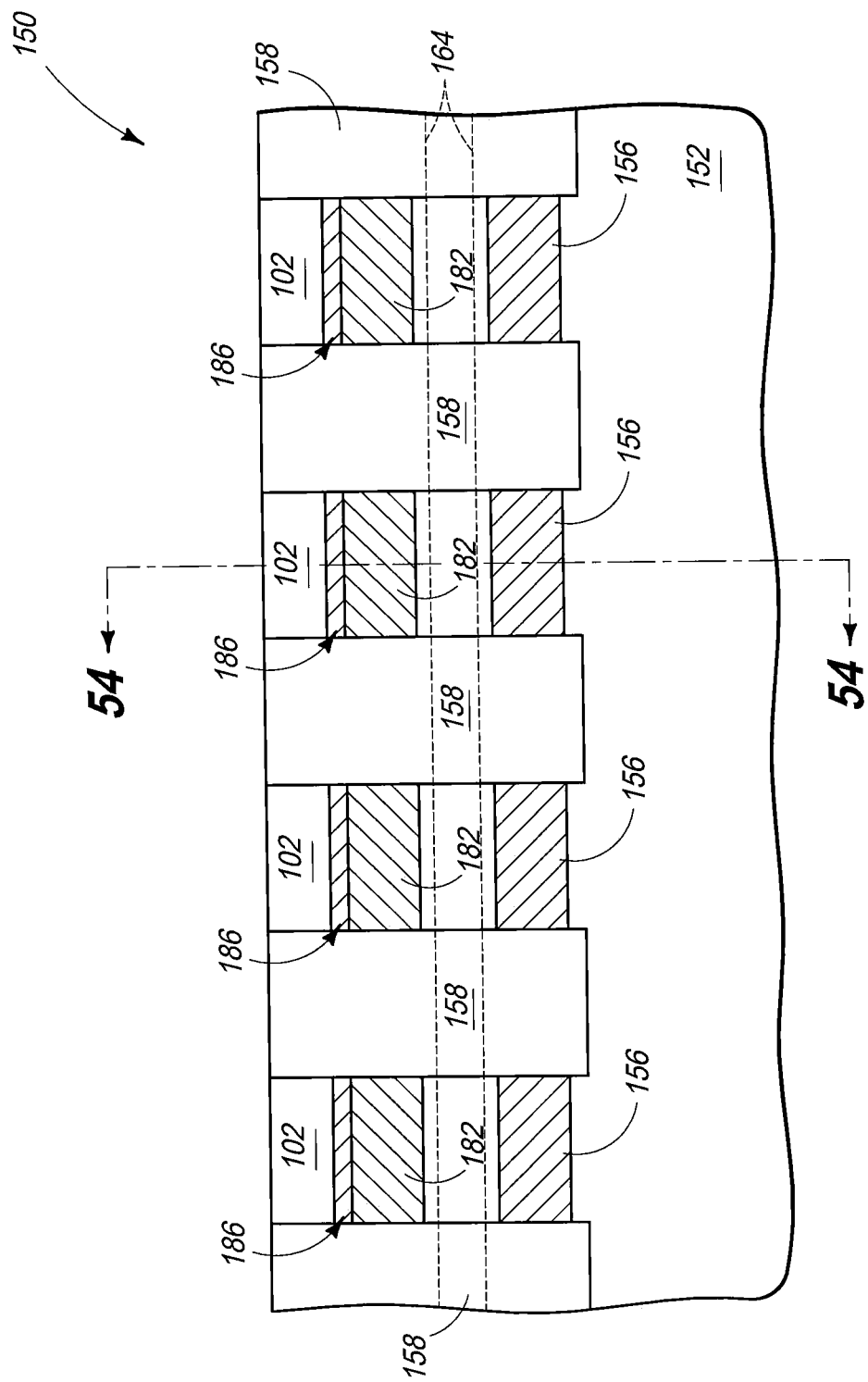

Referring to FIGS. 53-55, first programmable material 102 is formed within the slots 90 (FIGS. 50-52). The first programmable material may be formed within the slots by depositing a layer of first programmable material which extends within the slots and over upper surfaces of dielectric materials 158 and 188, and then utilizing CMP to remove the programmable material from over the dielectric materials while leaving the programmable material within the slots.

The first programmable material 102 forms a plurality of separated segments (or plates) which are supported edgewise over the bottom electrodes 186.

Figure 56:
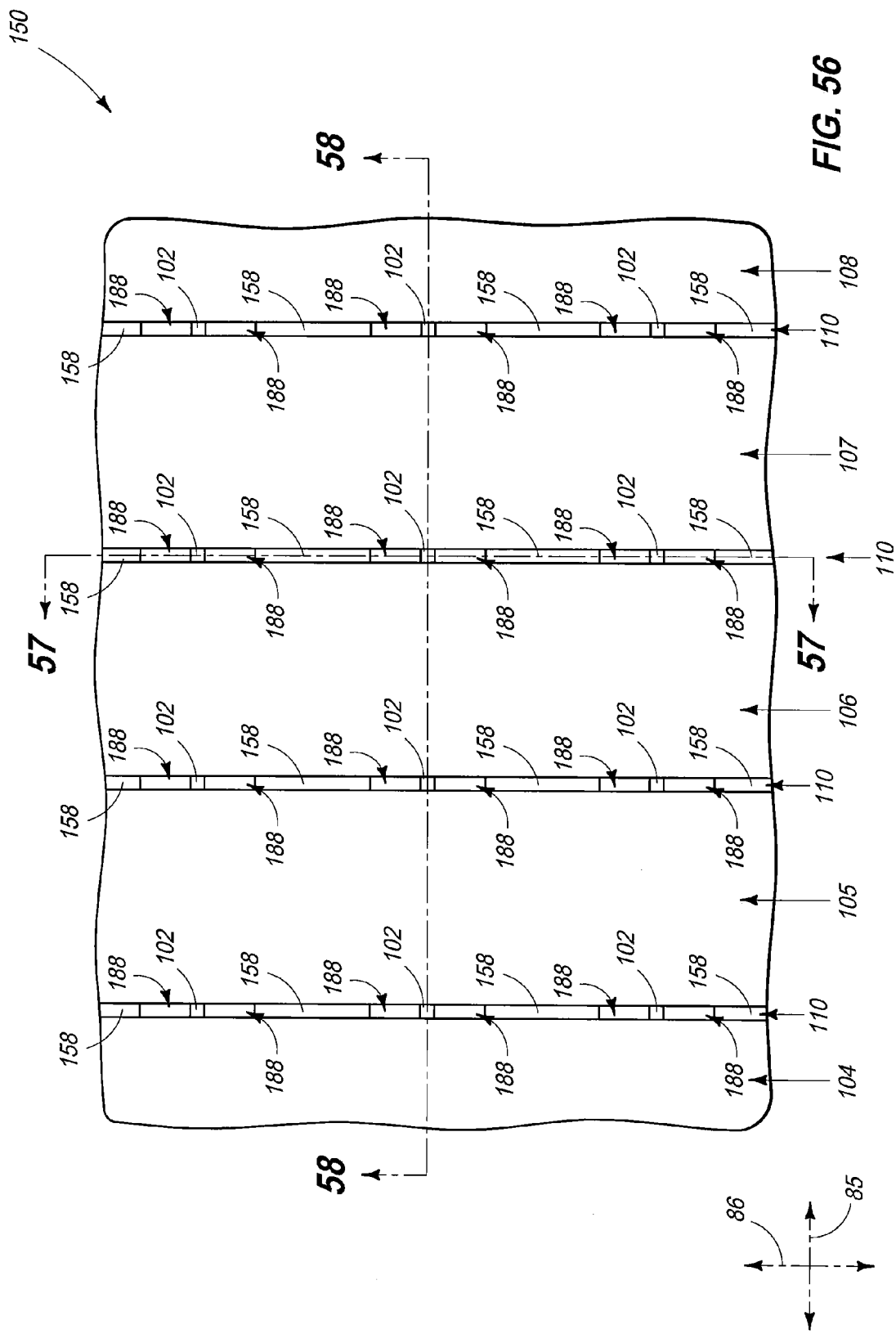
FIGS. 56-58 are a diagrammatic top view, and diagrammatic sectional side views of the semiconductor construction of FIGS. 44-46 at a processing stage subsequent to that of FIGS. 53-55. The cross-sectional side view of FIG. 57 is along the lines 57-57 of FIGS. 56 and 58, and the cross-sectional side view of FIG. 58 is along the lines 58-58 of FIGS. 56 and 57.
Figure 57:
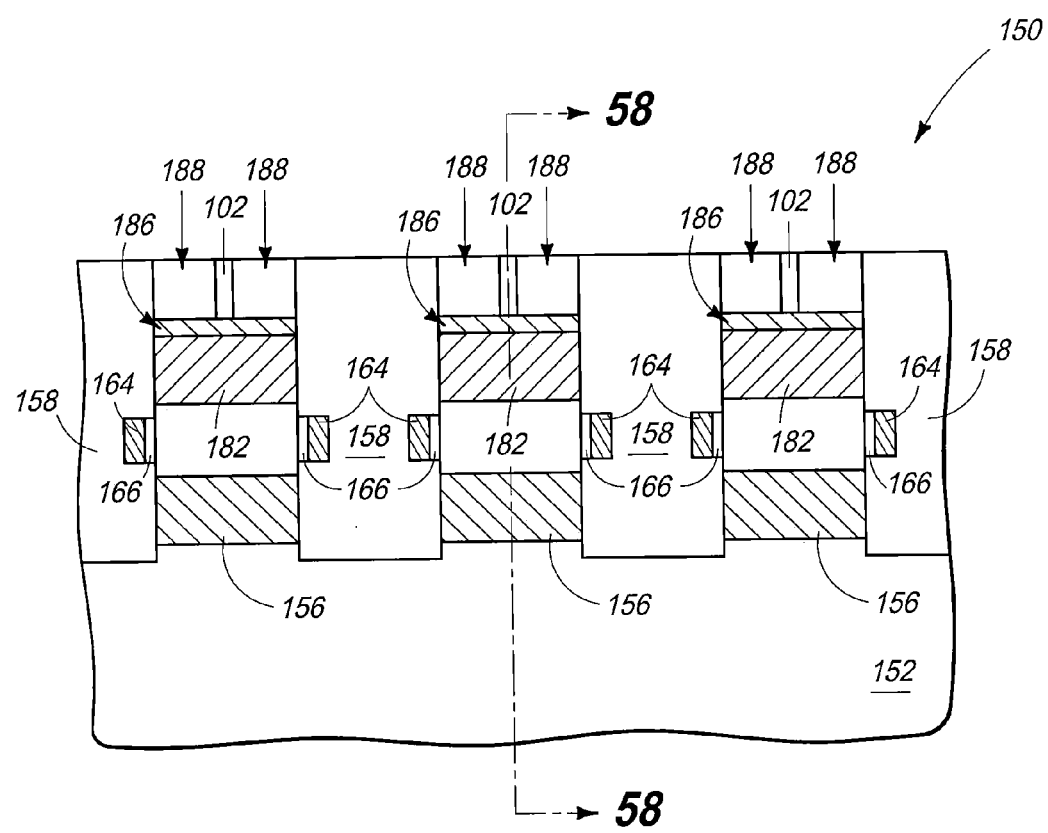
Figure 58:
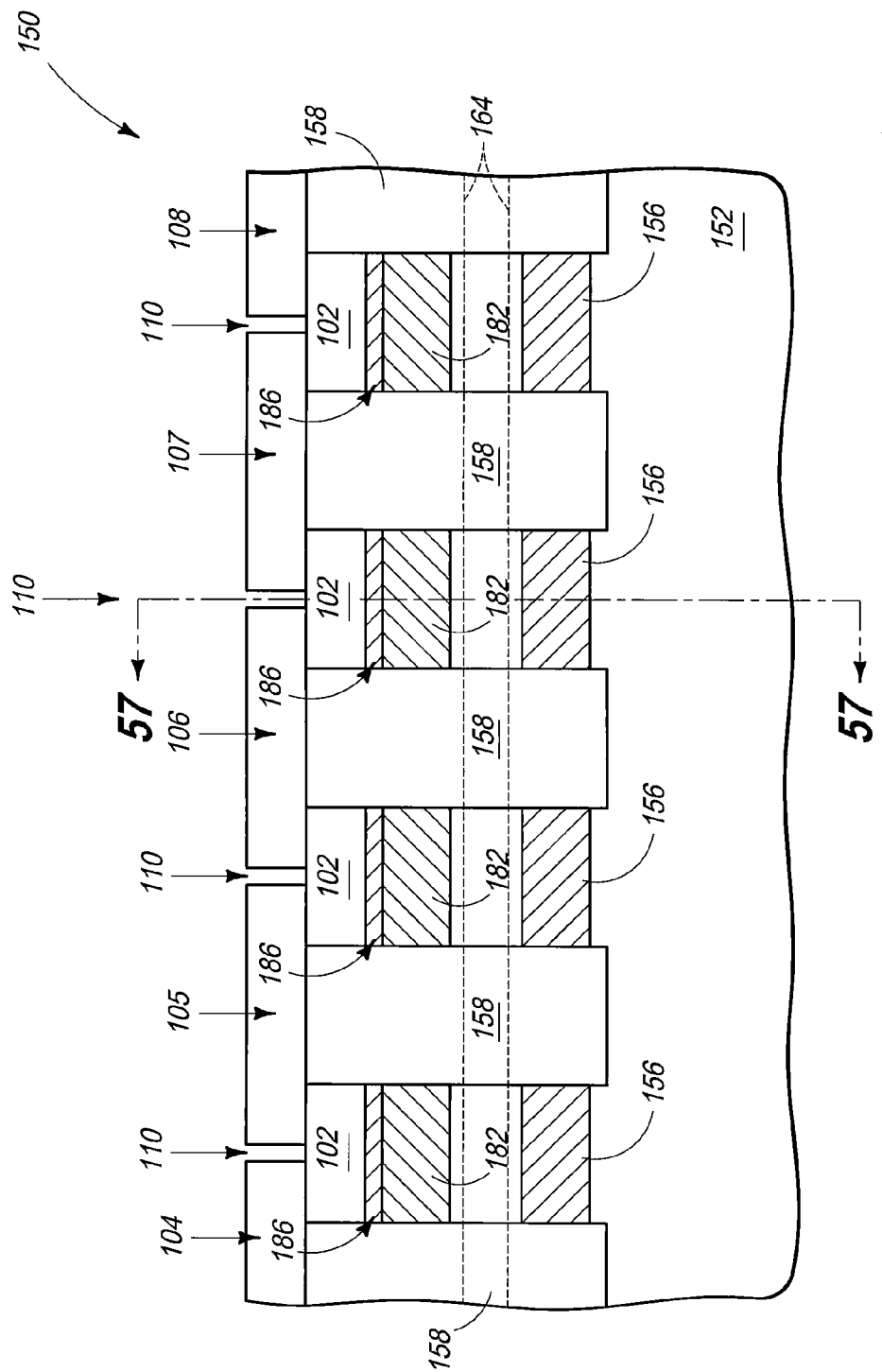

Referring to FIGS. 56-58, blocks 104-108 are formed over the materials 158, 188 and 102, and along the second axis 86. The blocks 104-108 are spaced from one another by gaps 110. The blocks 104-108 and gaps 110 are identical to those discussed above relative to FIGS. 28-30, and may be formed with the same processing.

Figure 59:
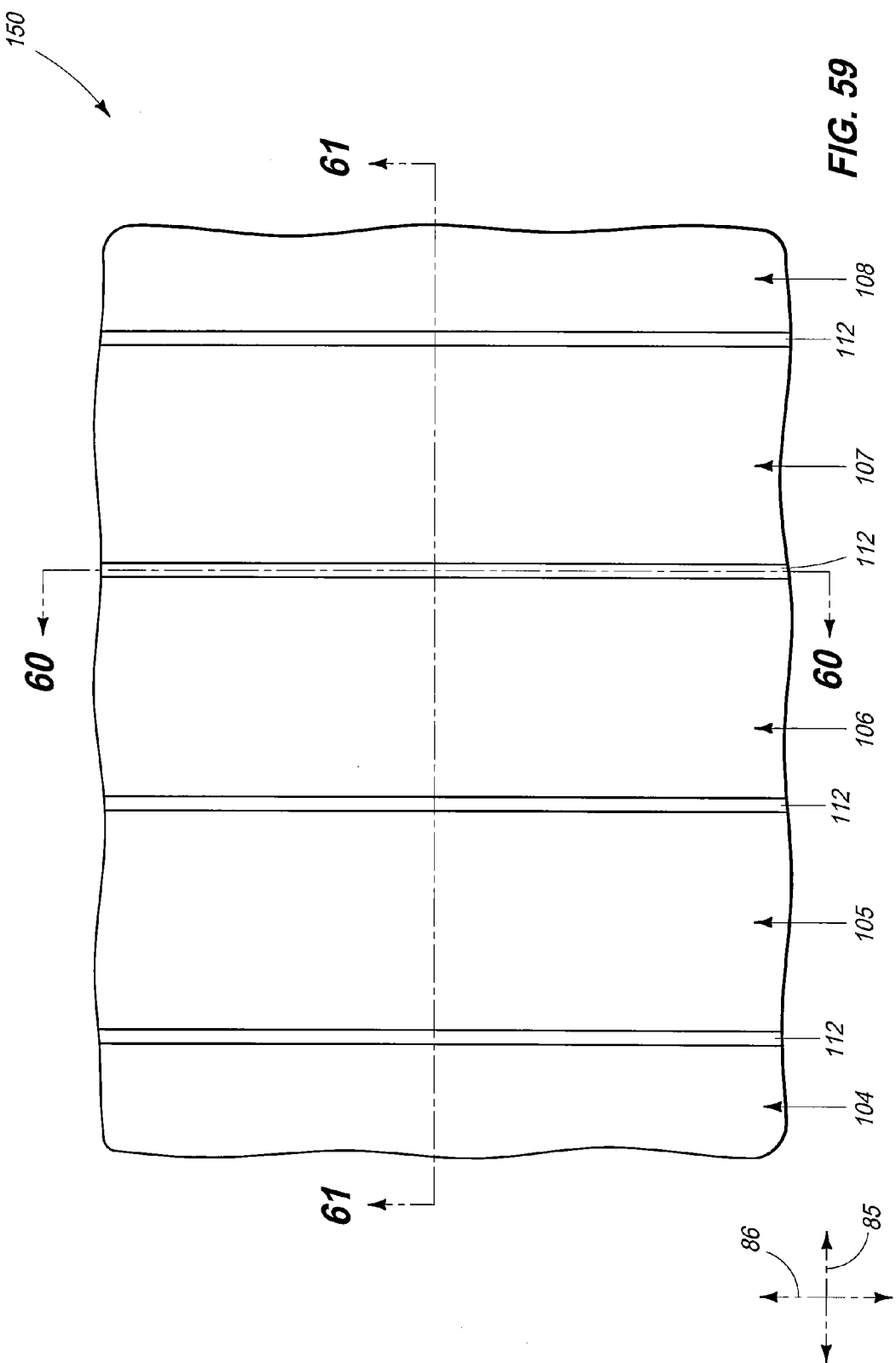
FIGS. 59-61 are a diagrammatic top view, and diagrammatic sectional side views of the semiconductor construction of FIGS. 44-46 at a processing stage subsequent to that of FIGS. 56-58. The cross-sectional side view of FIG. 60 is along the lines 60-60 of FIGS. 59 and 61, and the cross-sectional side view of FIG. 61 is along the lines 61-61 of FIGS. 59 and 60.
Figure 60:
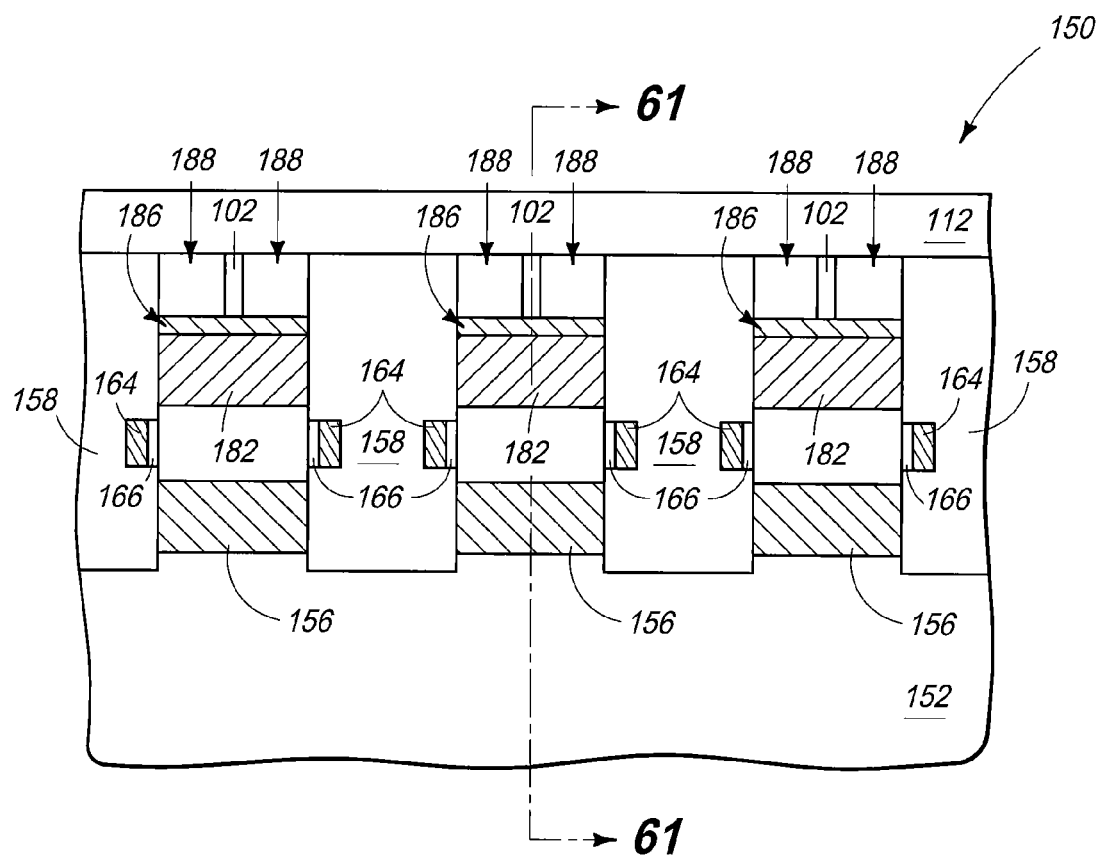
Figure 61:
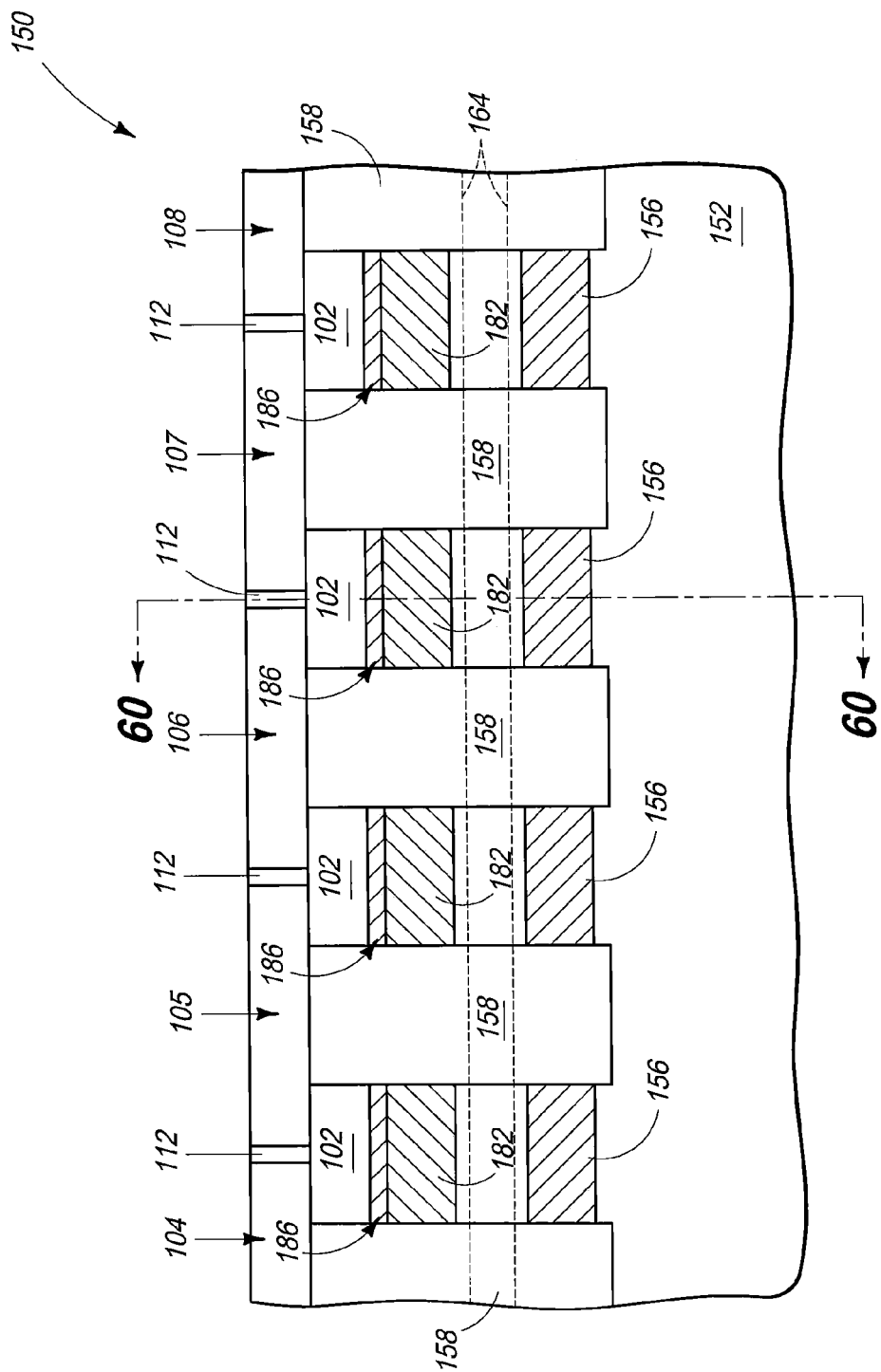

Referring to FIGS. 59-61, lines of second programmable material 112 are formed within the gaps 110 (FIGS. 56-58). The programmable material 112 may comprise the same materials discussed above with reference to FIGS. 31-33, and may be formed by the same methodology discussed above with reference to such figures. The lines of the second programmable material 112 are directly over, and directly against, the segments of the first programmable material 102; and in the shown embodiment extend approximately orthogonally to such segments of the first programmable material.

Figure 62:
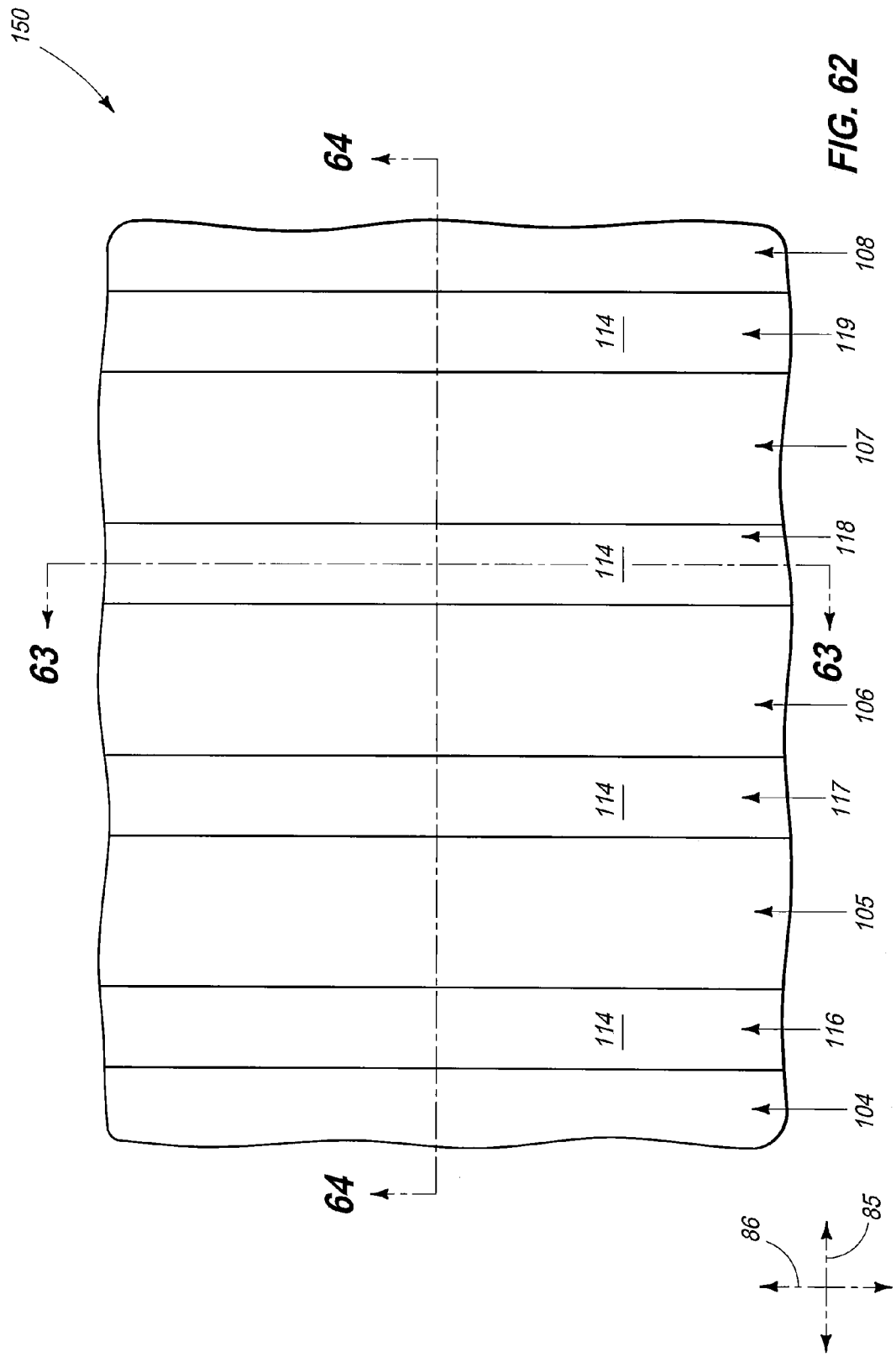
FIGS. 62-64 are a diagrammatic top view, and diagrammatic sectional side views of the semiconductor construction of FIGS. 44-46 at a processing stage subsequent to that of FIGS. 59-61. The cross-sectional side view of FIG. 63 is along the lines 63-63 of FIGS. 62 and 64, and the cross-sectional side view of FIG. 64 is along the lines 64-64 of FIGS. 62 and 63.
Figure 63:
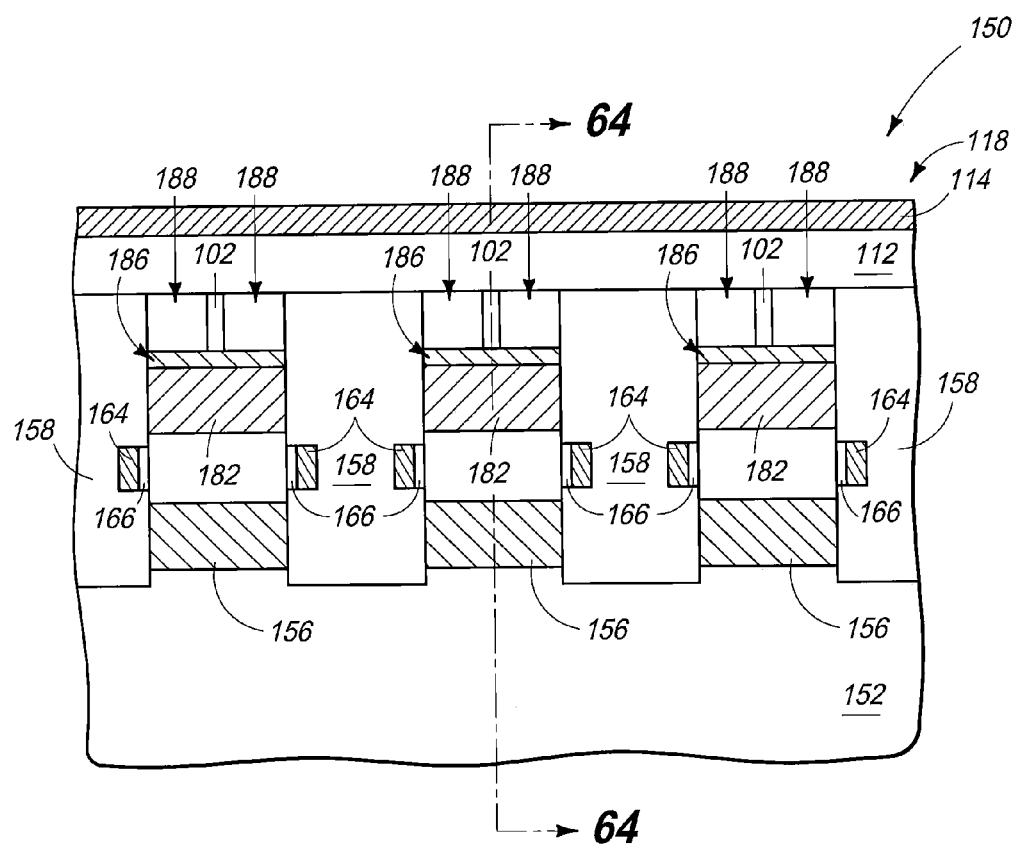
Figure 64:
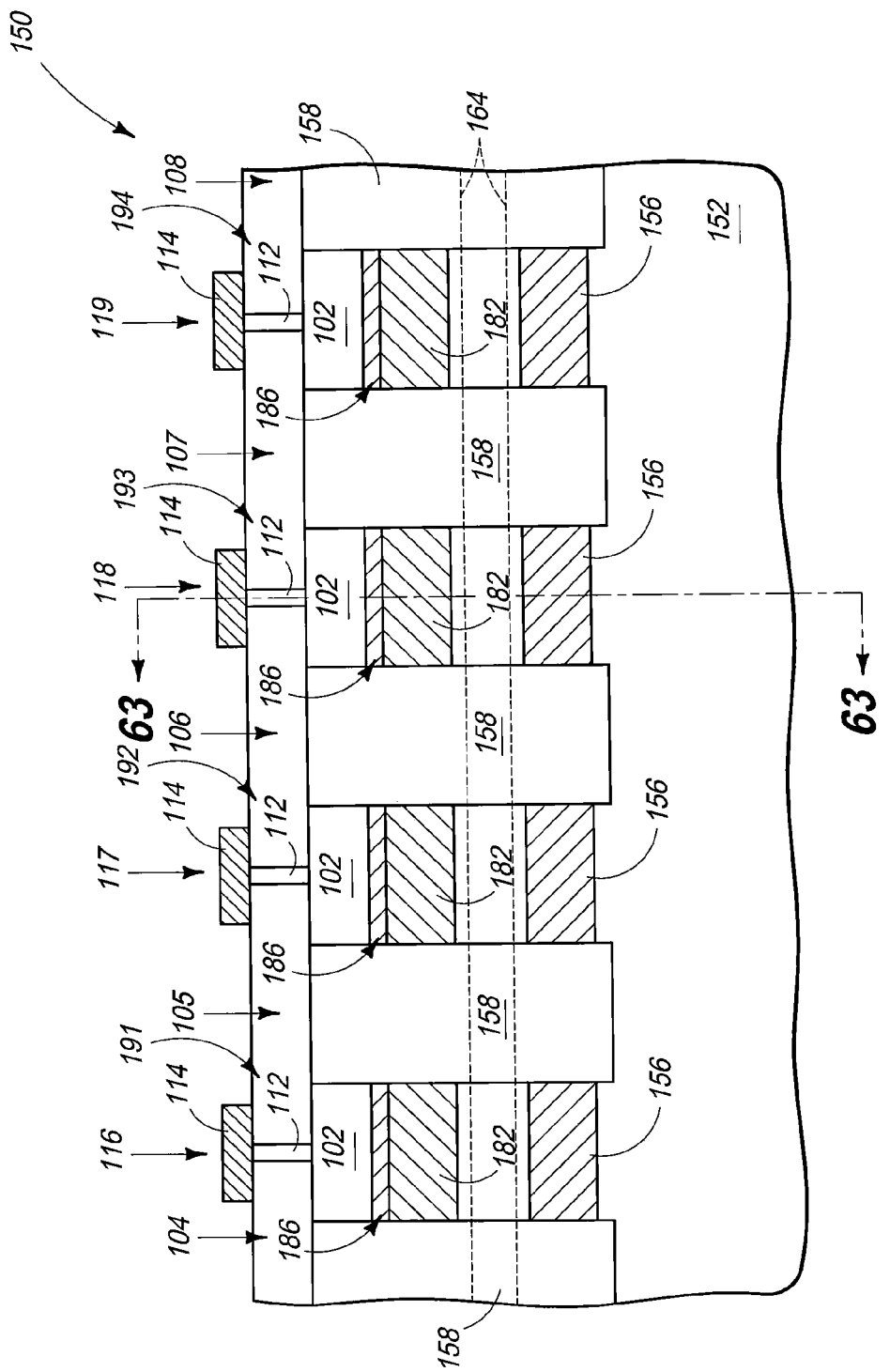

Referring to FIGS. 62-64, top electrode material 114 is provided across the second programmable material 112 and the blocks 104-108, and is then patterned into lines 116-119. Such patterning may be accomplished with processing analogous to that discussed above with reference to FIGS. 34-39.

The bottom electrodes 186, segments of programmable material 102, lines of programmable material 112, and lines of conductive material 114 together form an array of memory cells; with example memory cells being shown in FIG. 64 as memory cells 191-194. Each memory cell has a segment (or plate) of first programmable material 102 having an upper surface extending along a first axis (with such axis being along the cross-section of FIG. 64 in the illustrated embodiment), and has a region of the second programmable material 112 that has a bottom edge directly against the upper edge of material 102. In the shown embodiment, the material 112 is configured as a plurality of lines that directly contact multiple separate plates of material 102; with an example line of material 112 being shown in FIG. 63 to contact a plurality of underlying plates of material 102.

Figure 65:
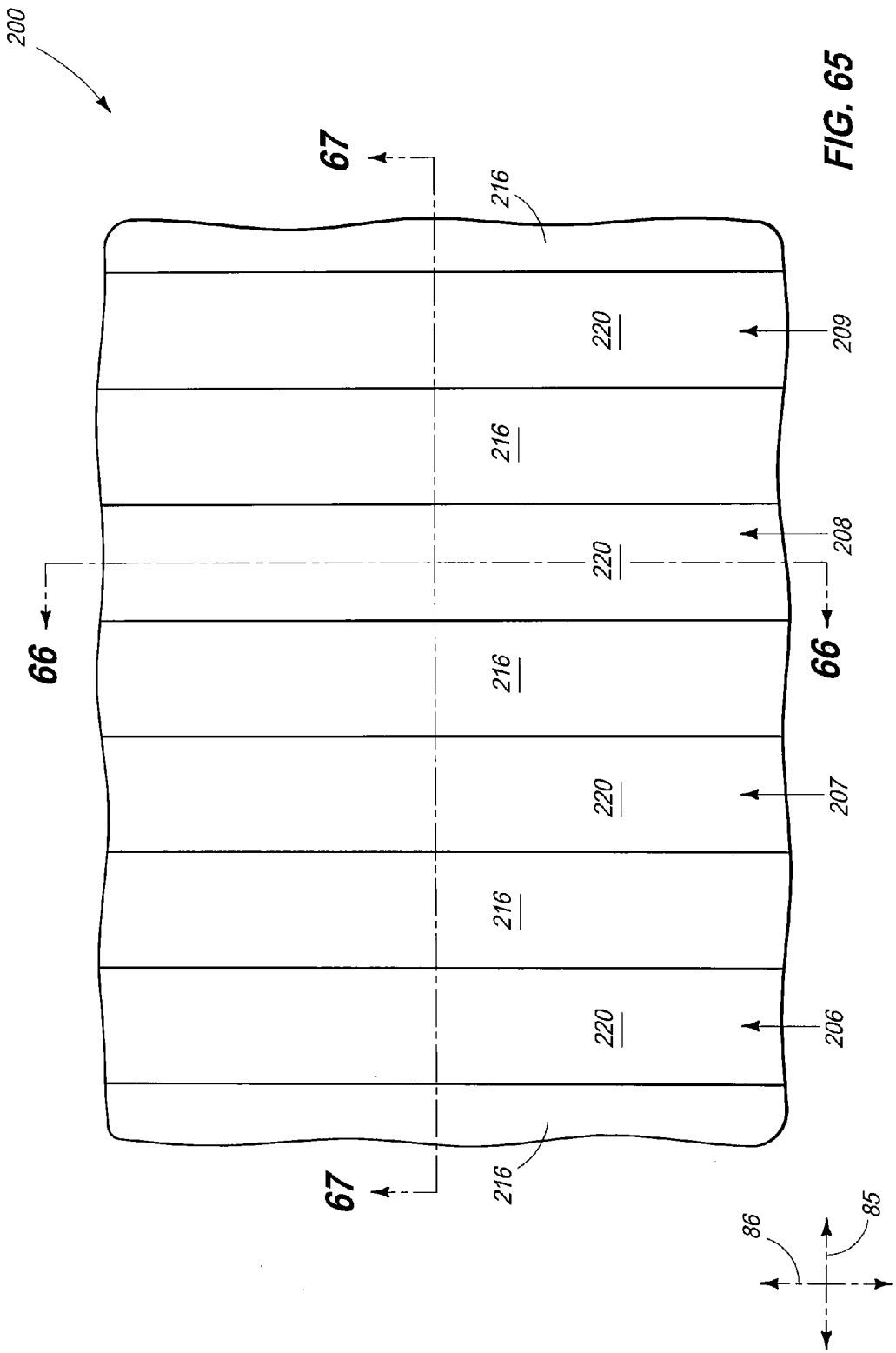
FIGS. 65-67 are a diagrammatic top view, and diagrammatic sectional side views of a semiconductor construction at a processing stage of another example embodiment method of forming a memory array. The cross-sectional side view of FIG. 66 is along the lines 66-66 of FIGS. 65 and 67, and the cross-sectional side view of FIG. 67 is along the lines 67-67 of FIGS. 65 and 66.

The individual memory cells 191-194 of FIG. 65 are in one-to-one correspondence with substantially vertical transistors underlying the memory cells, and such transistors may be utilized as select devices during programming and/or reading of the individual memory cells.

Figure 66:
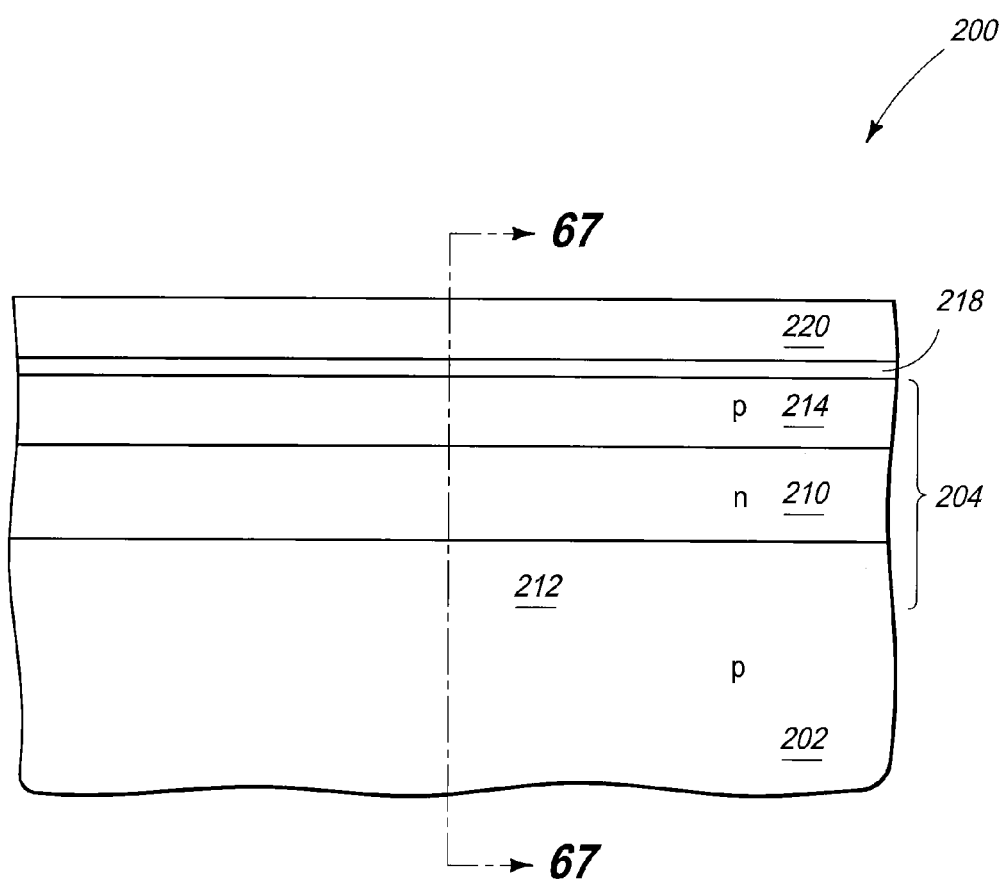
Figure 67:
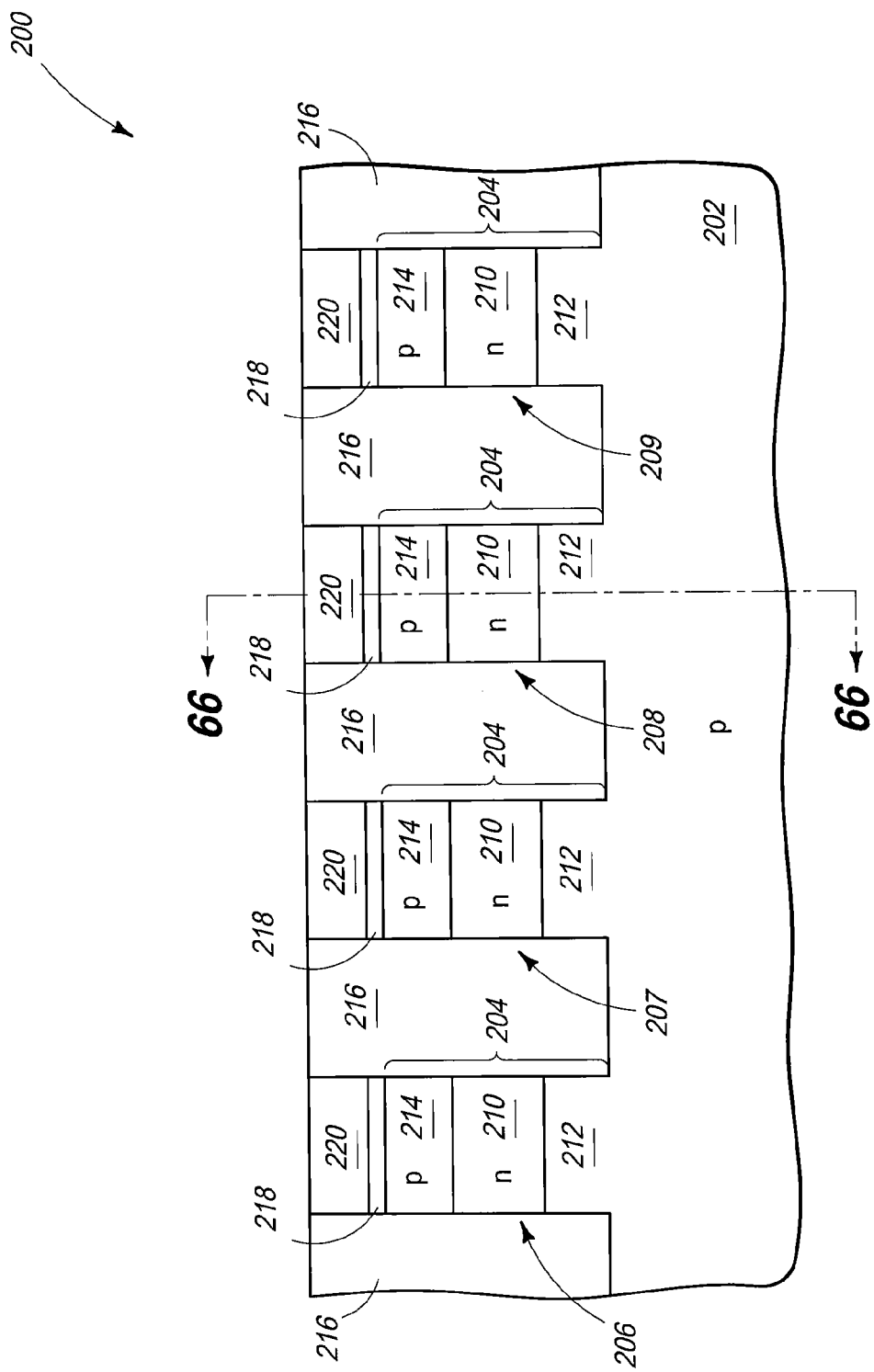

Referring next to FIGS. 65-67, a semiconductor construction 200 is illustrated at a processing stage associated with another example method for fabrication of a memory array. The semiconductor construction includes a plurality of diode stacks 204 supported by a base 202. The base 202 may comprise p-type doped monocrystalline silicon.

The diode stacks are arranged as a plurality of lines 206-209 extending along the axis 86.

Each diode stack comprises semiconductor material extending upwardly from base 202, and comprises an n-type doped region 210 between a pair of p-type doped regions (212 and 214).

The diode stacks are spaced-apart from one another, and dielectric material 216 is provided within the spaces between the stacks. The dielectric material may comprise any suitable composition or combination of compositions; and in some embodiments may include one or more of silicon dioxide, silicon nitride and any of various doped glasses.

The stacks 204 are capped by patterned masking materials 218 and 220. In some embodiments, such patterned masking materials may correspond to pad oxide 218 and silicon nitride 220. In some embodiments, the pad oxide may have a thickness of about 95 Å, and the silicon nitride may have a thickness of about 1000 Å.

The patterned masking materials 218 and 220 may be utilized for patterning the diode stacks 204 from the semiconductor material of base 202. Such patterning of the diode stacks may be conducted after implanting the dopants within regions 210, 212 and 214, in some embodiments.

In the shown embodiment, a planarized surface extends across dielectric material 216 and masking material 220. Such planarized surface may be formed by, for example, CMP.

Figure 68:
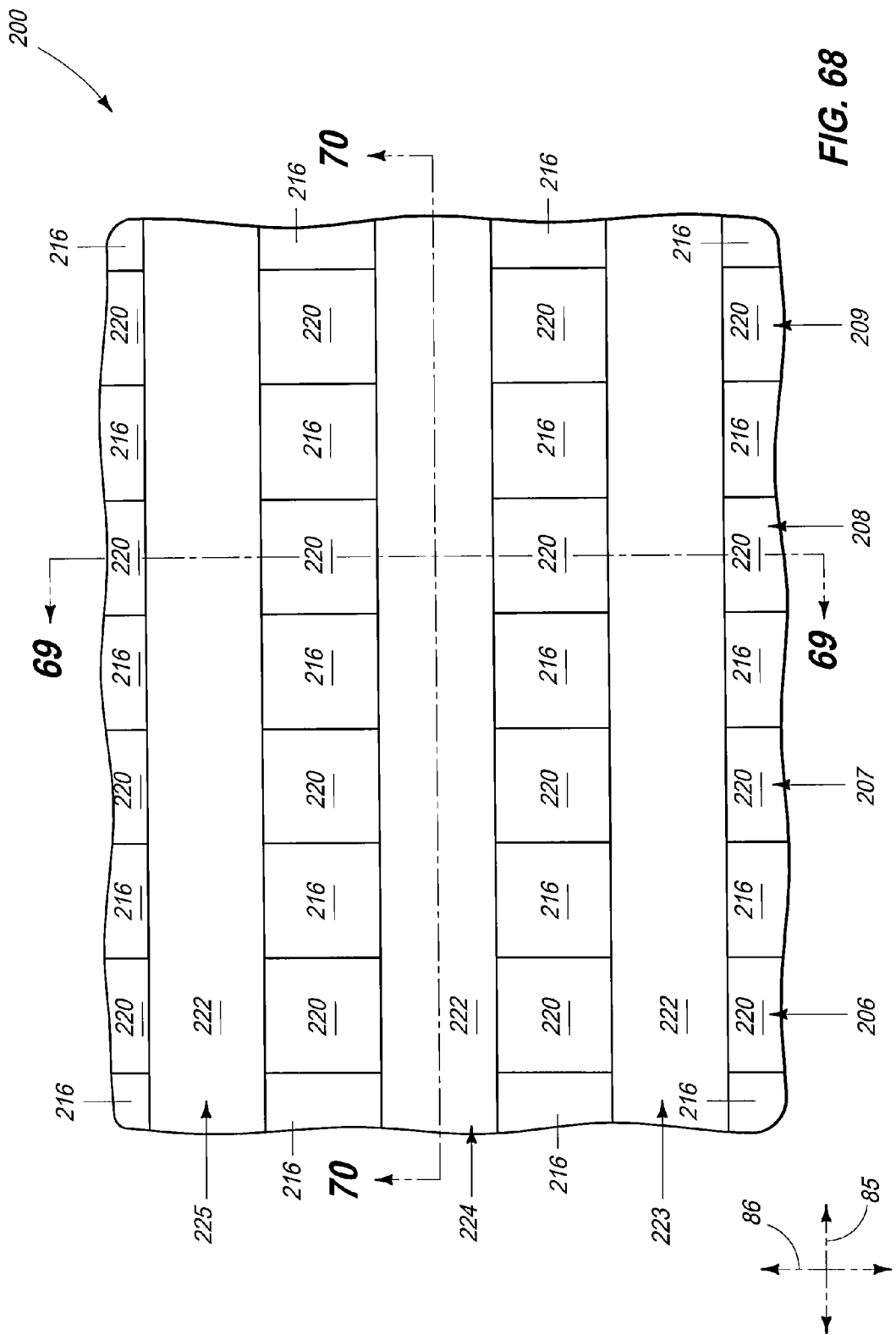
FIGS. 68-70 are a diagrammatic top view, and diagrammatic sectional side views of the semiconductor construction of FIGS. 65-67 at a processing stage subsequent to that of FIGS. 65-67. The cross-sectional side view of FIG. 69 is along the lines 69-69 of FIGS. 68 and 70, and the cross-sectional side view of FIG. 70 is along the lines 70-70 of FIGS. 68 and 69.
Figure 69:
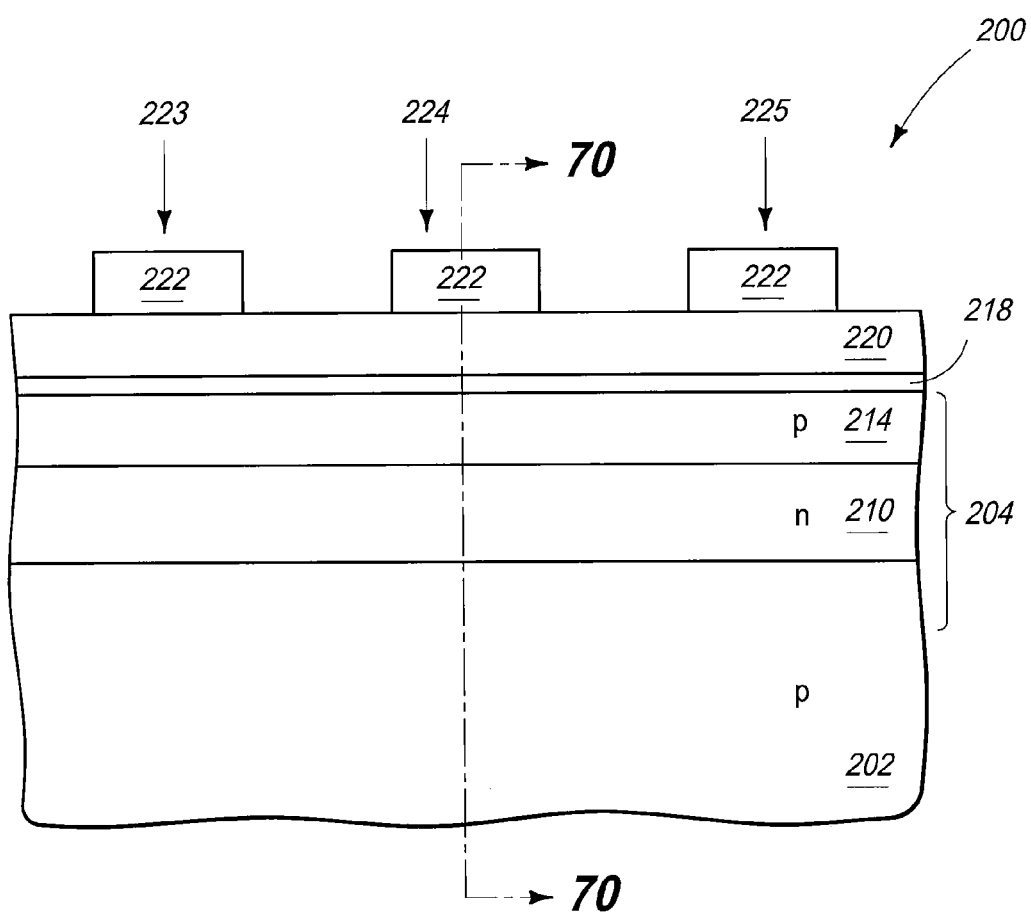
Figure 70:
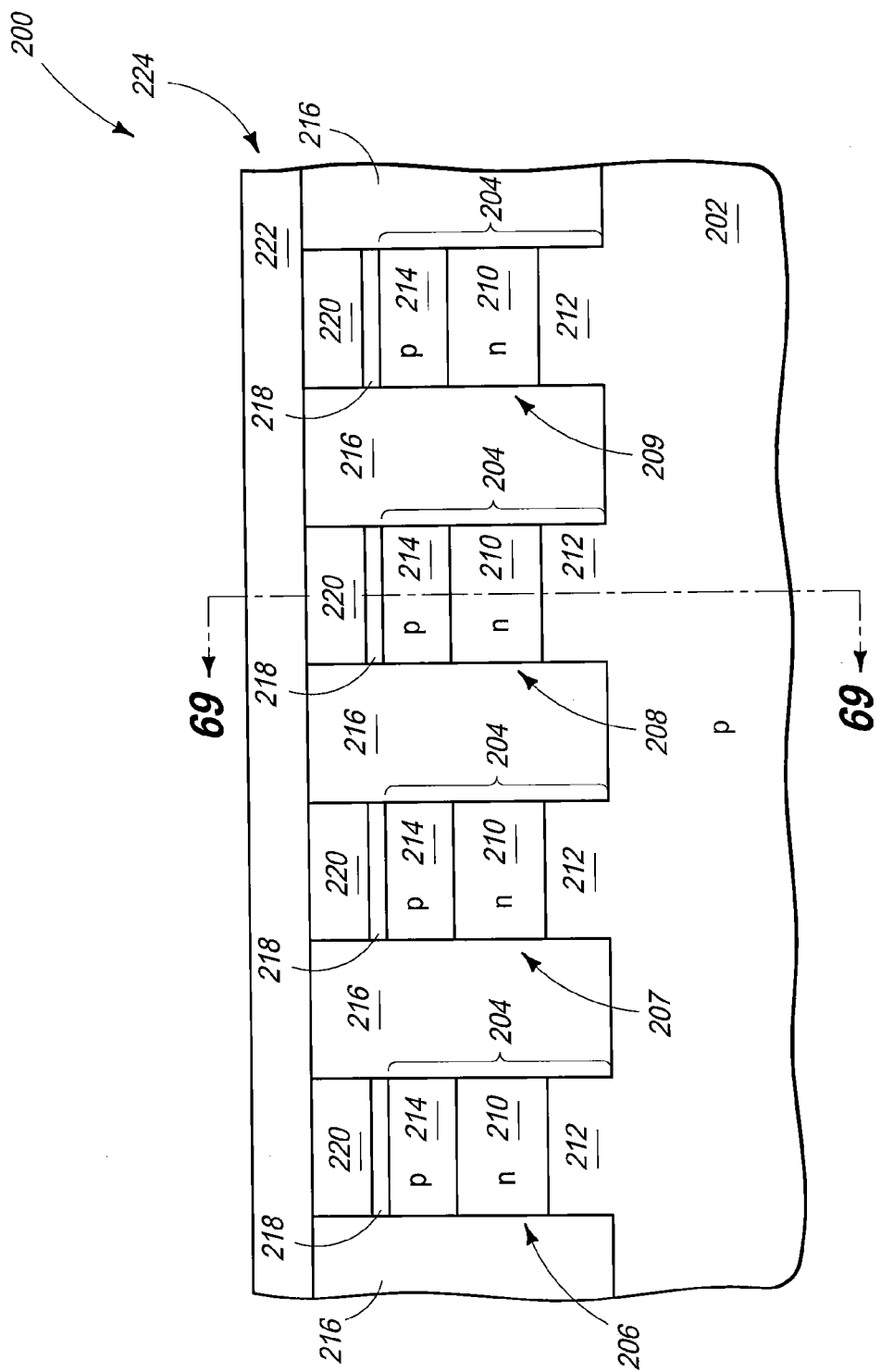

Referring to FIGS. 68-70, patterned masking material 222 is provided across materials 216 and 220. In the shown embodiment, the masking material 222 is patterned as a plurality of spaced apart lines 223-225 that extend along the axis 85; and thus extend substantially orthogonally to the lines 206-209 of the diode stacks. Masking material 222 may comprise any suitable composition or combination of compositions, and in some embodiments may correspond to photolithographically-patterned photoresist.

Figure 71:
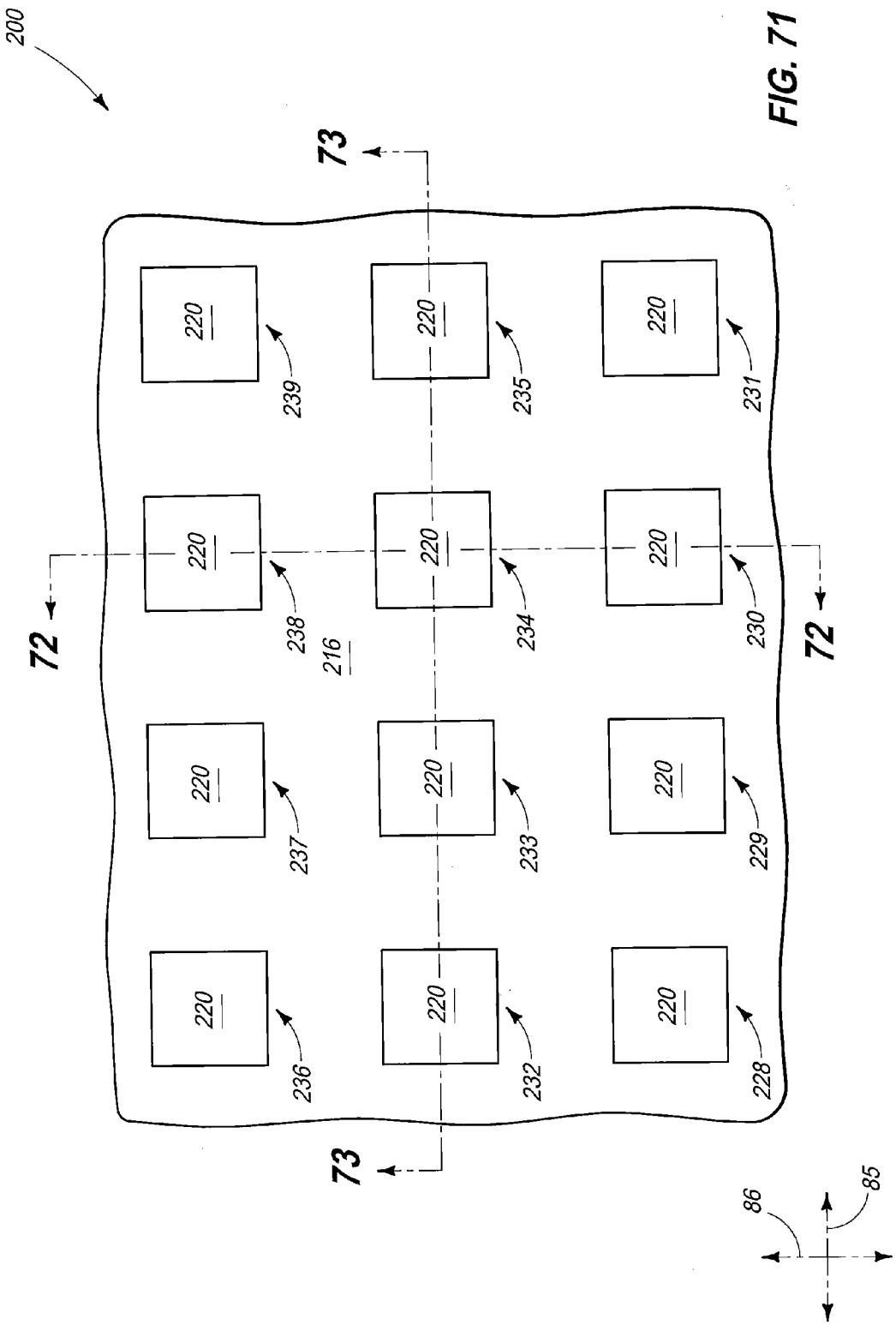
FIGS. 71-73 are a diagrammatic top view, and diagrammatic sectional side views of the semiconductor construction of FIGS. 65-67 at a processing stage subsequent to that of FIGS. 68-70. The cross-sectional side view of FIG. 72 is along the lines 72-72 of FIGS. 71 and 73, and the cross-sectional side view of FIG. 73 is along the lines 73-73 of FIGS. 71 and 72.
Figure 72:
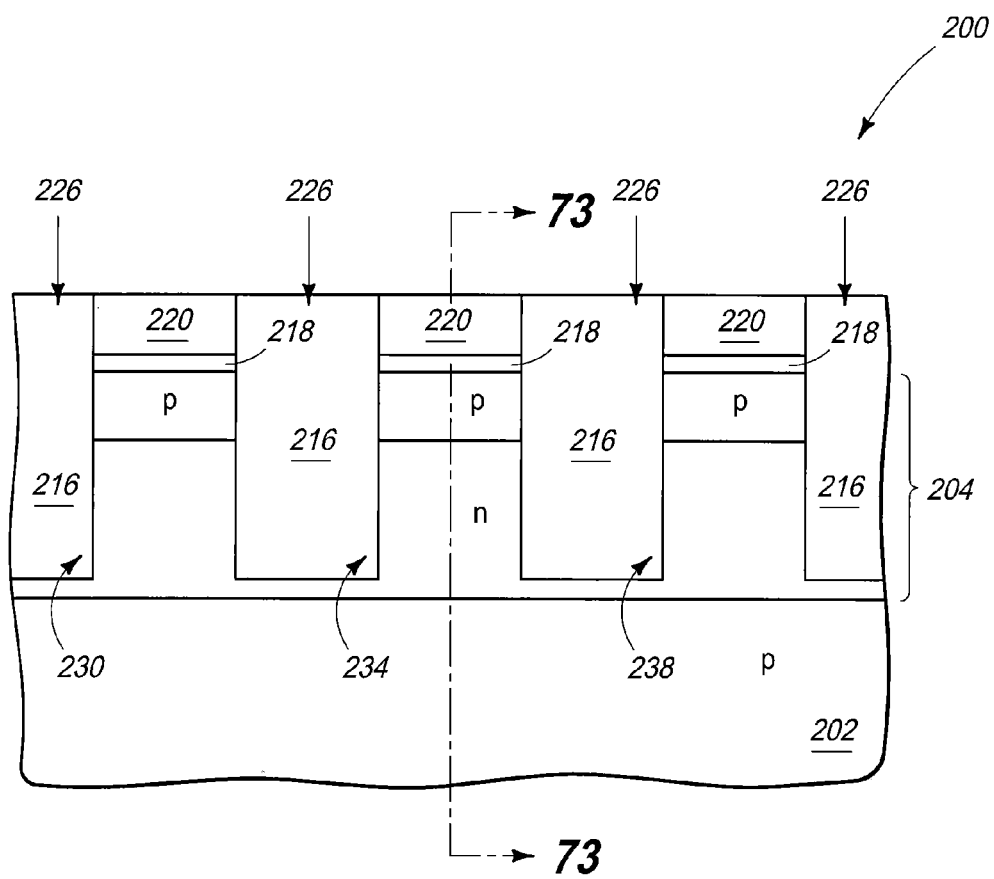
Figure 73:
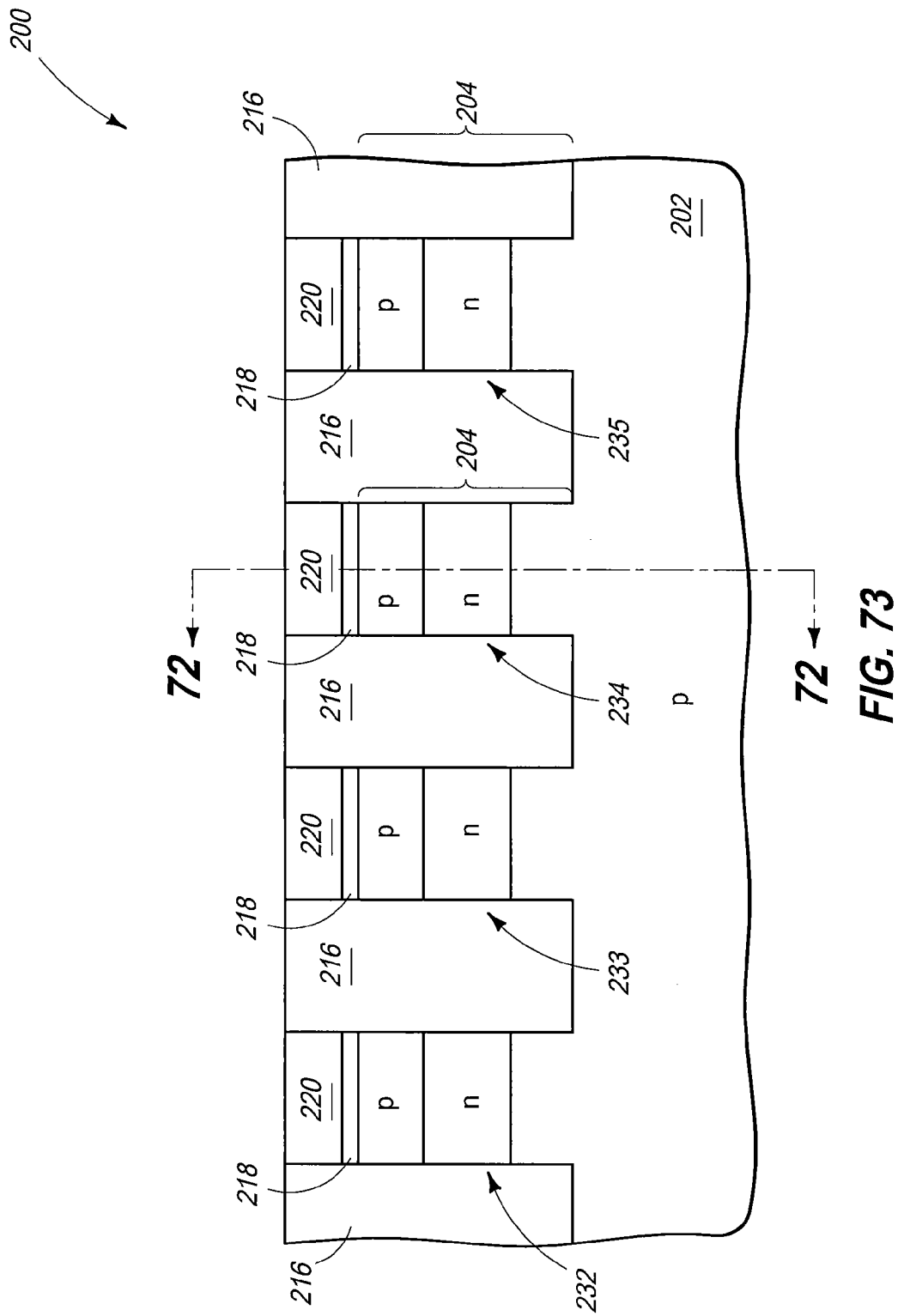

Referring to FIGS. 71-73, a pattern is transferred from the patterned masking material 222 (FIGS. 68-70) into regions of diode stacks 204, material 220 and material 216 with one or more suitable etches, and subsequently the patterned masking material is removed. The etching into the diode stacks 204, material 220 and material 216 forms trenches 226 (labeled in FIG. 72), and such trenches are subsequently filled with dielectric material 216. Thus, an array of diodes 228-239 are formed from the lines 206-209 (FIGS. 68-70) of the diode stacks 204. Each diode is capped by the masking materials 218 and 220 at the processing stage of FIGS. 71-73. Although the diodes are shown to be square-shaped along the top-view of FIG. 71, in other embodiments the diodes may be formed to comprise any other suitable shape.

In the shown embodiment, a planarized surface extends across dielectric material 216 and masking material 220 after forming the dielectric material 216 within the trenches 226 (FIG. 72). Such planarized surface may be formed by, for example, CMP after filling the trenches with the dielectric material.

Figure 74:
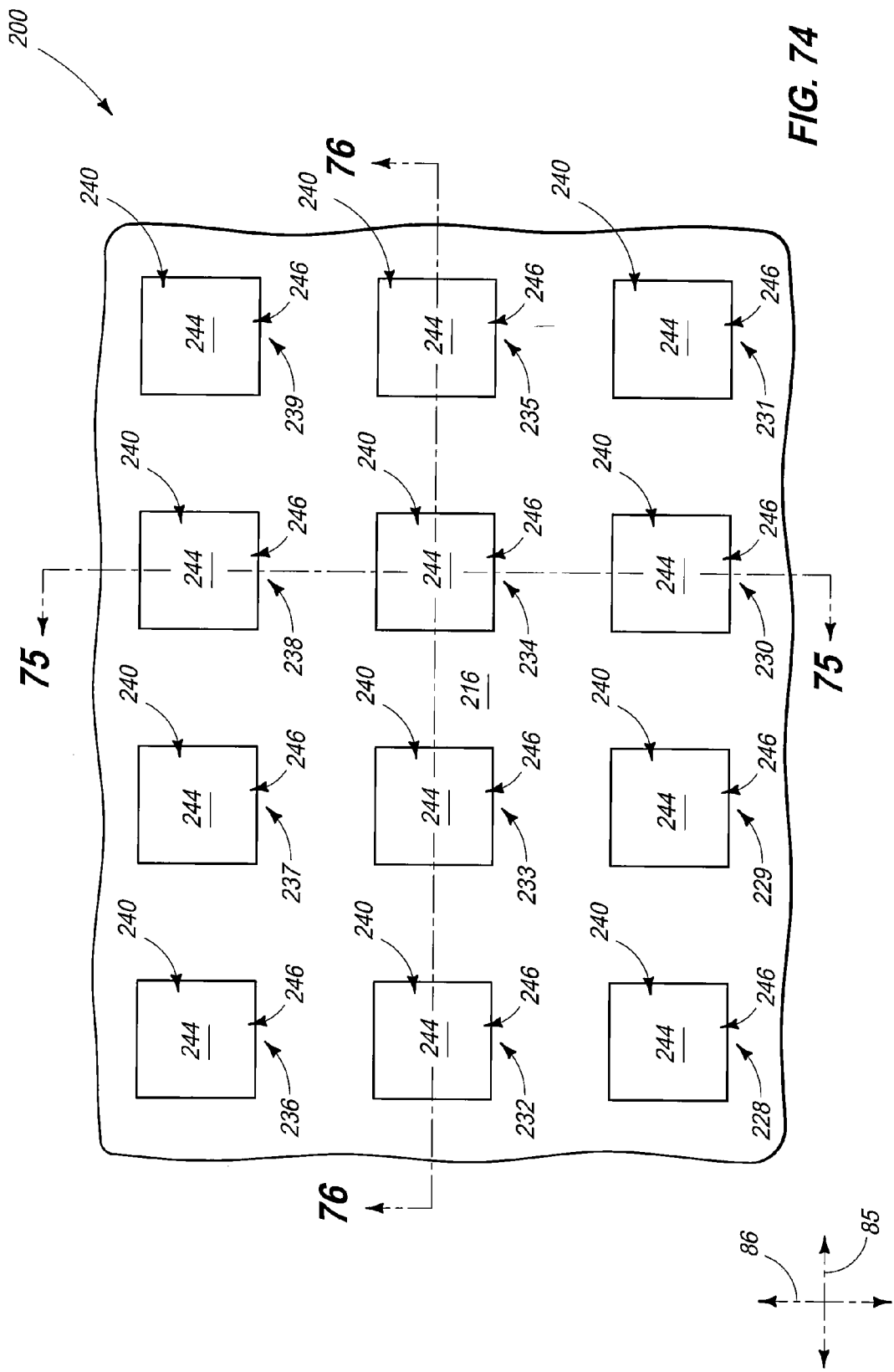
FIGS. 74-76 are a diagrammatic top view, and diagrammatic sectional side views of the semiconductor construction of FIGS. 65-67 at a processing stage subsequent to that of FIGS. 71-73. The cross-sectional side view of FIG. 75 is along the lines 75-75 of FIGS. 74 and 76, and the cross-sectional side view of FIG. 76 is along the lines 76-76 of FIGS. 74 and 75.
Figure 75:
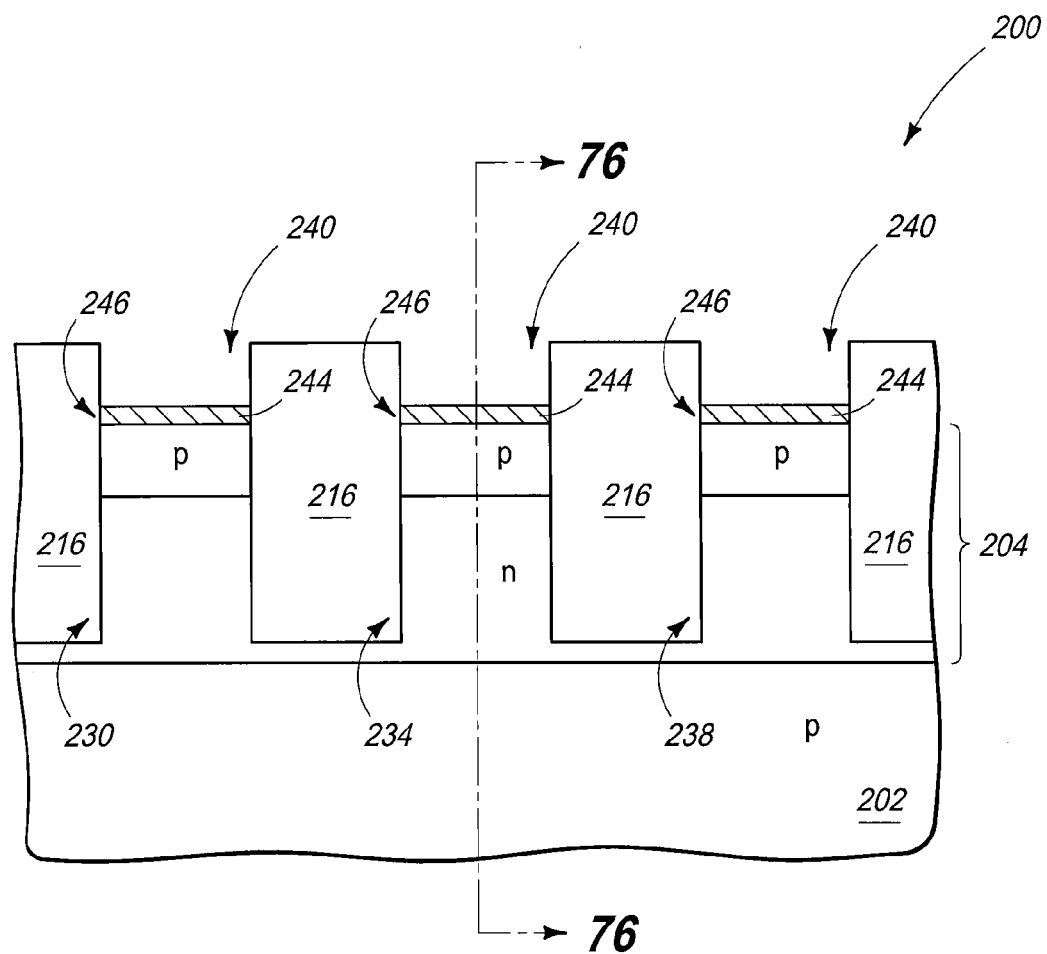
Figure 76:
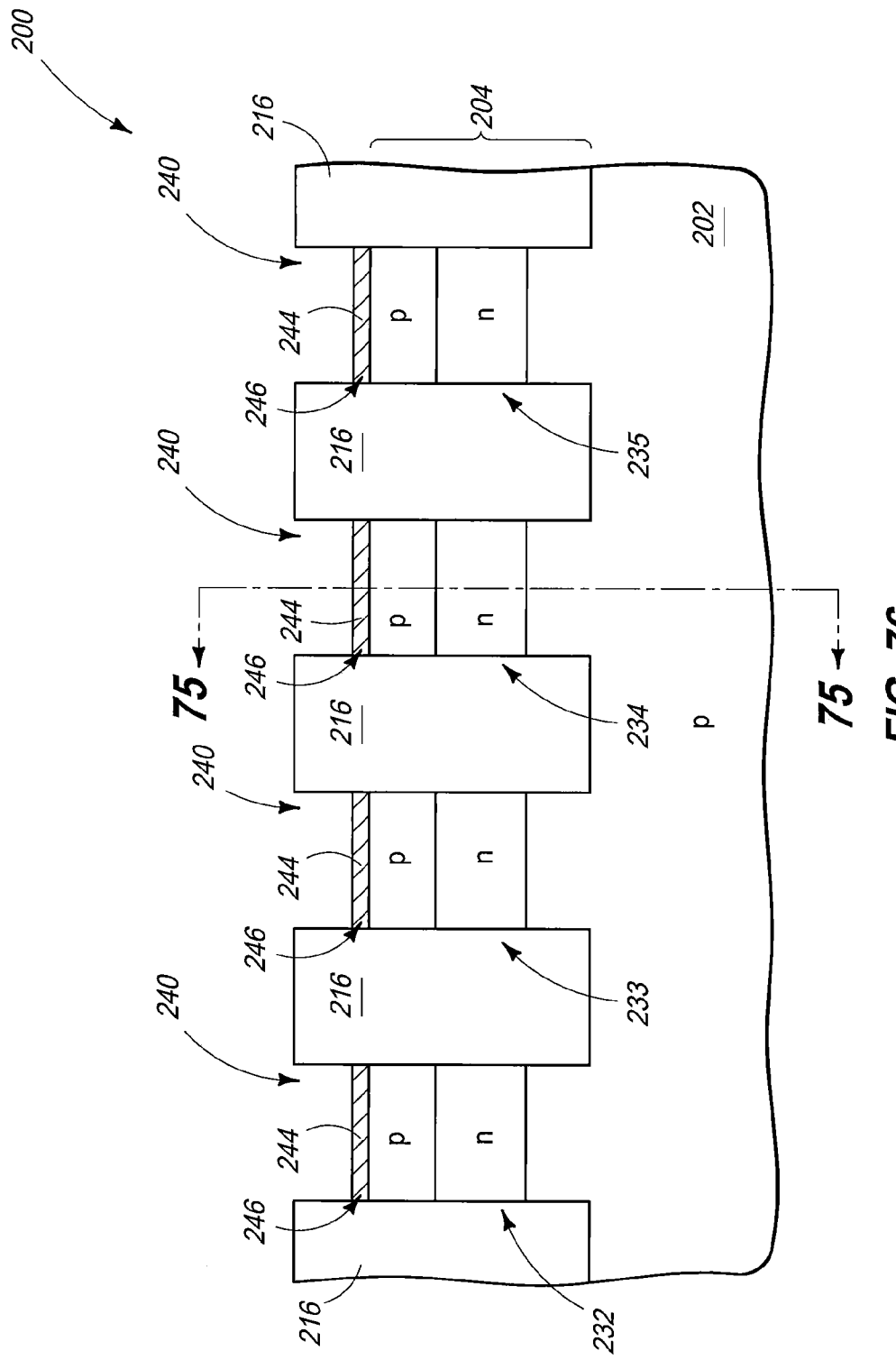

Referring to FIGS. 74-76, masking materials 218 and 220 (FIGS. 71-73) are removed to leave container-shaped openings 240 over the diodes 228-239. Electrically conductive bottom electrode material 244 is formed within the openings and directly against the top p-type doped region of the diode stacks 204. The bottom electrode material may comprise any suitable composition or combination of compositions, and in some embodiments may comprise cobalt silicide. Such cobalt silicide may be formed by silicidation of silicon exposed at the tops of diode stacks 204 within the openings 240.

In some embodiments, the bottom electrode material 244 of FIGS. 74-76 may be considered to form an array of bottom electrodes 246. The array comprises rows along the axis 85, and columns along the axis 86.

Figure 77:
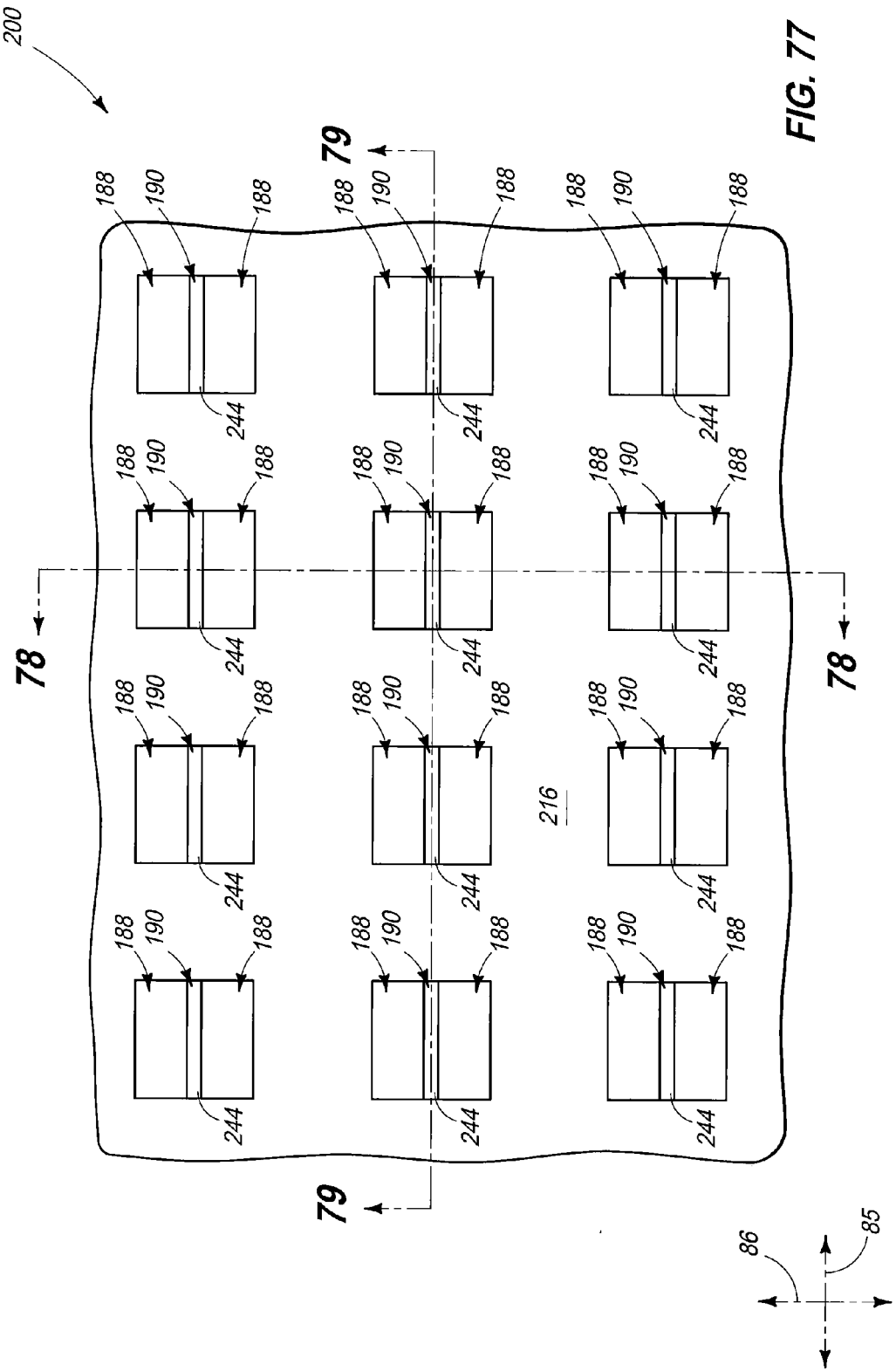
FIGS. 77-79 are a diagrammatic top view, and diagrammatic sectional side views of the semiconductor construction of FIGS. 65-67 at a processing stage subsequent to that of FIGS. 74-76. The cross-sectional side view of FIG. 78 is along the lines 78-78 of FIGS. 77 and 79, and the cross-sectional side view of FIG. 79 is along the lines 79-79 of FIGS. 77 and 78.
Figure 78:
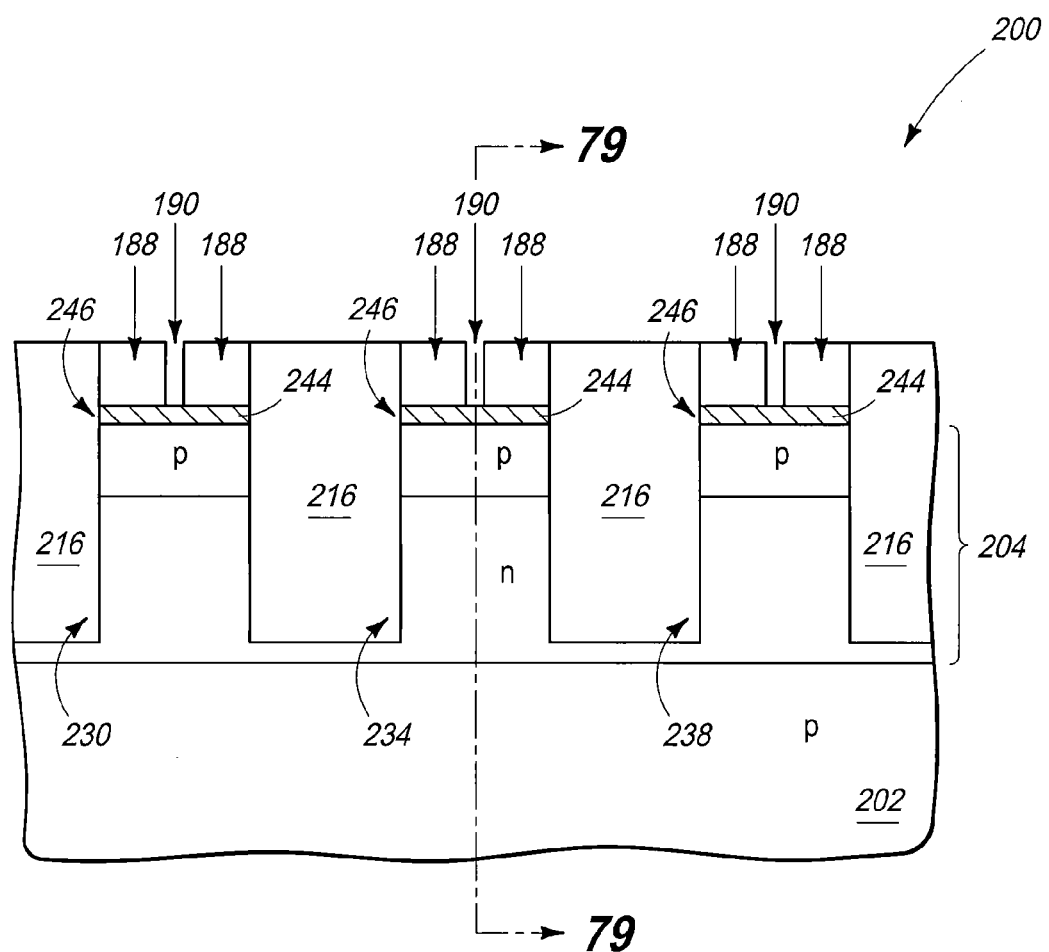
Figure 79:
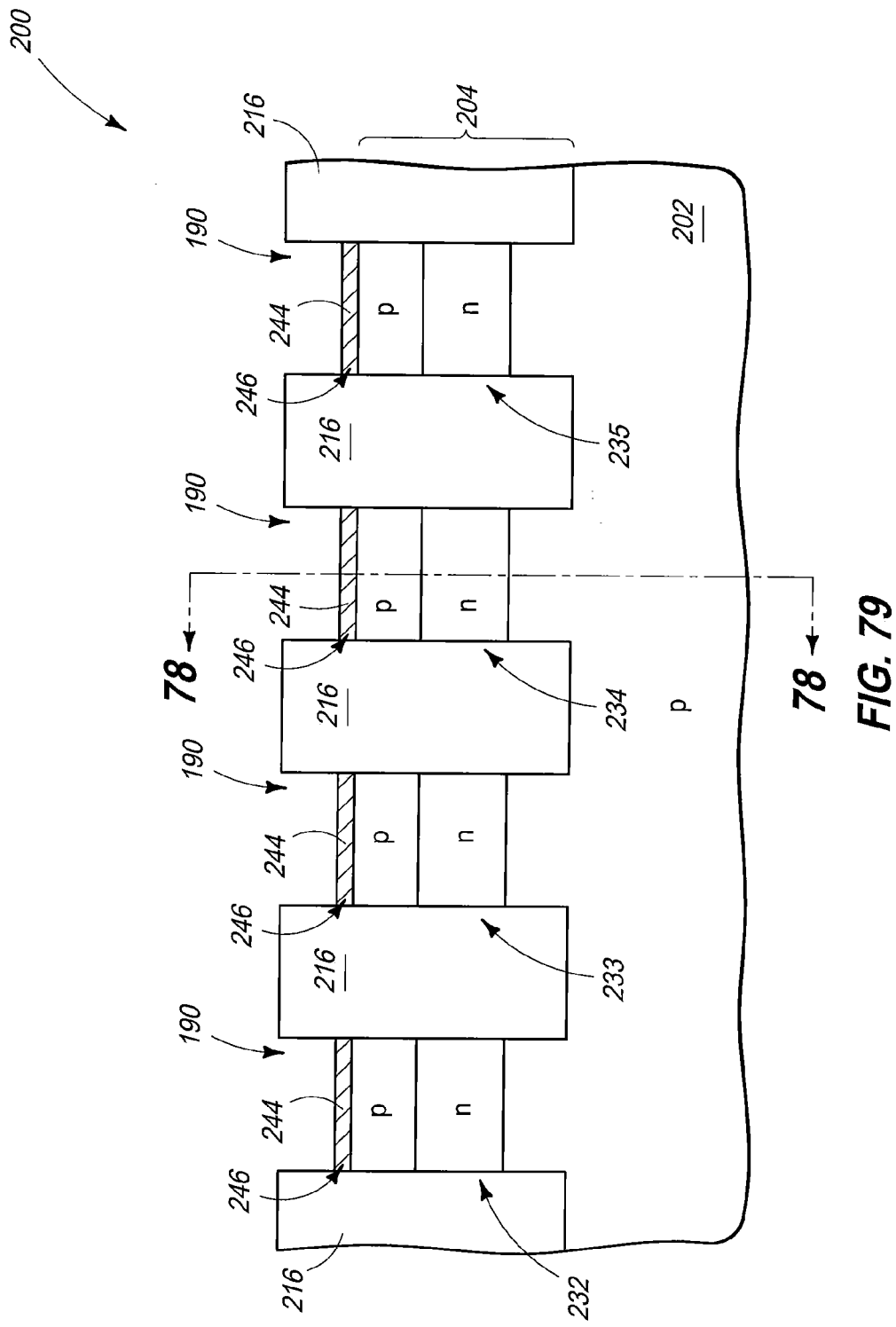

Referring to FIGS. 77-79, spacers 188 are formed within the openings 240 (FIGS. 74-76) to narrow the openings, and to thereby form slots 190 over the bottom electrodes 186. The spacers 188 may comprise any of the compositions discussed above with reference to FIGS. 50-52, and may be formed with any of the methods discussed above with reference to such figures. The slots 190 extend along the direction of axis 85 in the shown embodiment.

Figure 80:
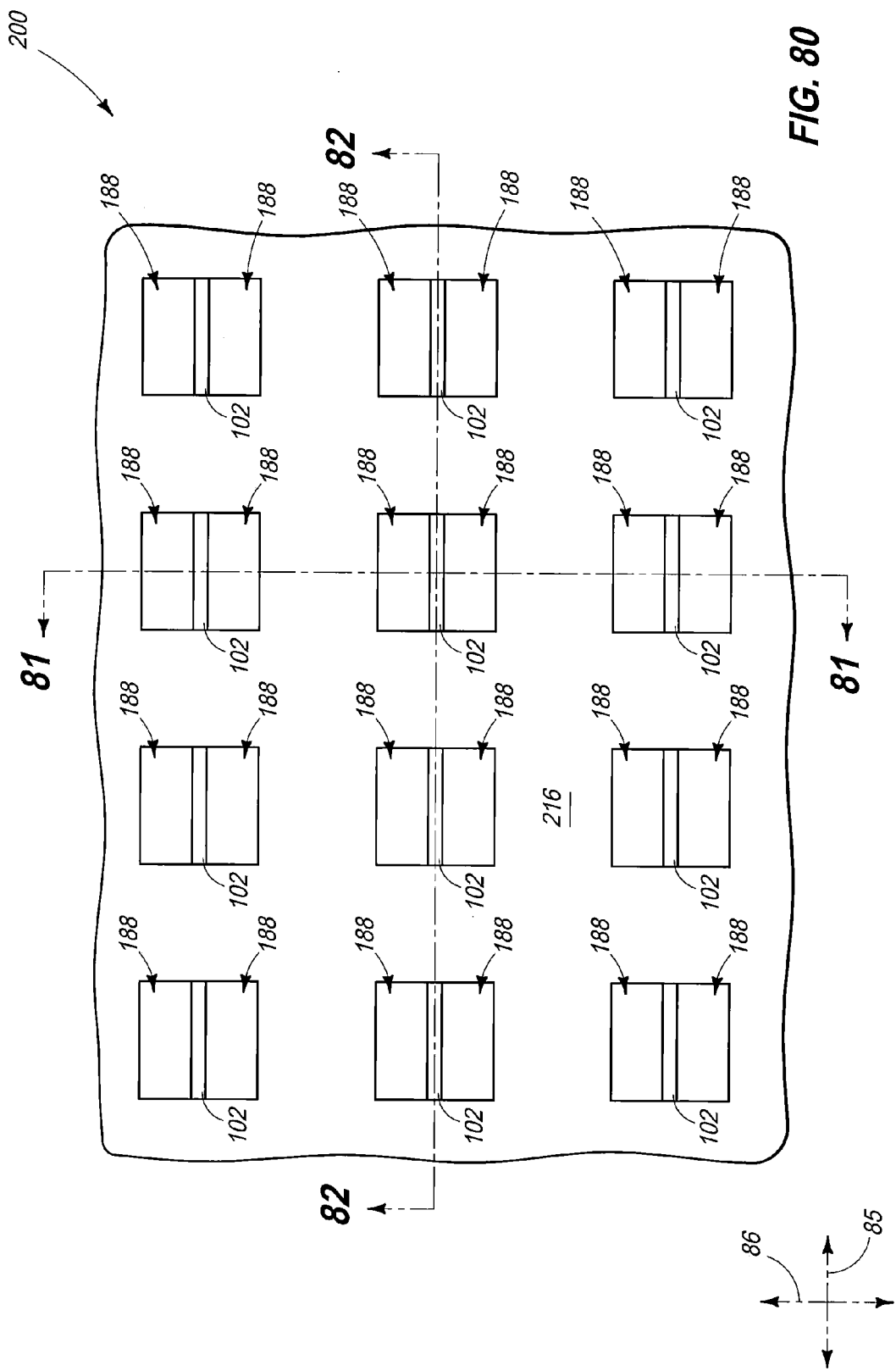
FIGS. 80-82 are a diagrammatic top view, and diagrammatic sectional side views of the semiconductor construction of FIGS. 65-67 at a processing stage subsequent to that of FIGS. 77-79. The cross-sectional side view of FIG. 81 is along the lines 81-81 of FIGS. 80 and 82, and the cross-sectional side view of FIG. 82 is along the lines 82-82 of FIGS. 80 and 81.
Figure 81:
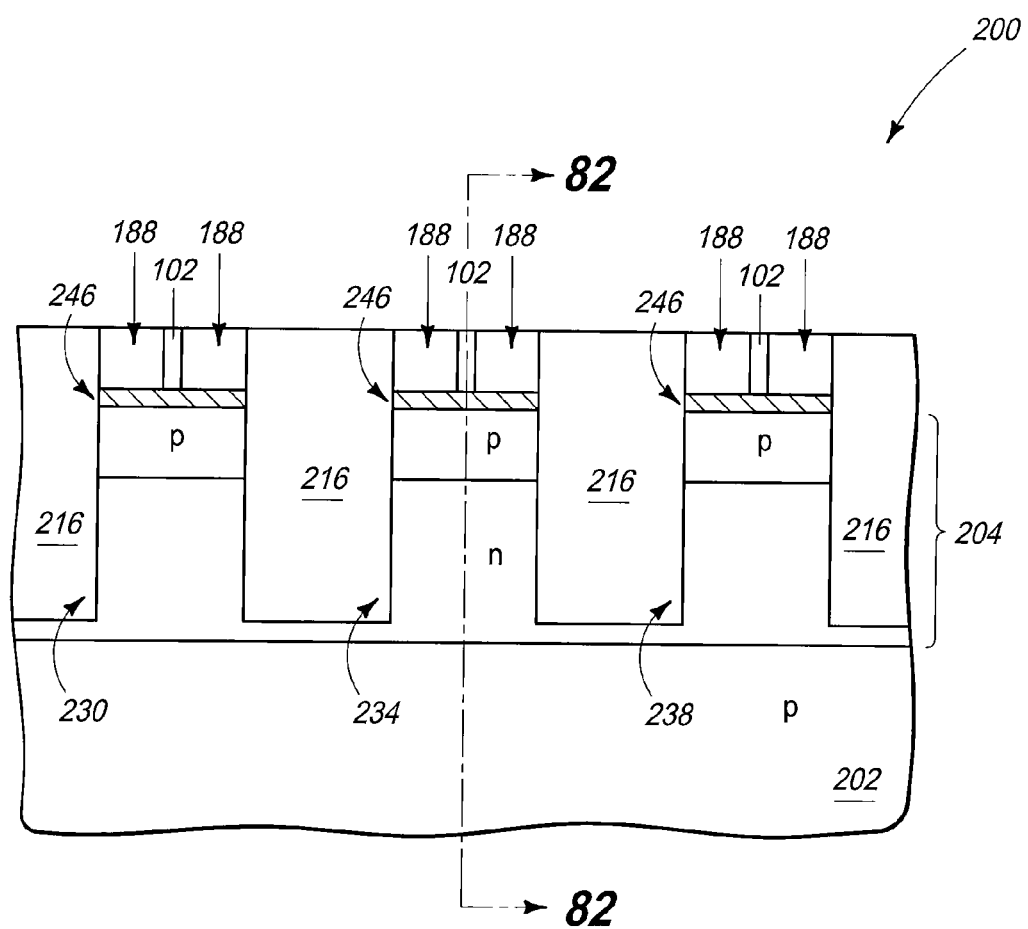
Figure 82:
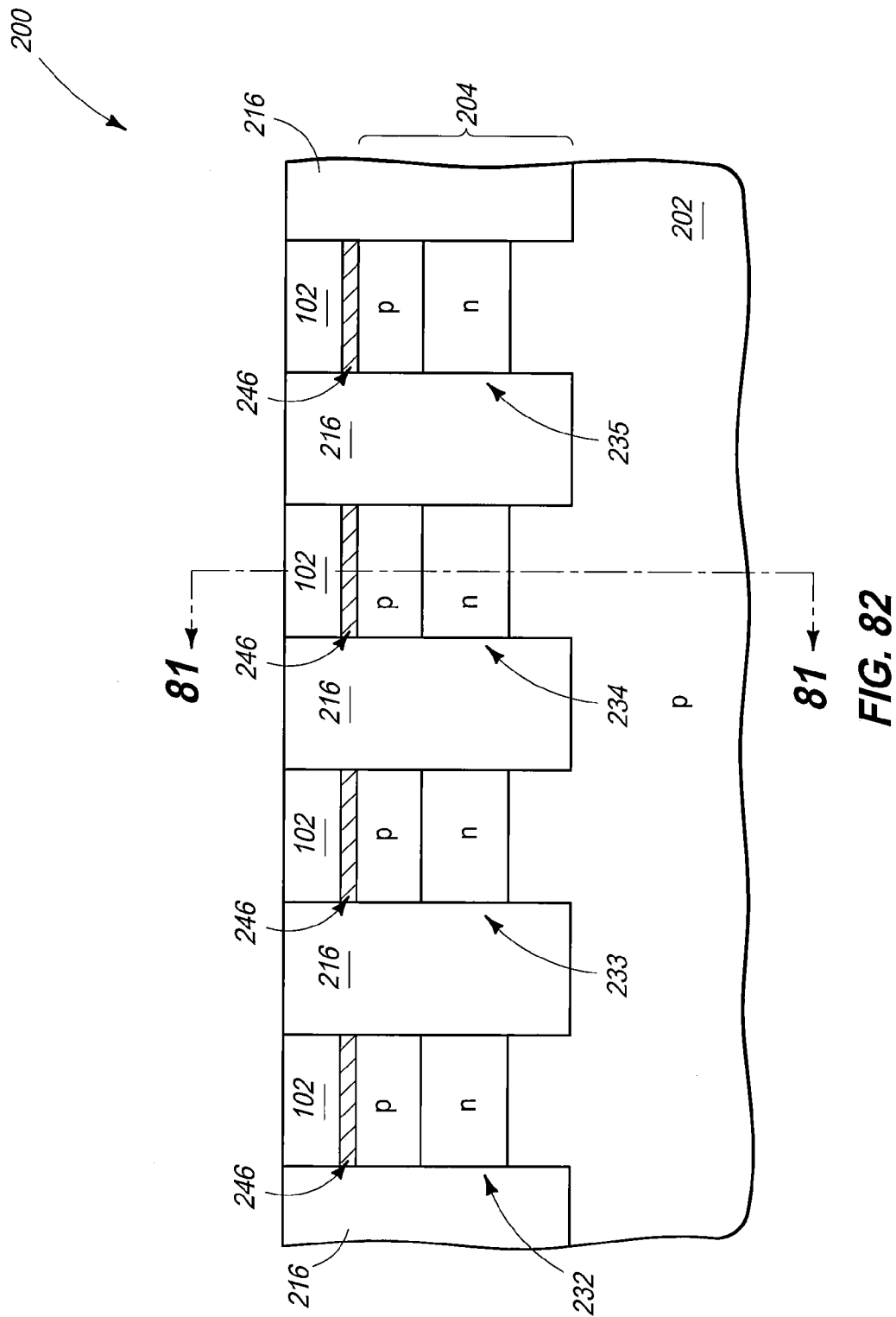

Referring to FIGS. 80-82, first programmable material 102 is formed within the slots 90 (FIGS. 77-79). The first programmable material may be formed within the slots by depositing a layer of first programmable material which extends within the slots and over upper surfaces of dielectric materials 216 and 188, and then utilizing CMP to remove the programmable material from over the dielectric materials while leaving the programmable material within the slots.

The first programmable material 102 forms a plurality of separated segments (or plates) which are supported edgewise over the bottom electrodes 246.

Figure 83:
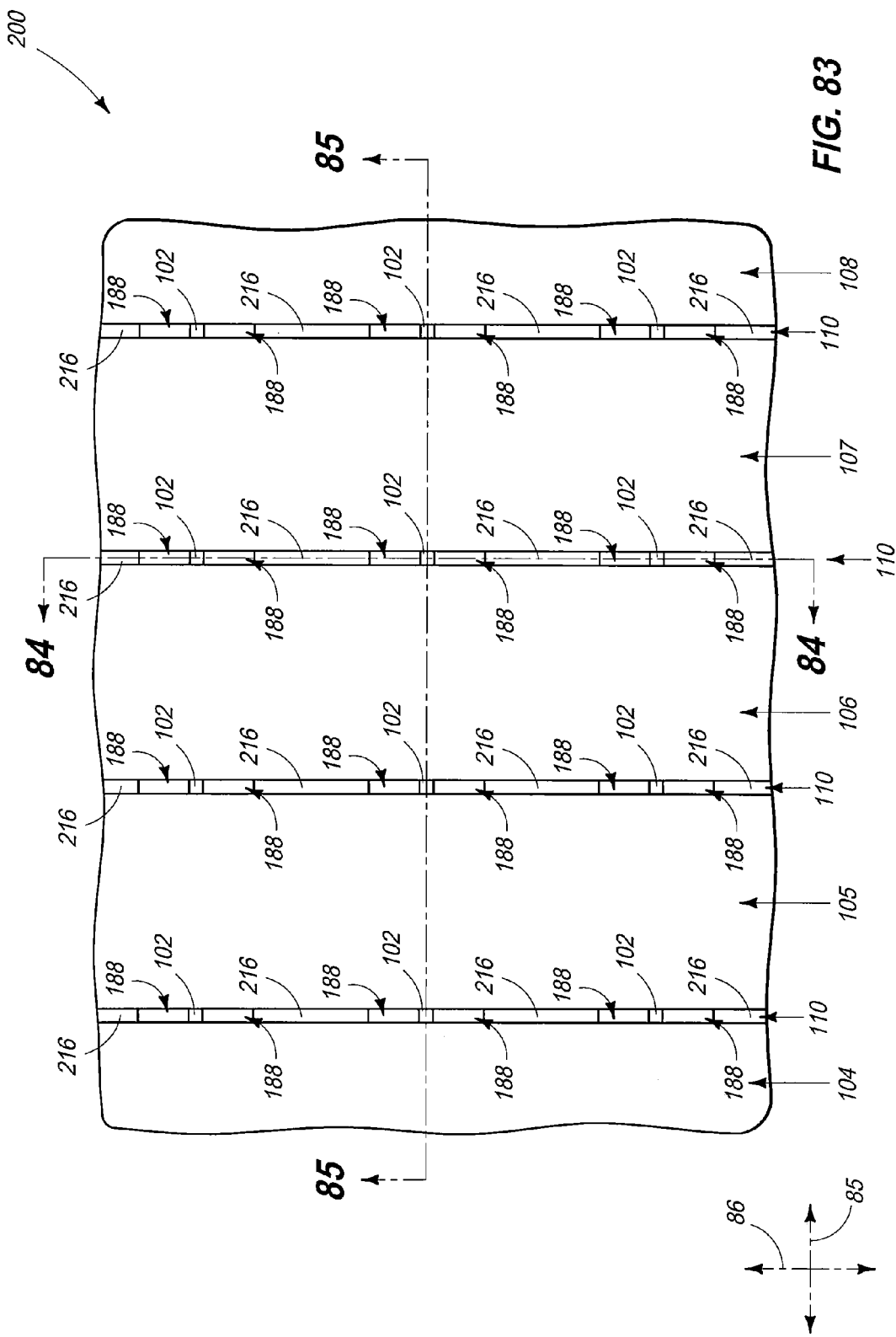
FIGS. 83-85 are a diagrammatic top view, and diagrammatic sectional side views of the semiconductor construction of FIGS. 65-67 at a processing stage subsequent to that of FIGS. 80-82. The cross-sectional side view of FIG. 84 is along the lines 84-84 of FIGS. 83 and 85, and the cross-sectional side view of FIG. 85 is along the lines 85-85 of FIGS. 83 and 84.
Figure 84:
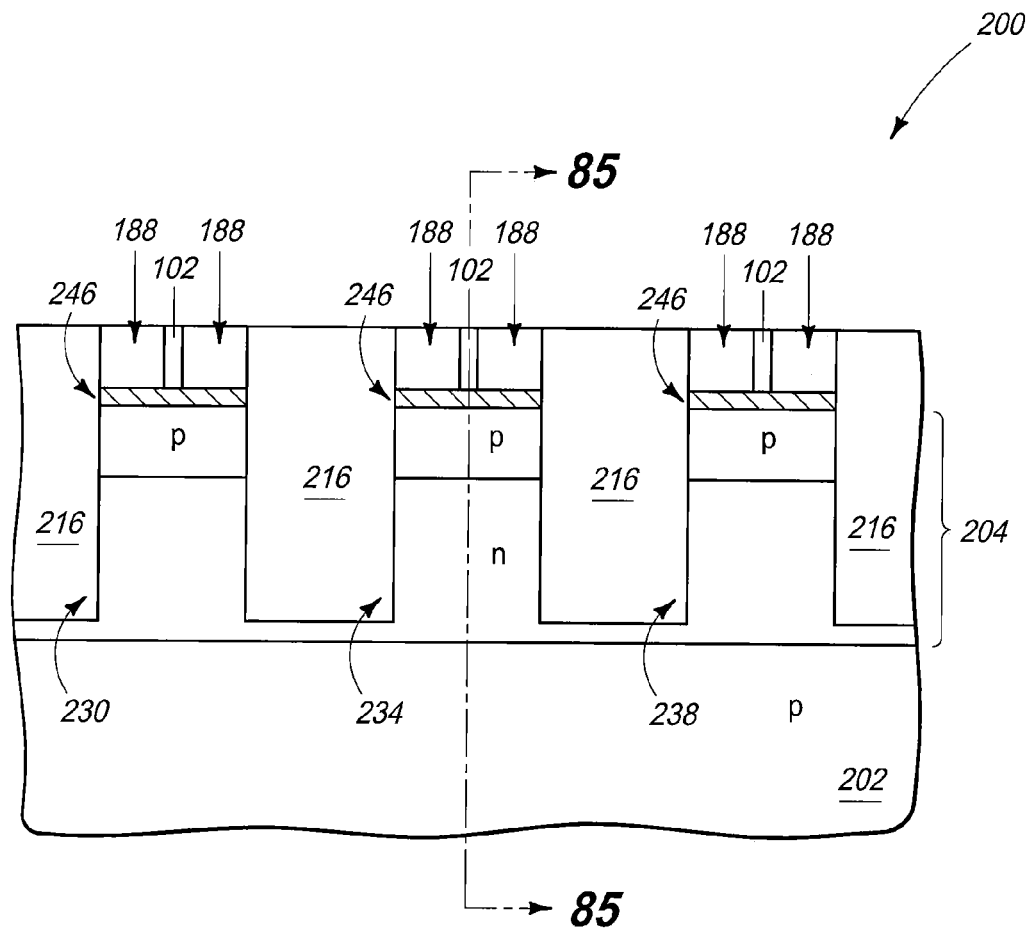
Figure 85:
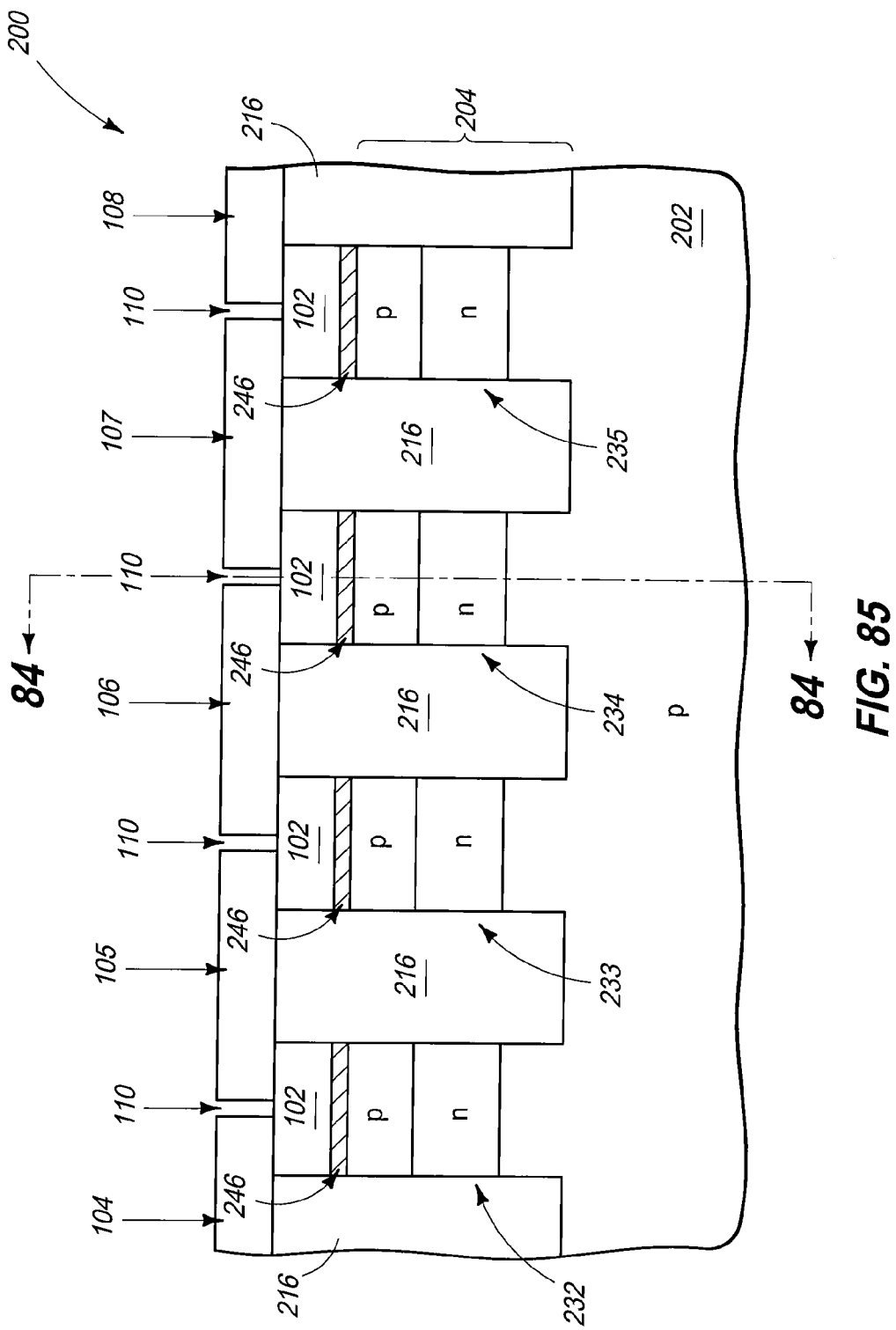

Referring to FIGS. 83-85, blocks 104-108 are formed over the materials 216, 188 and 102, and along the second axis 86. The blocks 104-108 are spaced from one another by gaps 110. The blocks 104-108 and gaps 110 are identical to those discussed above relative to FIGS. 28-30, and may be formed with the same processing.

Figure 86:
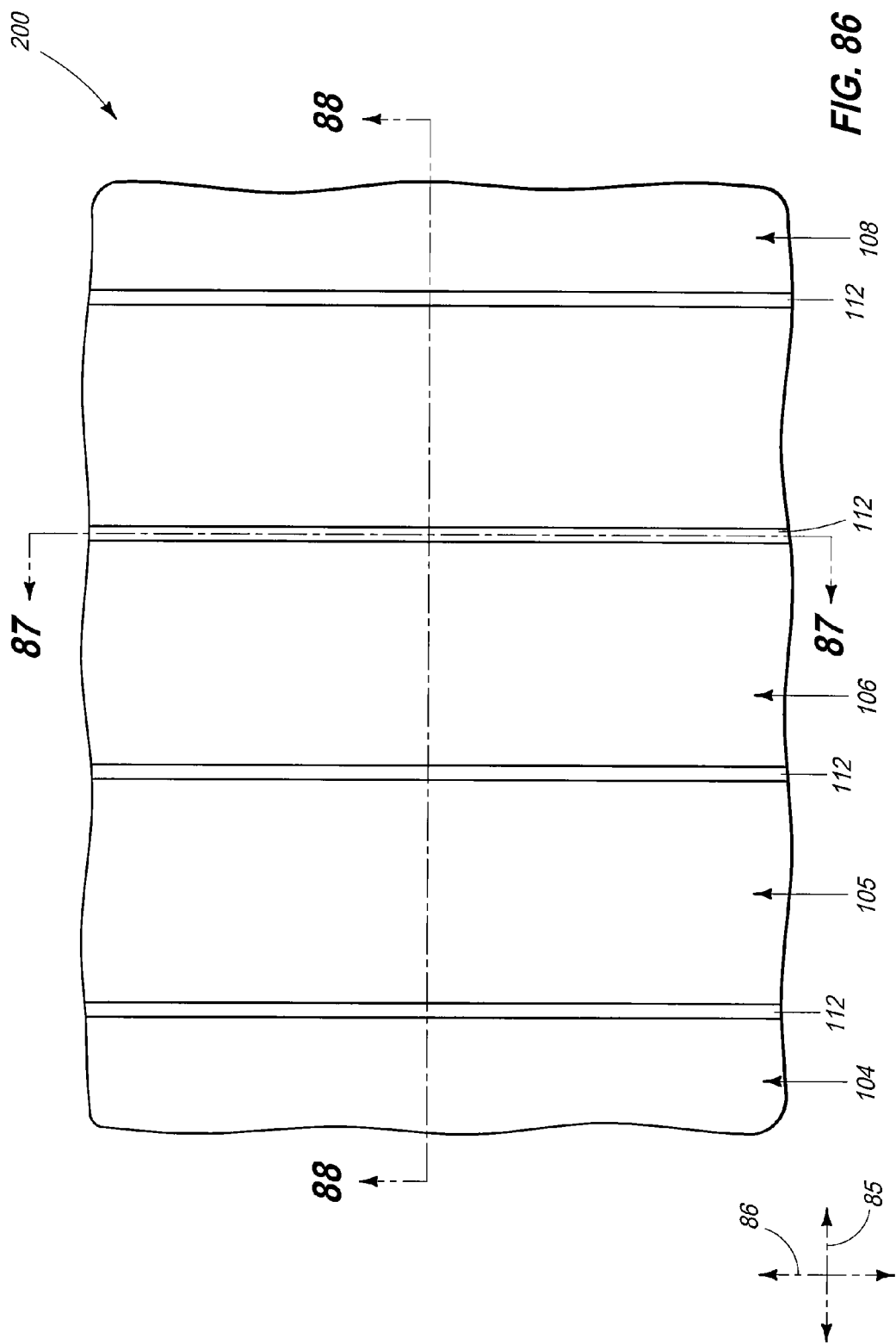
FIGS. 86-88 are a diagrammatic top view, and diagrammatic sectional side views of the semiconductor construction of FIGS. 65-67 at a processing stage subsequent to that of FIGS. 83-85. The cross-sectional side view of FIG. 87 is along the lines 87-87 of FIGS. 86 and 88, and the cross-sectional side view of FIG. 88 is along the lines 88-88 of FIGS. 86 and 87.
Figure 87:
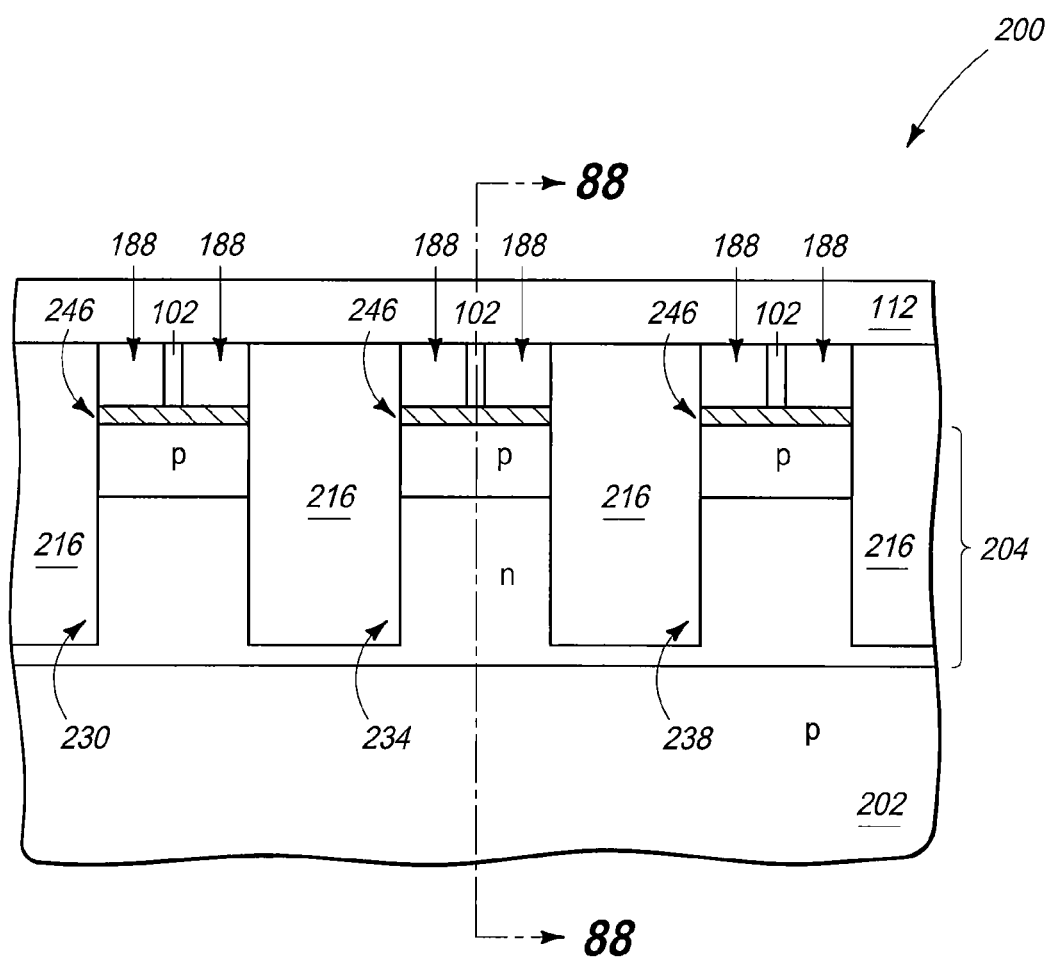
Figure 88:
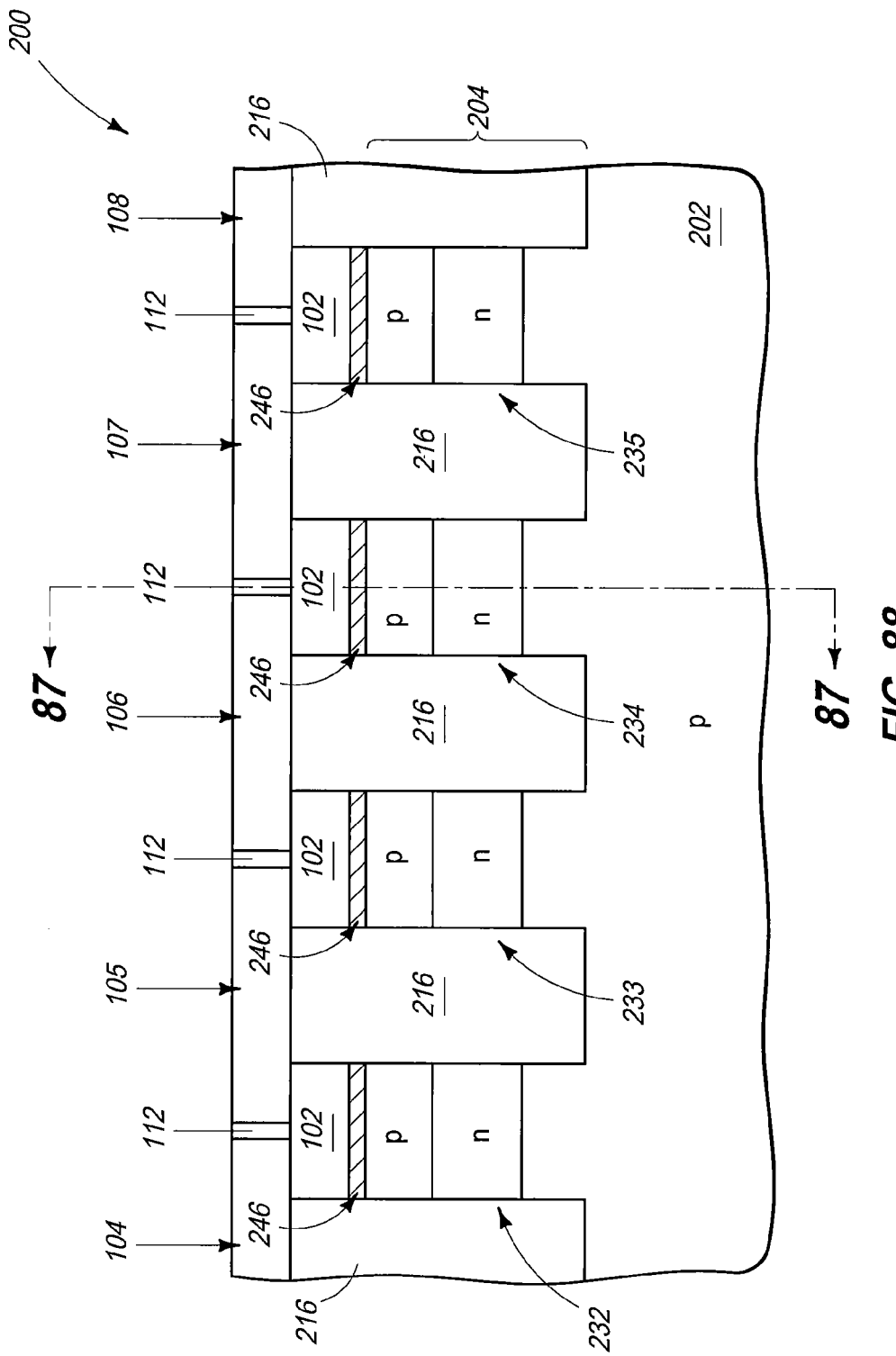

Referring to FIGS. 86-88, lines of second programmable material 112 are formed within the gaps 110 (FIGS. 83-85). The programmable material 112 may comprise the same materials discussed above with reference to FIGS. 31-33, and may be formed by the same methodology discussed above with reference to such figures. The lines of the second programmable material 112 are directly over, and directly against, the segments of the first programmable material 102; and in the shown embodiment extend approximately orthogonally to such segments of the first programmable material.

Figure 89:
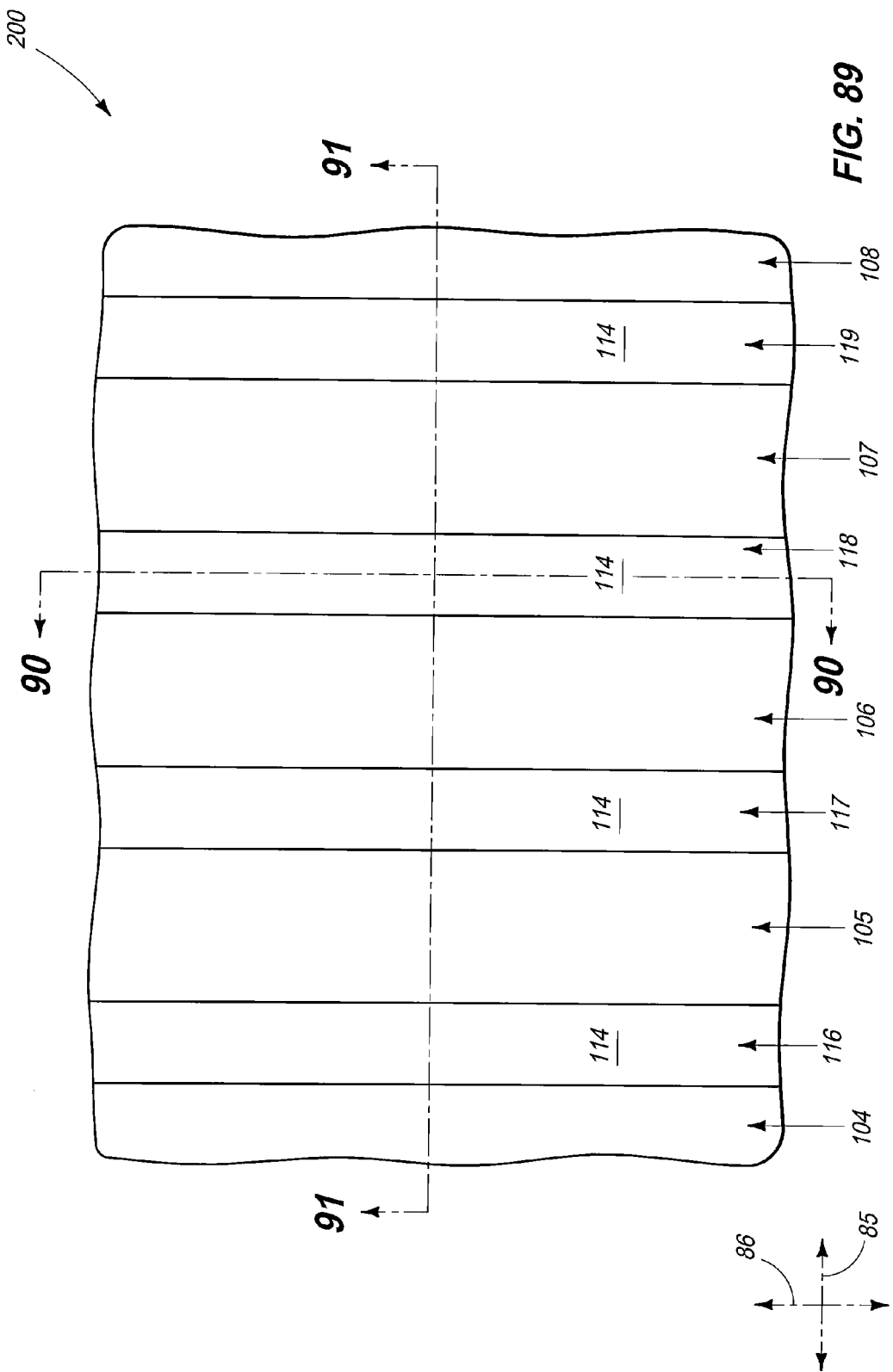
FIGS. 89-91 are a diagrammatic top view, and diagrammatic sectional side views of the semiconductor construction of FIGS. 65-67 at a processing stage subsequent to that of FIGS. 86-88. The cross-sectional side view of FIG. 90 is along the lines 90-90 of FIGS. 89 and 91, and the cross-sectional side view of FIG. 91 is along the lines 91-91 of FIGS. 89 and 90.
Figure 90:
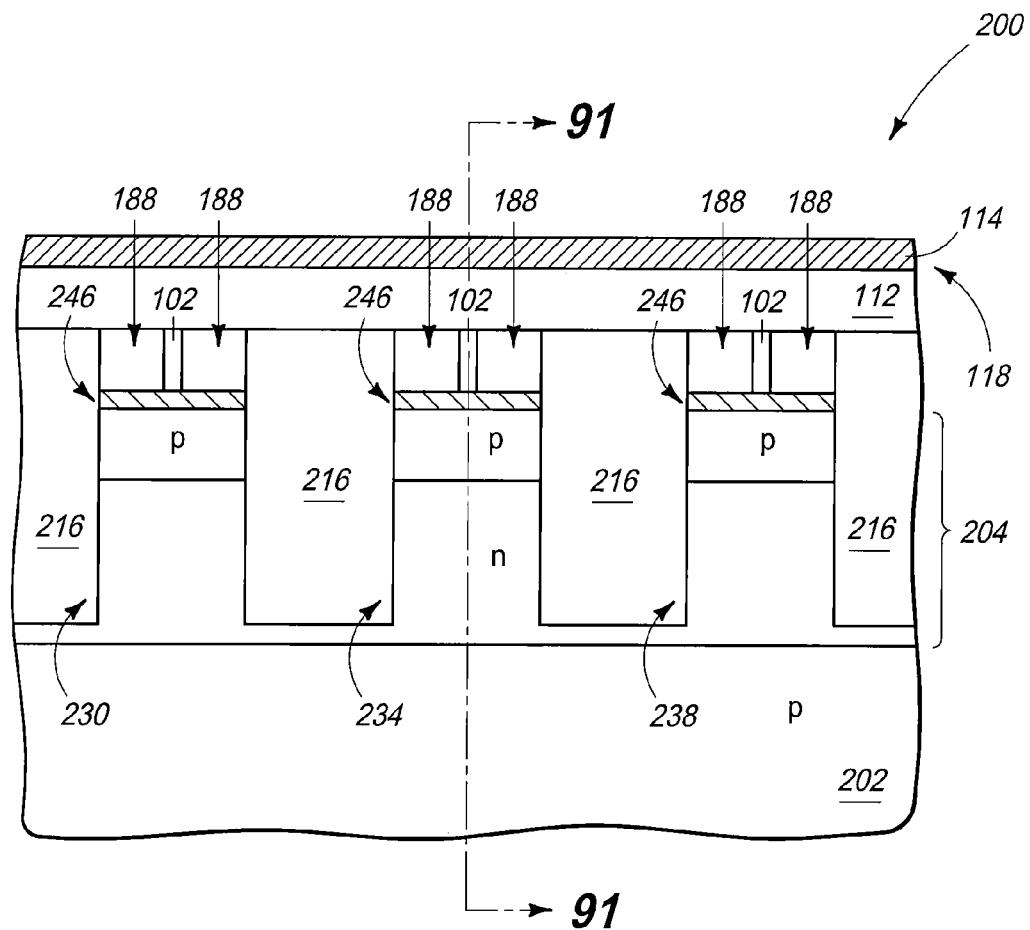
Figure 91:
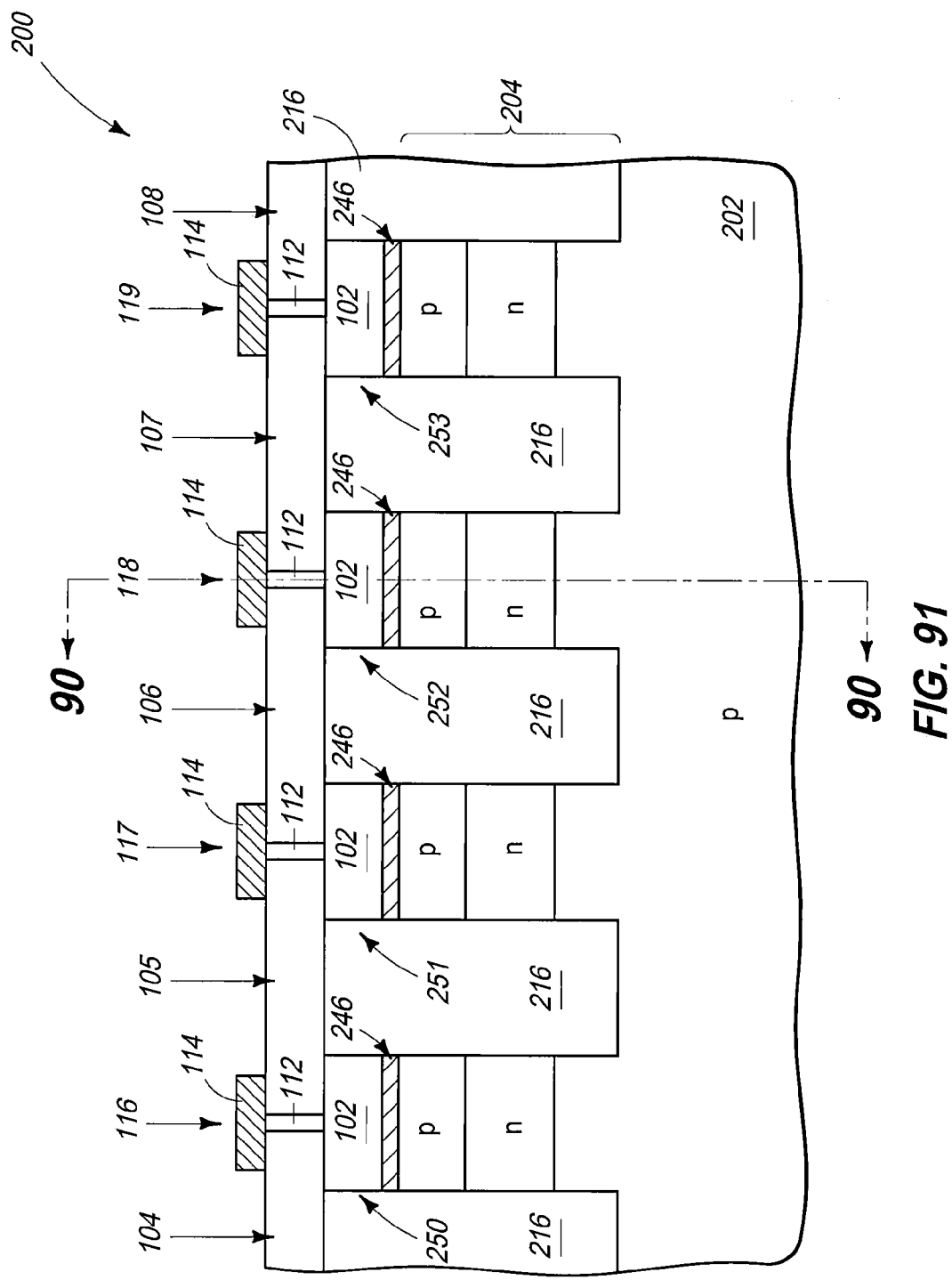

Referring to FIGS. 89-91, top electrode material 114 is provided across the second programmable material 112 and the blocks 104-108, and is then patterned into lines 116-119. Such patterning may be accomplished with processing analogous to that discussed above with reference to FIGS. 34-39.

The bottom electrodes 246, segments of programmable material 102, lines of programmable material 112, and lines of conductive material 114 together form an array of memory cells; with example memory cells being shown in FIG. 91 as memory cells 250-253. Each memory cell has a segment (or plate) of first programmable material 102 having an upper surface extending along a first axis (with such axis being along the cross-section of FIG. 91 in the illustrated embodiment), and has a region of the second programmable material 112 that has a bottom edge directly against the upper edge of material 102. In the shown embodiment, the material 112 is configured as a plurality of lines that directly contact multiple separate plates of material 102; with an example line of material 112 being shown in FIG. 90 to contact a plurality of underlying plates of material 102.

The individual memory cells 250-253 of FIG. 91 are in one-to-one correspondence with substantially vertical diodes underlying the memory cells, and such diodes may be utilized as select devices during programming and/or reading of the individual memory cells.

The memory cells and arrays discussed above may be used in, for example, memory modules, device drivers, power modules, communication modems, processor modules, and application-specific modules. In some embodiments, the memory cells and arrays may be incorporated into electronic systems; such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell, comprising:
a bottom electrode having an upper surface with an upper surface area;
first and second programmable material plates having length, width and thickness dimensions; the thickness dimensions being less than the length and width dimensions; the programmable material plates having thin edges along the thickness dimensions;

the first programmable material plate being supported edgewise over the bottom electrode; the first programmable material plate having a bottom thin edge and an upper thin edge; only the bottom thin edge of the first programmable material plate being against the bottom electrode, and being directly against only a portion of the upper surface area of the bottom electrode;

the second programmable material plate being supported edgewise over the first programmable material plate; the second programmable material plate having a bottom thin edge and a top thin edge; the bottom thin edge of the second programmable material plate being directly against the top thin edge of the first programmable material plate; and a top electrode over the top thin edge of the second programmable material plate.

2. The memory cell of claim 1 wherein the first programmable material plate extends linearly along a first axis, and wherein the second programmable material plate extends linearly along a second axis that intersects the first axis.

3. The memory cell of claim 2 wherein the second programmable material plate is directly against an overlap region of the first programmable material plate, and wherein said overlap region has an area no greater than about 10 nm$^2$.

4. The memory cell of claim 1 wherein the first and second programmable material plates both comprise phase change material.

5. The memory cell of claim 1 wherein the first and second programmable material plates both comprise chalcogenide.

6. A method of forming an array of memory cells, comprising:

providing an array of bottom electrodes across a supporting base, the array comprising rows and columns; the rows extending primarily along a first axis, and the columns extending primarily along a second axis that intersects the first axis;

forming first blocks that extend primarily along the first axis; the first blocks extending across alternating spaces between adjacent rows of the bottom electrodes and partially covering the bottom electrodes, the first blocks having edges extending upwardly from upper surfaces of the bottom electrodes;

patterning first programmable material lines along the sidewalls of the first blocks;

forming second blocks that extend primarily along the second axis; the second blocks extending across alternating spaces between adjacent columns of the bottom electrodes and partially covering the bottom electrodes, the second blocks having edges directly over upper surfaces of the bottom electrodes;

patterning second programmable material lines along the sidewalls of the second blocks;

forming top electrode material over the second programmable material lines;

forming masking material lines over the top electrode material, and over the second programmable material lines;

transferring a pattern from the masking material, through the top electrode material, and through the first programmable material lines with one or more etches;

wherein the patterning of the first programmable material lines along the sidewalls of the first blocks comprises:
forming a layer of sacrificial material along the sidewalls of the first blocks;

forming second material along the sacrificial material and within spaces between the first blocks;

removing the sacrificial material to leave gaps between the first blocks and the second material, and along the sidewalls of the first blocks; and filling the gaps with the first programmable material;

wherein the layer of sacrificial material is a first layer of sacrificial material, and wherein the patterning of the second programmable material lines along the sidewalls of the second blocks comprises:

forming a second layer of sacrificial material along the sidewalls of the second blocks;

forming third material along the second layer of sacrificial material and within spaces between the second blocks;

removing the second layer of sacrificial material to leave gaps between the second blocks and the third material, and along the sidewalls of the second blocks; and filling the gaps between the second blocks and the third material with the second programmable material.

7. A method of forming an array of memory cells, comprising:

providing an array of bottom electrodes across a supporting base, the array comprising rows and columns; the rows extending primarily along a first axis, and the columns extending primarily along a second axis that intersects the first axis; dielectric material being between adjacent bottom electrodes of the array, the bottom electrodes being exposed at bottoms of openings that extend through the dielectric material;

forming spacers within the openings to narrow the openings; the narrowed openings being slots that extend primarily along the first axis;

forming first programmable material within the slots to form a plurality of first programmable material plates supported edgewise over the bottom electrodes; the first programmble material plates having length, width and thickness dimensions; the thickness dimensions of the first programmble material plates being less than the length and width dimensions of the first programmble material plates; the first programmble material plates having thin edges along the thickness dimensions;

forming second programmable material lines over the first programmable material plates; the second programmable material lines extending primarily along the second axis; individual second programmable material lines being directly against multiple first programmable material plates; the second programmble material lines having length, width and thickness dimensions; the thickness dimensions of the second programmble material lines being less than the length and width dimensions of the second programmble material lines; the second programmble material lines having thin edges along the thickness dimensions; the second programmble material lines contacting the first programmble material plates only where thin edges of the second programmble material lines contact thin edges of the first programmble material plates; and forming top electrode material lines over and directly against the second programmable material lines.

8. The method of claim 7 wherein the slots are first slots, and wherein the forming of the second programmable material lines comprises:

after forming the first programmable material plates, forming a patterned material over the array of bottom electrodes; the patterned material having a plurality of linear second slots extending therethrough, the second slots extending primarily along the second axis; individual second slots extending across multiple first programmable material plates; and forming the second programmable material within the second slots.

9. The method of claim 7 wherein the forming of the second programmable material lines and the top electrode lines comprises:

forming blocks that extend primarily along the second axis; the blocks extending across alternating spaces between adjacent columns of the bottom electrodes and partially covering the bottom electrodes, the blocks having edges directly over upper surfaces of the bottom electrodes;

patterning second programmable material lines along the sidewalls of the blocks;

forming top electrode material over the second programmable material lines;

forming masking material lines over the top electrode material, and over the second programmable material lines; and transferring a pattern from the masking material and through the top electrode material with one or more etches.

10. The method of claim 7 wherein the bottom electrodes are directly over substantially vertical transistors, and are electrically coupled to source/drain regions of the transistors.

11. The method of claim 7 wherein the bottom electrodes are directly over diodes, and are electrically coupled to the diodes.

* * * * *

UNITED STATES PATENT AND TRADEMARK OFFICE
CERTIFICATE OF CORRECTION

PATENT NO. : 8,735,862 B2
APPLICATION NO. : 13/084011
DATED : May 27, 2014
INVENTOR(S) : Jun Liu et al.

It is certified that error appears in the above-identified patent and that said Letters Patent is hereby corrected as shown below:

In the Claims:

In column 22, line 37, in Claim 7, delete "programmble" and insert -- programmable --, therefor.

In column 22, line 39, in Claim 7, delete "programmble" and insert -- programmable --, therefor.

In column 22, line 40, in Claim 7, delete "programmble" and insert -- programmable --, therefor.

In column 22, line 41, in Claim 7, delete "programmble" and insert -- programmable --, therefor.

In column 22, line 48, in Claim 7, delete "programmble" and insert -- programmable --, therefor.

In column 22, line 50, in Claim 7, delete "programmble" and insert -- programmable --, therefor.

In column 22, line 52, in Claim 7, delete "programmble" and insert -- programmable --, therefor.

In column 22, line 53, in Claim 7, delete "programmble" and insert -- programmable --, therefor.

In column 22, lines 54-55, in Claim 7, delete "programmble" and insert -- programmable --, therefor.

In column 22, line 55, in Claim 7, delete "programmble" and insert -- programmable --, therefor.

In column 22, line 57, in Claim 7, delete "programmble" and insert -- programmable --, therefor.

In column 22, line 58, In Claim 7, delete "programmble" and insert -- programmable --, therefor.

Signed and Sealed this
Nineteenth Day of August, 2014

Michelle K. Lee
*Deputy Director of the United States Patent and Trademark Office*